US011232051B2

(12) United States Patent
Yamamoto et al.

(10) Patent No.: US 11,232,051 B2
(45) Date of Patent: Jan. 25, 2022

(54) NON-VOLATILE SEMICONDUCTOR STORAGE DEVICE

(71) Applicant: Kioxia Corporation, Minato-ku (JP)

(72) Inventors: Kensuke Yamamoto, Yokohama (JP); Masaru Koyanagi, Ota (JP); Ryo Fukuda, Yokohama (JP); Junya Matsuno, Yokohama (JP); Kenro Kubota, Fujisawa (JP); Masato Dome, Yokohama (JP)

(73) Assignee: Kioxia Corporation, Minato-ku (JP)

(*) Notice: Subject to any disclaimer, the term of this patent is extended or adjusted under 35 U.S.C. 154(b) by 0 days.

(21) Appl. No.: 16/999,121

(22) Filed: Aug. 21, 2020

(65) Prior Publication Data
US 2021/0271615 A1 Sep. 2, 2021

(30) Foreign Application Priority Data

Feb. 27, 2020 (JP) .............................. JP2020-032324

(51) Int. Cl.
*G06F 13/16* (2006.01)
*G11C 16/04* (2006.01)
(52) U.S. Cl.
CPC ...... *G06F 13/1689* (2013.01); *G11C 16/0483* (2013.01)
(58) Field of Classification Search
CPC .................. G06F 13/1689; G11C 16/0483
See application file for complete search history.

(56) References Cited

U.S. PATENT DOCUMENTS

| 7,957,218 B2 * | 6/2011 | Welker ................ G06F 13/1689 365/233.13 |
| 8,976,596 B1 | 3/2015 | Yamamoto et al. |
| 10,438,637 B2 * | 10/2019 | Naruse ................ G11C 11/4076 |
| 10,741,231 B1 * | 8/2020 | Tsai ........................ G11C 16/08 |
| 2019/0172509 A1 * | 6/2019 | Kang ....................... G11C 7/222 |

(Continued)

FOREIGN PATENT DOCUMENTS

| JP | 2008-71018 A | 3/2008 |
| JP | 2013-069759 A | 4/2013 |

(Continued)

*Primary Examiner* — Ajay Ojha
(74) *Attorney, Agent, or Firm* — Oblon, McClelland, Maier & Neustadt, L.L.P.

(57) ABSTRACT

A non-volatile semiconductor memory device including: a first pad transmitting/receiving a data signal transmitted via a first signal line to/from a memory controller; a second pad transmitting/receiving a strobe signal transmitted via a second signal line to/from the memory controller, the strobe signal specifying a timing of transmitting/receiving the data signal; and a third pad receiving an output instruction signal via a third signal line from the memory controller, the output instruction signal instructing a transmission of the data signal; wherein the non-volatile semiconductor memory device outputs the data signal from the first pad to the memory controller, outputs the strobe signal from the second pad to the memory controller, performs a first calibration operation calibrating the data signal, and performs a second calibration operation calibrating the strobe signal, based on a toggle timing of the strobe signal associated with the output instruction signal.

15 Claims, 40 Drawing Sheets

(56) References Cited

U.S. PATENT DOCUMENTS

2019/0228826 A1 7/2019 Yamamoto et al.
2019/0296724 A1 9/2019 Hirashima et al.

FOREIGN PATENT DOCUMENTS

| JP | 6481312 B2 | 3/2019 |
| JP | 2019-128829 A | 8/2019 |
| JP | 2019-169826 A | 10/2019 |

* cited by examiner

NON-VOLATILE SEMICONDUCTOR STORAGE DEVICE

CROSS REFERENCE TO RELATED APPLICATIONS

This application is based upon and claims the benefit of priority from the prior Japanese Patent Application No. 2020-032324 filed on Feb. 27, 2020, the entire contents of which are incorporated herein by reference.

FIELD

Embodiments disclosed herein relate to a non-volatile semiconductor storage device.

BACKGROUND

A memory system, which includes a NAND-type flash memory as a semiconductor storage device and a controller, which controls the NAND-type flash memory, is known.

DETAILED DESCRIPTION

Figure 1:
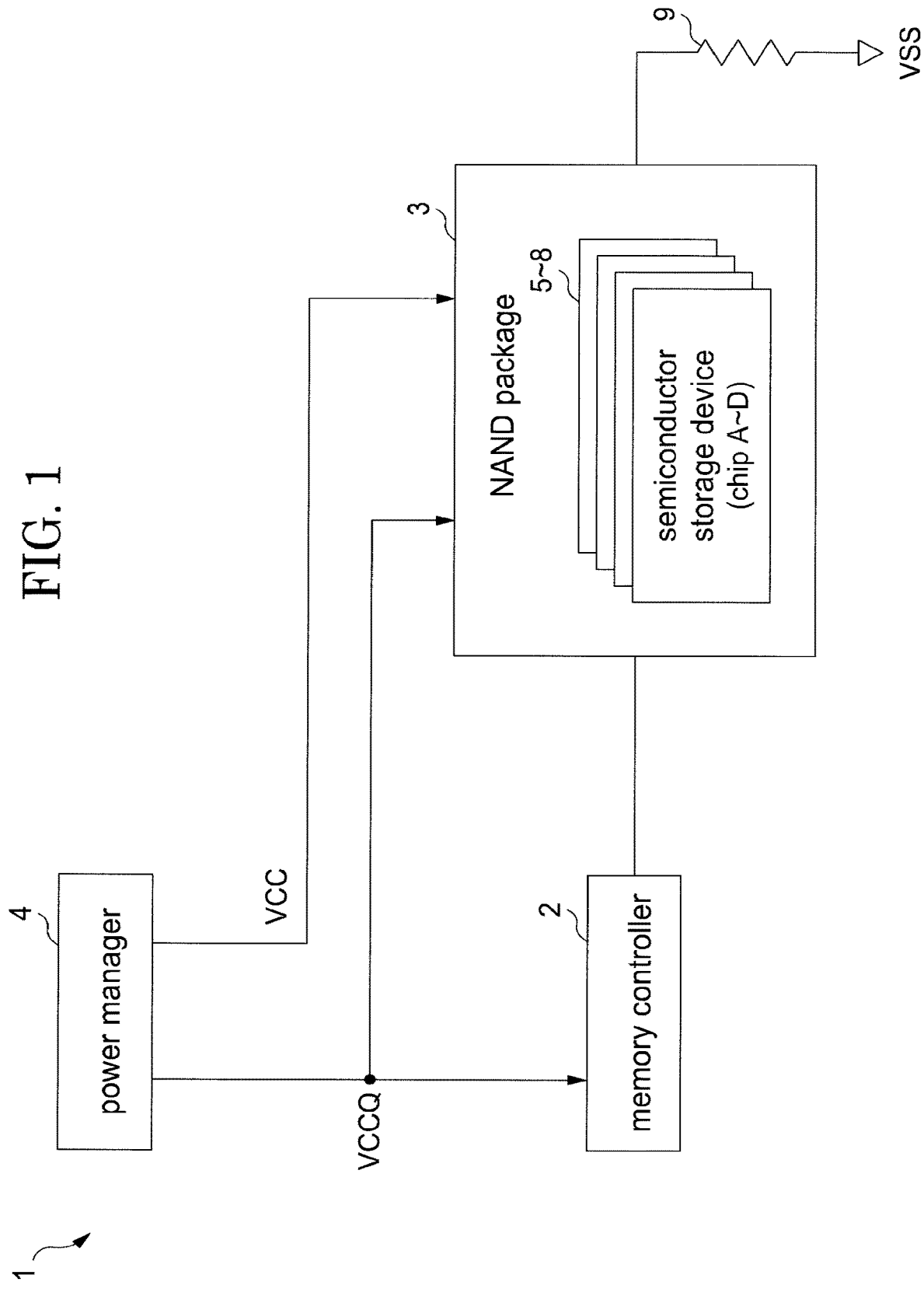
FIG. 1 is a block diagram for explaining a configuration of a power supply system of a memory system according to an embodiment.

A duty ratio is corrected for each data signal supplied to an input/output terminal.

A non-volatile semiconductor storage device in an embodiment according to the present disclosure includes one or more first pads, each transmitting/receiving a data signal transmitted via each of one or more first signal lines to/from a memory controller; one or more second pads, each transmitting/receiving a strobe signal transmitted via each of one or more second signal lines to/from the memory controller, the strobe signal specifying a timing of transmitting/receiving the data signal; and a third pad receiving an output instruction signal via a third signal line from the non-volatile memory controller, the output instruction signal instructing a transmission of the data signal; wherein the semiconductor storage device outputs the data signal from each of the one or more first pads to the memory controller, outputs the strobe signal from each of the one or more second pads to the memory controller, performs a first calibration operation calibrating the data signal, and performs a second calibration operation calibrating the strobe signal, based on a toggle timing of the strobe signal associated with the output instruction signal output from the memory controller upon receiving a command from the memory controller.

Hereinafter, a non-volatile semiconductor storage device according to the present embodiments are described in detail by referring to the drawings. In the following description, elements having substantially the same functions and configurations are denoted by the same reference numerals and are described redundantly only when necessary. Each of the embodiments described below exemplifies a device and a method for embodying the technical idea of this embodiment. The technical idea of the embodiment is not limited as the material, shape, structure, arrangement, and the like of the constituent parts described below. Various modifications may be made to the technical idea of the embodiment in addition to the scope of the claims.

Further, in the following description, signals X<n:0> ("n" is a natural number) are made up of (n+1)-bit signals, and mean a group of signals X<0>, X<1>, . . . , and X<n>, each of which is a 1-bit signal. In addition, elements Y<n:0> mean a group of elements Y<0>, Y<1>, and Y<n>, which correspond to the input or output of the signals X<n:0> in a one-to-one relationship.

In addition, in the following description, a signal BZ indicates the inverted signal of a signal Z. Alternatively, if the signal Z is a control signal, the signal Z is a positive logic and the signal BZ is a negative logic. That is, an "H" level of the signal Z corresponds to an "assert", and an "L" level of the signal Z corresponds to a "negate". An "L" level of the signal BZ corresponds to an "assert", and an "H" level of the signal BZ corresponds to a "negate". "The duty ratio of the signal Z and the signal BZ" indicates the ratio of the time from the rising edge to the falling edge of a pulse to one cycle of the pulse in the signal Z (which is equal to the ratio of the time from the falling edge to the rising edge of a pulse to one cycle of the pulse in the signal BZ).

First Embodiment

A memory system according to a first embodiment is described with reference to the FIGS. 1 to 12. The memory system according to the first embodiment includes, for example, a NAND-type flash memory as a semiconductor storage device and memory controller which controls the NAND-type flash memory.

<Overall Configuration of the Memory System>

The overall configuration of the memory system according to the first embodiment is described with reference to FIGS. 1 and 2. The memory system 1 communicates with, for example, an external host device (not illustrated). The memory system 1 holds data received from the host device and transmits data which read from the semiconductor storage devices 5 to 8 to the host device.

FIG. 1 is a block diagram of a power supply system of the memory system according to the first embodiment. As illustrated in FIG. 1, the memory system 1 includes a memory controller 2, a NAND package 3, a power manager 4, and a reference resistor 9. The NAND package 3 includes, for example, a plurality of semiconductor storage device 5 to 8. In the example of FIG. 1, a case where four chips are provided in the NAND package 3 is illustrated. Further, in the following description, the semiconductor storage devices 5 to 8 may also be replaced with chips A to D, respectively.

The power manager 4 is an integrated circuit (IC) for managing the voltage to be supplied to the memory controller 2 and the NAND package 3. The power manager 4 supplies, for example, a voltage VCCQ to the memory controller 2 and the NAND package 3. The voltage VCCQ is used as a reference of the voltage that is used for an input/output signal between the memory controller 2 and the NAND package 3. In addition, the power manager 4 supplies, for example, a voltage VCC to the NAND package 3. The voltage VCC is used as a reference voltage of other voltages used in the NAND package 3.

In addition, the NAND package 3 is connected to a voltage VSS via the reference resistor 9. The reference resistor 9 is used, for example, to calibrate an output impedance of each of the semiconductor storage devices 5 to 8 in the NAND package 3. The voltage VSS is a ground voltage, and is defined as, for example, ground (0V) in the memory system 1.

Figure 2:
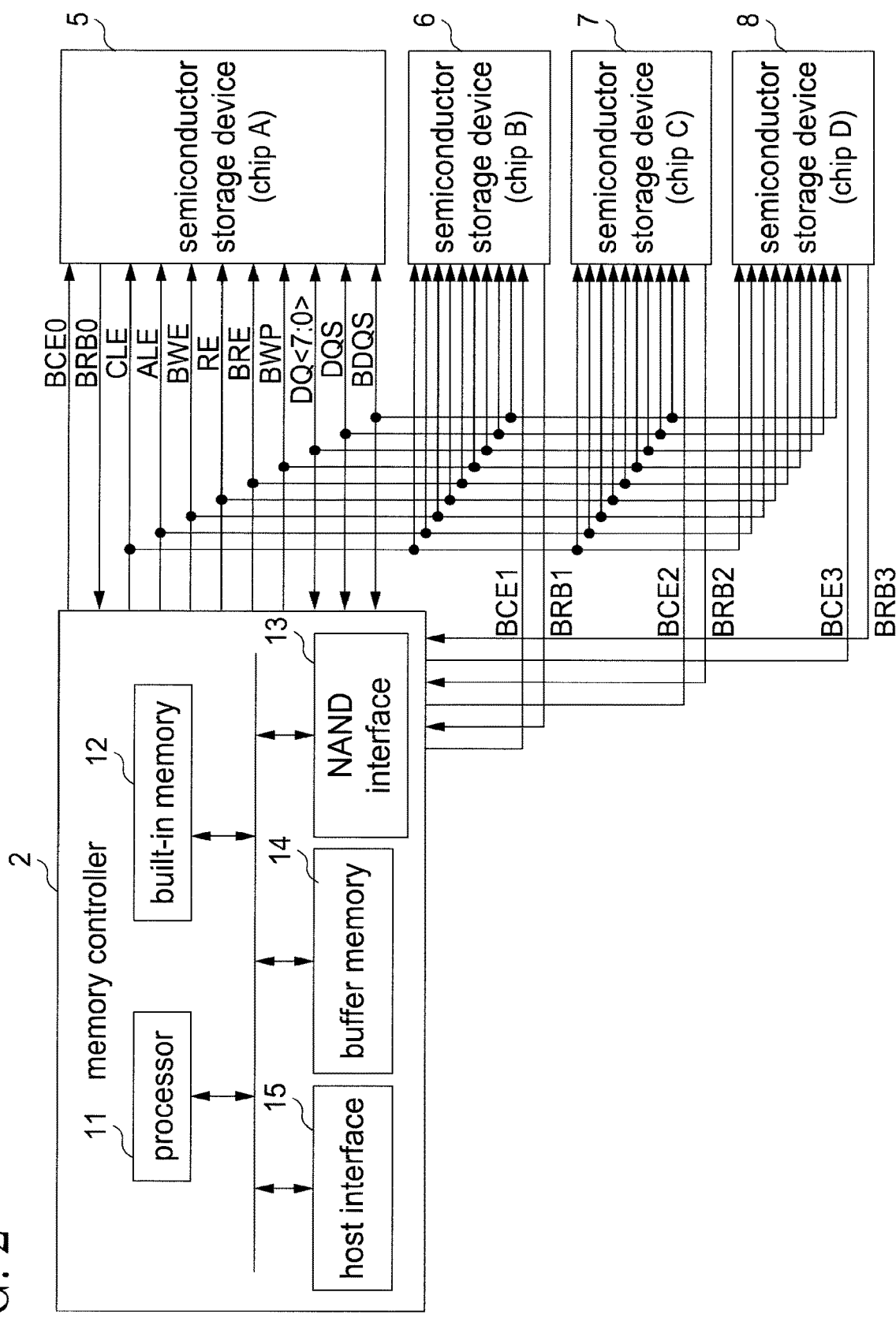
FIG. 2 is a block diagram for explaining a configuration of a signal system of a memory system according to an embodiment.

FIG. 2 is a block diagram for explaining a configuration of a signal system of the memory system according to the embodiment. As illustrated in FIG. 2, the memory controller 2 controls the semiconductor storage devices 5 to 8. Specifically, the memory controller 2 writes data in the semiconductor storage devices 5 to 8, and reads data from the semiconductor storage devices 5 to 8. The memory controller 2 is connected to the semiconductor storage devices 5 to 8 by a NAND bus.

Each of the semiconductor storage devices 5 to 8 includes a plurality of memory cells, and stores data in a nonvolatile manner. Each of the semiconductor storage devices 5 to 8 is, for example, a semiconductor chip, which may be uniquely identified by being supplied with individual chip enable signals or being assigned to individual chip addresses in advance. Therefore, each of the semiconductor storage devices 5 to 8 are operable independently by an instruction from the memory controller 2.

Similar signals are transmitted and received on the NAND bus connected to each of the semiconductor storage devices 5 to 8. The NAND bus includes a plurality of signal lines to transmit and receive signals according to a NAND interface. BCE is a chip enable signal and operates with negative logic. BRB is a ready busy signal and operates in negative logic. CLE is a command latch enable signal and operates in positive logic. ALE is an address latch enable signal and operates in positive logic. BWE is a write enable signal and operates in negative logic. RE and BRE are read enable signals and inverted signals of them. The RE operates in positive logic. The BRE operates in negative logic. For example, the RE and/or BRE function as output instruction signals. BWP is a write protect signal and operates in negative logic.

DQ<7:0> is a data signal. The data signal DQ<7:0> is input and output via the input/output terminal (I/O port). Signals DQS and BDQS are a data strobe signal and an inverted signal of the data strobe signal. For example, the DQS and/or the BDQS function as the strobe signal or a timing control signal. The strobe signal (DQS/BDQS) is a signal pair having opposite phases. The strobe signal is a signal defining timing of transmitting and receiving the data signal DQ<7:0>. Signals BCE0 to BCE3 are transmitted from the memory controller 2 to each of the storage devices 5 to 8 independently. Signals BRB0 to BRB3 are transmitted independently from each of the semiconductor storage devices 5 to 8 to the memory controller 2. The signals CLE, ALE, BWE, RE, BRE, and BWP are commonly transmitted from the memory controller 2 to the semiconductor storage devices 5 to 8.

The signals BCE0 to BCE3 are signals for enabling the semiconductor storage devices 5 to 8, respectively. The signal CLE notifies the semiconductor storage devices 5 to 8 that the data signals DQ<7:0> flowing to the semiconductor storage devices 5 to 8 are commands while the signal CLE is at the "high (H)" level. The signal ALE notifies the semiconductor storage devices 5 to 8 that the data signals DQ<7:0> flowing to the semiconductor storage devices 5 to 8 are addresses while the signal ALE is at the "H" level. The signal BWE instructs the semiconductor storage devices 5 to 8 to write the data signals DQ<7:0> flowing to the semiconductor storage devices 5 to 8 while the signal BWE is at the "low (L)" level.

The signals RE and BRE instruct the semiconductor storage devices 5 to 8 to output the data signals DQ<7:0>, and for example, are used to control the operation timing of the semiconductor storage devices 5 to 8 when outputting the data signals DQ<7:0>. The signal BWP instructs the semiconductor storage devices 5 to 8 to prohibit data writing and erasing. The signals BRB0 to BRB3 respectively indicate whether the semiconductor storage devices 5 to 8 are in a ready state (a state of accepting a command from the outside) or in a busy state (a state of not accepting a command from the outside).

The data signals DQ<7:0> are, for example, 8-bit signals. The data signals DQ<7:0> are transmitted and received between the semiconductor storage devices 5 to 8 and the memory controller 2, and include commands, addresses, and data. The signals DQS and BDQS may be generated, for example, based on the signals RE and BRE, and are used to control the operation timing of the semiconductor storage devices 5 to 8 in response to the data signals DQ<7:0>.

The memory controller 2 includes a processor (central processing unit (CPU)) 11, a built-in memory (random access memory (RAM)) 12, a NAND interface circuit 13, a buffer memory 14, and a host interface circuit 15.

The processor 11 controls the overall operation of the memory controller 2. The processor 11 issues, for example, a write command based on a NAND interface to the semiconductor storage devices 5 to 8 in response to a write command of data received from the outside. This function is equally applied to other operations such as, for example, read, erasing and calibration operations.

The built-in memory 12 is, for example, a semiconductor memory such as, for example, dynamic RAM (DRAM), and is used as a work area of the processor 11. The built-in memory 12 holds, for example, firmware and various management tables for managing the semiconductor storage devices 5 to 8.

The NAND interface circuit 13 is connected to the semiconductor storage devices 5 to 8 via the above-described NAND bus, and executes communication with the semiconductor storage devices 5 to 8. The NAND interface circuit 13 transmits commands, addresses, and write data to the semiconductor storage devices 5 to 8 in response to an instruction of the processor 11. In addition, the NAND interface circuit 13 receives statuses and read data from the semiconductor storage devices 5 to 8.

The buffer memory 14 temporarily holds, for example, data received by the memory controller 2 from the semiconductor storage devices 5 to 8 and the outside.

The host interface circuit 15 is connected to an external host device (not illustrated), and executes communication with the host device. The host interface circuit 15 transfers, for example, commands and data, received from the host device, to the processor 11 and the buffer memory 14, respectively.

[Configuration of the Semiconductor Storage Device]

The configuration of the semiconductor storage device according to the first embodiment is described with reference to FIG. 3. The semiconductor storage devices 5 to 8 have, for example, the same configuration. Therefore, in the following description, a configuration of the semiconductor storage device 5, among the semiconductor storage devices 5 to 8, is described, and a description related to a configuration of the semiconductor storage devices 6 to 8 is omitted.

Figure 3:
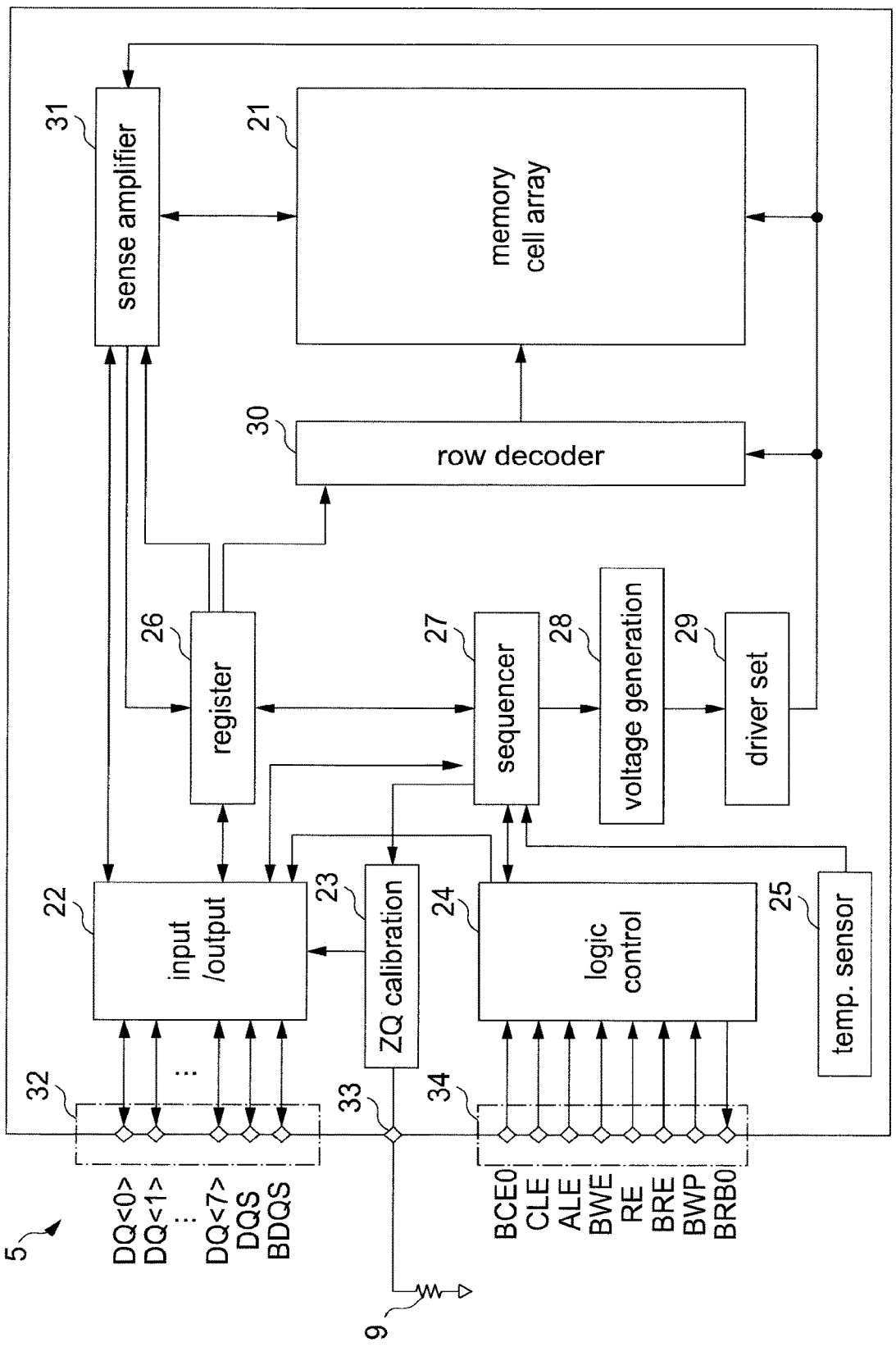
FIG. 3 is a block diagram illustrating a configuration of a semiconductor storage device according to an embodiment.

As illustrated in FIG. 3, the semiconductor storage device 5 includes a memory cell array 21, an input/output circuit 22, a ZQ calibration circuit 23, a logic control circuit 24, a temperature sensor 25, a register 26, a sequencer 27, a voltage generation circuit 28, a driver set 29, a row decoder 30, a sense amplifier 31, an input/output pad group 32, a ZQ calibration pad 33, and a logic-control pad group 34.

The memory cell array 21 includes a plurality of non-volatile memory cells (not illustrated) associated with word lines and bit lines.

The input/output circuit 22 transmits and receives the data signals DQ<7:0> to and from the memory controller 2. The input/output circuit 22 transfers commands and addresses in the data signals DQ<7:0> to the register 26. The input/output circuit 22 transmits and receives write data and read data to and from the sense amplifier 31.

The ZQ calibration circuit 23 calibrates the output impedance of the semiconductor storage device 5 based on the reference resistor 9 via the ZQ calibration pad 33.

The logic control circuit 24 receives the signals BCE0, CLE, ALE, BWE, RE, BRE, and BWP from the memory controller 2. In addition, the logic control circuit 24 transfers the signal BRB0 to the memory controller 2 and notifies the state of the semiconductor storage device 5 to the outside.

The temperature sensor 25 measures the temperature inside the semiconductor storage device 5. The temperature sensor 25 sends information on the measured temperature to the sequencer 27. Further, the temperature sensor 25 may be provided at any position in the semiconductor storage device 5 in a range within which it may measure the temperature that may be regarded as the temperature of the memory cell array 21.

The register 26 holds commands and addresses. The register 26 transfers the addresses to the row decoder 30 and the sense amplifier 31, and transfers the commands to the sequencer 27.

The sequencer 27 receives the commands, and controls the entire semiconductor storage device 5 according to the sequence based on the received commands. In addition, the sequencer 27 sends information on the temperature, received from the temperature sensor 25, to the memory controller 2 via the input/output circuit 22.

The voltage generation circuit 28 generates voltages required for operations such as, for example, data writing, reading, and erasing based on an instruction from the sequencer 27. The voltage generation circuit 28 supplies the generated voltage to the driver set 29.

The driver set 29 includes a plurality of drivers, and supplies various voltages from the voltage generation circuit 28 to the row decoder 30 and the sense amplifier 31 based on the addresses from the register 26. The driver set 29 supplies various voltages to the row decoder 30 based on, for example, a row address among the addresses.

The row decoder 30 receives the row address, among the addresses, from the register 26, and selects the memory cells in the row based on the row address. Then, the voltages from the driver set 29 are transferred to the memory cells in the selected row via the row decoder 30.

At the time of reading data, the sense amplifier 31 senses read data that are read from the memory cells to the bit lines, and transfers the sensed read data to the input/output circuit 22. At the time of writing data, the sense amplifier 31 transfers write data via the bit lines to the memory cells. In addition, the sense amplifier 31 receives a column address, among the addresses, from the register 26, and outputs column data based on the column address.

The input/output pad group 32 transfers the data signal DQ<7:0>, the signal DQS, and the signal BDQS, received from the memory controller 2, to the input/output circuit 22. In addition, the input/output pad group 32 transfers the data signal DQ<7:0>, transmitted from the input/output circuit 22, to the outside of the semiconductor storage device 5.

The ZQ calibration pad 33 is connected at one end thereof to the reference resistor 9 and at the other end thereof to the ZQ calibration circuit 23.

The logic-control pad group 34 transfers the signals BCE0, CLE, ALE, BWE, RE, BRE, and BWP, received from the memory controller 2, to the logic control circuit 24. In addition, the logic-control pad group 34 transfers the signal BRB0, transmitted from the logic control circuit 24, to the outside of the semiconductor storage device 5.

[Configuration of the Input/Output Circuit and the Logic Control Circuit]

Figure 4:
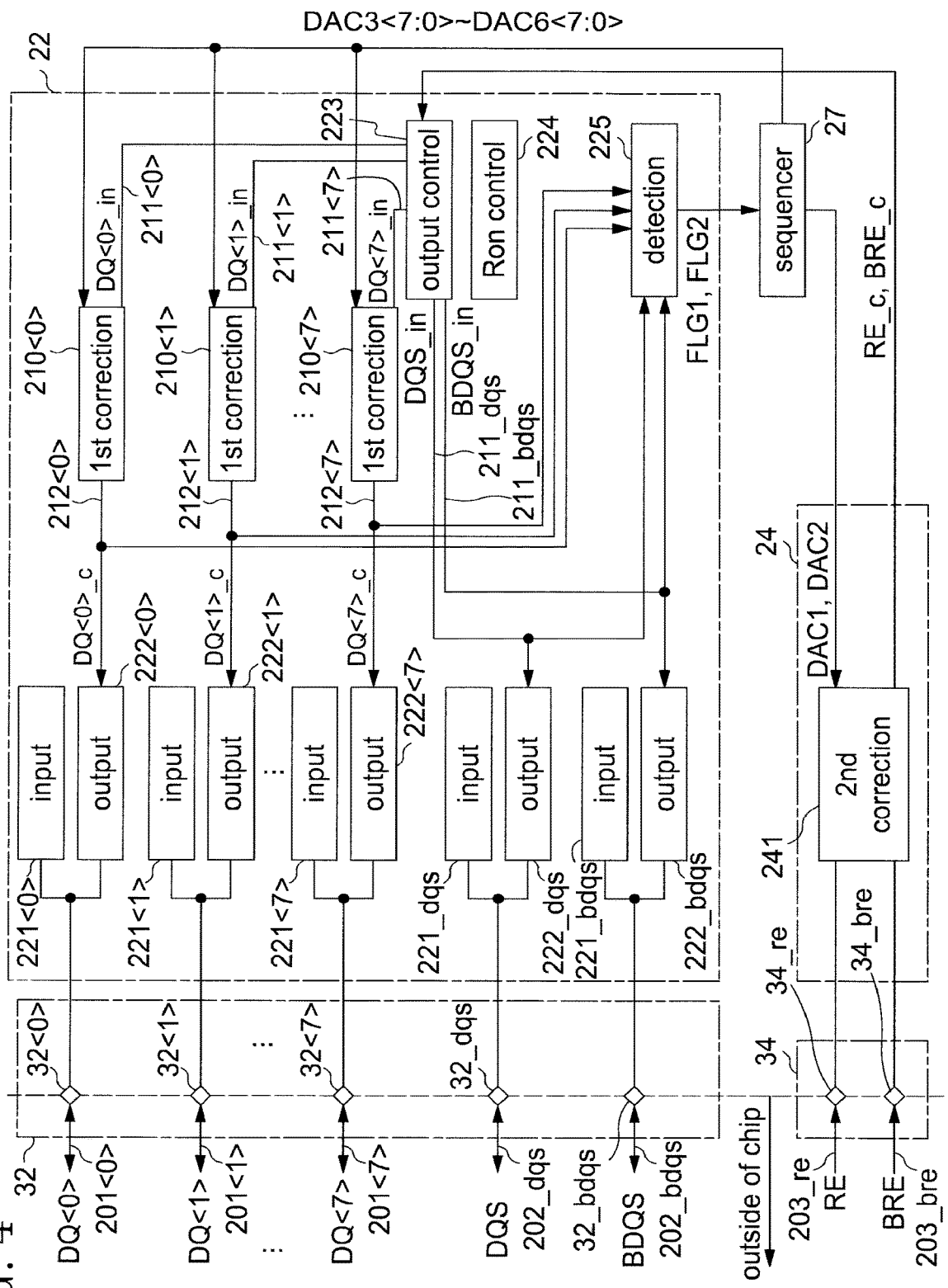
FIG. 4 is a block diagram for explaining configurations of an input/output circuit and a logic control circuit of a semiconductor storage device according to an embodiment.

The input/output circuit and the logic control circuit of the semiconductor storage device according to the first embodiment is described with reference to FIG. 4. FIG. 4 is a block diagram illustrating a configuration of an input/output circuit and a logic control circuit of the semiconductor storage device according to the embodiment.

As illustrated in FIG. 4, the input/output circuit 22 includes sets of input circuits 221<0> to 221<7> and output circuits 222<0> to 221<7>, which correspond to the signals DQ<0> to DQ<7>. For example, the same kind of signal DQ<k> (0≤k≤7) is assigned to a set of an input circuit 221<k> and an output circuit 222<k>. That is, the set of the input circuit 221<k> and the output circuit 222<k> is connected to a pad 32<k> (first pad) in the input/output pad group 32. The pad 32<k> enable transmission/reception the data signal DQ<k> to and from the external memory controller 2 via the signal line 201<k> (first signal line). As described above, a plurality of the set of the input circuit 221 and the output circuit 222, a plurality of the pad 32 (first pad), and a plurality of the signal line 201 (first signal line) are provided respectively. In the following explanation, a signal line to which the data signal DQ<k> and signals (DQ<k>_in and DQ<k>_c) related to the data signal DQ<k> are supplied is referred to as a first signal line. For example, the following signal line 201<k>, signal line 211<k>, and signal line 212<k> may be referred to as the first signal line. K first signal lines are provided.

In addition, the input/output circuit 22 includes a set of an input circuit 221_dqs and an output circuit 222_dqs, which corresponds to the signal DQS. That is, the set of the input circuit 221_dqs and the output circuit 222_dqs is connected to a pad 32_dqs (second pad) in the input/output pad group 32. The pad 32_dqs can communicate the signal DQS with the external memory controller 2 via the signal 202_dqs (second signal line). In addition, the input/output circuit 22 includes a set of an input circuit 221_bdqs and an output circuit 222_bdqs, which corresponds to the signal BDQS. That is, the set of the input circuit 221_bdqs and the output circuit 222_bdqs is connected to the pad 32_bdqs (second pad) in the input/output pad group 32. The pad 32_bdqs can communicate the signal BDQS with the external memory controller 2 via a signal 202_bdqs (second signal line) in the input/output pad group 32.

The input/output circuit 22 further includes a first correction circuit 210<k>, an output control circuit 223, an Ron control circuit 224, and a detection circuit 225 in addition to the above-described input circuit 221<k> and the output circuit 222<k>. These circuits are controlled by the sequencer 27. The first correction circuit 210<k> is connected to the first signal line (signal line 211<k>, 212<k>). Specifically, the first correction circuit 210<k> is provided in each of a plurality of first signal lines for connecting the output control circuit 223 and the output circuit 222<k>. However, the first correction circuit 210<k> may be provided in common with a signal line which is a part of the plurality of first signal lines. For example, the signal lines 211<0>, 211<1> are both connected to the first correction circuit 210<0>, the first correction circuit 210<1> may be omitted. The detection circuit 225 is connected to each of the plurality of first signal lines (signal line 212<k>).

The output control circuit 223 generates a data signal DQ<k>_in, a signal DQS_in, and a signal BDQS_in. The data signal DQ<k> is generated based on the data signal DQ<k>_in. The signal DQS is generated based on the signal DQS_in. The signal BDQS is generated based on the signal BDQS_in. As described in detail later, the output control circuit 223 generates a strobe signal (DQS_in/BDQS_in) based on output instruction signals (RE, BRE) received from the memory controller 2. The strobe signal (DQS_in/BDQS_in) and a strobe signal (DQS/BDQS) generated based on the strobe signal (DQS_in/BDQS_in) are changed at a predetermined cycle. The strobe signal (DQS/BDQS) is used as a timing signal for reading the data signal (DQ) and may be expressed as a "toggle signal". Specifically, the data signal (DQ) is changed when the strobe signal (DQS/BDQS) is changed. When it is not necessary to distinguish signals related to the signals DQ<k> output to the memory controller 2, such as the signal DQ<k>_in and the signal DQ<k>_c described later, the data signal DQ may be simply expressed as DQ<k>. Similarly, the DQS_in may be represented as the DQS, the BDQS_in may be represented as the BDQS, RE_c may be represented as RE, and BRE_c may be represented as BRE.

The output control circuit 223 sends the data signal DQ<k>_in to the first correcting circuit 210<k> through the signal line 211<k> (first signal line), sends the signal DQS_in to the output circuit 222_dqs and the detection circuit 225 through a signal line 211_dqs (second signal line), and sends the signal BDQS_in to the output circuit 222_bdqs and the detection circuit 225 through a signal line 211_bdqs (second signal line).

The first correction circuit 210<k> corrects a duty ratio of the DQ<k>_in, and sends the corrected data signal DQ<k>_c to the output circuit 222<k> and the detection circuit 225 via the signal line 212<k>(first signal line).

The detection circuit 225 detects a difference (first difference) between a timing at which the data signal DQ<k>_c is changed and the reference. The first correction circuit 210<k> corrects the timing at which the data signal DQ<k>_c is changed based on the first difference detected by the detection circuit 225. In other words, the first correction circuit 210<k> corrects the duty ratio of DQ<k>. The Ron control circuit 224 controls an output impedance in the output circuits 222<7:0>, 222_dqs, and 222_bdqs.

The detection circuit 225 is connected to the signal line 212<k>(first signal line), the signal line 211_dqs (second signal line), and the signal line 211_bdqs (second signal line). The detection circuit 225 detects a duty ratio of the DQS_in/BDQS_in by monitoring the signals DQS_in and BDQS_in sent from the output control circuit 223. The detection circuit 225 generates a signal FLG1, which indicates whether or not calibration of the duty ratio of the DQS_in/BDQS_in is necessary, based on the detection result, and sends the same to the sequencer 27.

Similarly to the above, the detection circuit 225 detects a duty ratio of the DQ<k>_c by monitoring the corrected data signal DQ<k>_c sent from the first correction circuit 210<k>. The detection circuit 225 detects a difference (first difference) between a timing at which the data signal DQ<k>_c is changed and the reference. In the present embodiment, a reference voltage VREF is used as the reference voltage. In a state in which the first correction circuit 210<k> does not function, the data signal DQ<k>_c is the same as the data signal DQ<k>_in. The detection circuit 225, based on the detection result, generates a signal FLG2 indicating whether calibration of the duty ratio of DQ<k>_c is necessary or not, and sends the signal FLG2 to the sequencer 27.

As described above, the detection circuit 225 is connected to the plurality of signal lines 212<k> (plurality of first signal lines), the signal line 211_dqs (second signal line), and the signal line 211_bdqs (second signal line), and monitors the data signal DQ<k>_c, the signal DQS_in, and the signal BDQS_in. Therefore, the sequencer 27 executes the detection for the above-mentioned signals at different timings. In other words, the sequencer 27 controls the detection of the difference (second difference) between the timing at which the strobe signal (DQS/BDQS) in the second signal line (signal line 211_dqs, 211_bdqs) is changed and the reference, and the detection of the difference (first difference) between the timing at which the data signal DQ<k> in each of the plurality of first signal lines (212<k>) is changed and the difference, respectively, at different timings.

Upon receiving the signal FLG1 from the detection circuit 225, the sequencer 27 generates control signals DAC1 and DAC2 based on the signal FLG1 and sends the control signals DAC1 and DAC2 to the logic control circuit 24. Upon receiving the signal FLG2 from the detection circuit 225, the sequencer 27 generates control signals DAC3 to DAC6 based on the signal FLG2 and sends the control signals DAC3 to DAC6 to each of the first correction circuit 210<k>.

The logic control circuit 24 includes a second correction circuit 241. The second correction circuit 241 is connected to pads 34_re (third pad) and 34_bre (third pad) in the logic control pad group 34. The pads 34_re and 34_bre receive the output instruction signals (RE, BRE) instructing to transmit the data signal DQ from the external memory controller 2 via a signal line 203_re (third signal line) and a signal line 203_bre (third signal line). The detection circuit 225 detects the difference between a timing at which the strobe signal (DQS/BDQS) is changed (second difference) and the reference. The second correction circuit 241 corrects the timing at which the strobe signal (DQS/BDQS) is changed based on the second difference detected by the detection circuit 225. In other words, the second correction circuit 241 corrects the duty ratio of the DQS/BDQS.

The second correction circuit 241 includes a function for correcting a duty ratio of the RE/BRE input via the third pads. The correction circuit 241 corrects the duty ratio of the RE/BRE based on the control signals DAC1 and DAC2 from the sequencer 27, and generates signals RE_c and BRE_c. For example, the signals RE_c and BRE_c are sent to the output control circuit 223, and are used as the basis of the timing of the strobe signal (DQS_in/BDQS_in) generated in the output control circuit 223. More specifically, the duty ratio of the DQS_in/BDQS_in is determined according to the duty ratio of the RE_c/BRE_c. For example, the duty ratio of the DQS_in/BDQS_in is the same as or correlates with the duty ratio of the RE_c/BRE_c. The signals RE_c and BRE_c are signals generated based on the signals RE and BRE, and the signals DQS and BDQS are signals generated based on the signals DQS_in and BDQS_in. Therefore, it can be said that the signals DQS and BDQS are generated based on the signals RE and BRE.

The output control circuit 223 receives the signals RE_c and BRE_c for correcting the duty ratio of DQS/BDQS and corrects the duty ratio of DQS/BDQS collectively based on the signals RE_c and BRE_c. Thereafter, the output control circuit 223 individually corrects the duty ratio of each DQ<k>.

The first correction circuit 210<k> corrects the duty ratio of the DQ<k> based on the control signals DAC3<k> to DAC6<k> received from the sequencer 27, and sends the corrected data DQ<k>_c to the output circuit 222<k>. Hereinafter, when it is not necessary to distinguish each of the control signals DAC3<7:0> to DAC6<7:0>, the control signal is simply referred to as the control signals DAC3 to DAC6.

Further, in the example of FIG. 4, a configuration where the signals RE_c and BRE_c are directly sent from the correction circuit 241 to the output control circuit 223 is illustrated, but the disclosure is not limited to this configuration. For example, after the correction circuit 241 sends the signals RE_c and BRE_c to the other circuits (e.g., the sequencer 27), a timing signal based on the duty ratio of the signals RE_c and BRE_c may be generated in the other circuit. Then, when the timing signal is sent to the output control circuit 223, the signals DQS_in and BDQS_in, correlated with the duty ratio of the signals RE_c and BRE_c, may be generated.

As described above, since the detection circuit 225 is connected to the signal line 212<k> corresponding to each data signal DQ<k> and the first correction circuit 210<k> is provided on the signal line 212<k>, even if a dispersion among the duty ratios of the DQ<k> occurs, each DQ<k> is corrected to an appropriate duty ratio.

[Configuration of the Detection Circuit]

Figure 5:
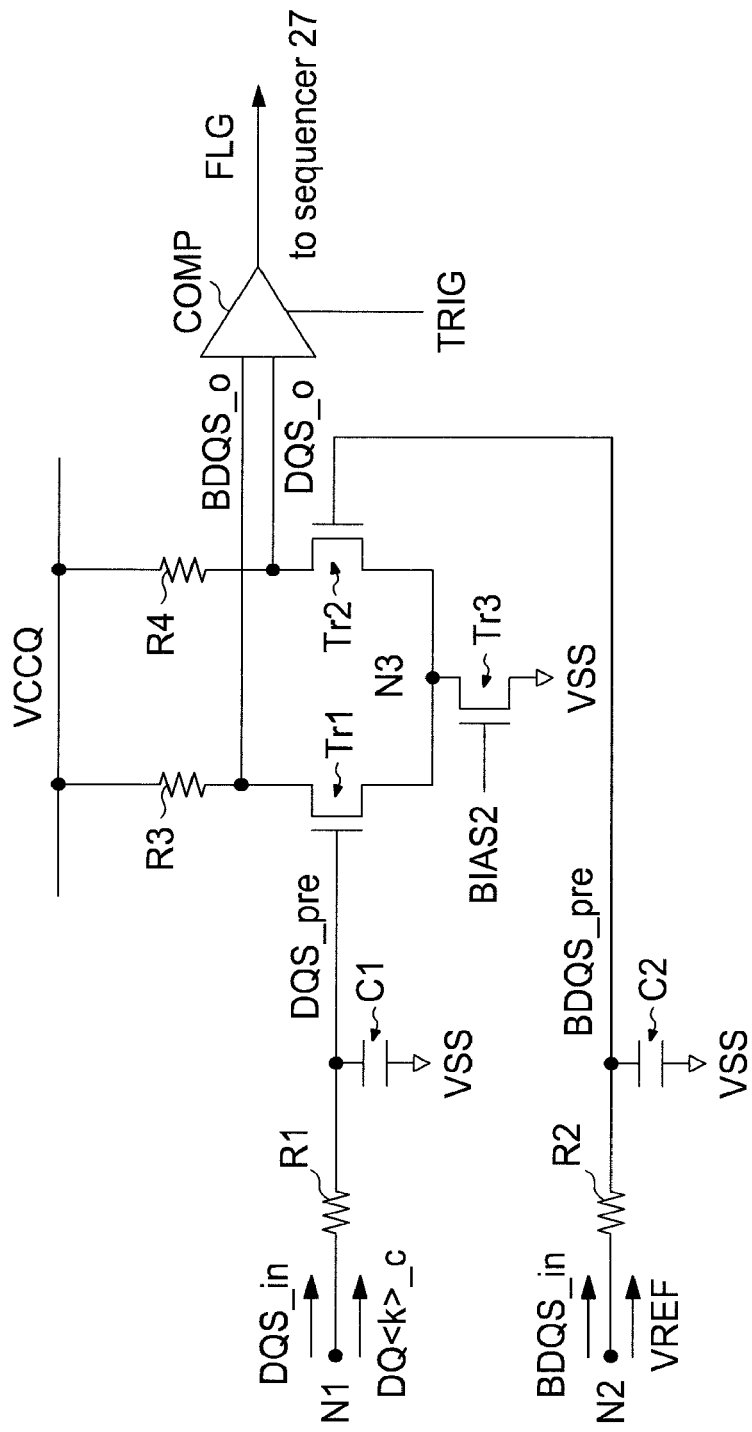
FIG. 5 is a block diagram for explaining a configuration of a detection circuit of a semiconductor storage device according to an embodiment.

A configuration of the detection circuit 225 of the input/output circuit 22 according to the first embodiment is described with reference to FIG. 5. FIG. 5 is a block diagram for explaining a configuration of a detection circuit of the semiconductor storage device according to the embodiment. As illustrated in FIG. 5, the detection circuit 225 includes transistors Tr1 to Tr3, resistors R1 to R4, capacitors C1 to C2 and a comparator COMP. For example, the transistors Tr1 to Tr3 are n-type transistors.

The resistor R1 includes a first terminal connected to a node N1 and a second terminal connected to a node DQS_pre. The capacitor C1 includes a first terminal connected to the node DQS_pre and a second terminal, to which the voltage VSS is supplied.

The resistor R2 includes a first terminal connected to a node N2 and a second terminal connected to a node BDQS_pre. The capacitor C2 includes a first terminal connected to the node BDQS_pre and a second terminal, to which the voltage VSS is supplied.

The combination of the signals DQS_in and BDQS_in, or the combination of the data signal DQ<k>_c and the reference voltage VREF are supplied to the node N1 and the node N2 at different timings, respectively. That is, the detection circuit 225 compares the signal DQS_in with the signal BDQS_in and compares the data signal DQ<k>_c with the reference voltage VREF. The VREF is a voltage value which is middle of the "L" level and the "H" level of the data signal DQ<k>_c, for example, VCCQ/2.

The resistor R3 includes a first terminal, to which the voltage VCCQ is supplied, and a second terminal connected to a node BDQS_o. The transistor Tr1 includes a first terminal connected to the node BDQS_o, a second terminal connected to a node N3, and a gate connected to the node DQS_pre.

The resistor R4 includes a first terminal, to which the voltage VCCQ is supplied, and a second terminal connected to the node DQS_o. The transistor Tr2 includes a first terminal connected to the node DQS_o, a second terminal connected to the node N3, and a gate connected to the node BDQS_pre.

The transistor Tr3 includes a first terminal connected to the node N3, a second terminal, to which the voltage VSS is supplied, and a gate, to which a signal BIAS2 is supplied.

With the configuration as described above, the voltage levels of the nodes DQS_o and BDQS_o vary according to the voltage levels applied to the nodes DQS_pre and BDQS_pre. Specifically, when "H" level and "L" level are applied respectively to the nodes DQS_pre and BDQS_pre, "H" level and "L" level are applied respectively to the nodes DQS_o and BDQS_o. In addition, when "L" level and "H" level are applied respectively to the nodes DQS_pre and BDQS_pre, "L" level and "H" level are applied respectively to the nodes DQS_o and BDQS_o.

The comparator COMP includes a first input terminal connected to the node DQS_o, a second input terminal connected to the node BDQS_o, and an output terminal, which outputs the signal FLG. The comparator COMP is driven by the voltage supplied from a signal TRIG. The comparator COMP switches the voltage level of the signal FLG to the "H" level or the "L" level according to a magnitude relationship of the voltage levels of the nodes DQS_o and BDQS_o at a timing when signals are supplied to the signal TRIG (e.g. switching from "L" level to "H" level).

Specifically, the signal input to the node N1 is converted from AC to DC by a low-pass filter including the resistance R1 and the capacitor C1. Similarly, the signal input to the node N2 is converted from AC to DC by a low-pass filter including the resistance R2 and the capacitor C2. For example, when a period of the "H" level of the node N1 is longer than a period of the "H" level of the node N2, the low-pass filter connected to the node N1 generates a higher voltage than the low-pass filter connected to the node N2.

With the configuration as described above, the detection circuit 225 may output the signal FLG of the "H" level when the duty ratio of the DQS_in/BDQS_in and the duty ratio of the DQ<k>_c are greater than 50%, and may output the signal FLG of the "L" level when the duty ratio of the DQS_in/BDQS_in and the duty ratio of the DQ<k>_c are smaller than 50%.

[Configuration of the First Correction Circuit]

Figure 6:
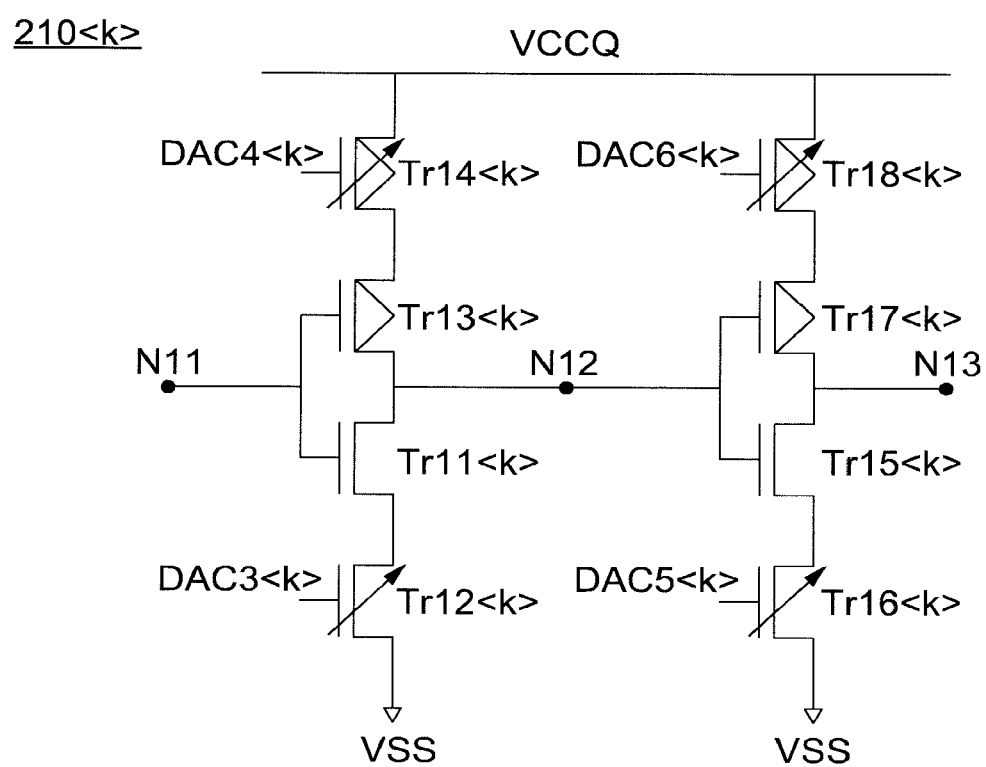
FIG. 6 is a block diagram for explaining a configuration of a first correction circuit of a semiconductor storage device according to an embodiment.

Details of the configuration of the first correction circuit 210<k> in the input/output circuit 22 according to the first embodiment is described with reference to FIG. 6. FIG. 6 is a block diagram for explaining a configuration of a first correction circuit of the semiconductor storage device according to the embodiment. As shown in FIG. 6, the first correcting circuit 210<k> includes transistors Tr11<k> to Tr18<k>. Hereinafter, when it is not necessary to distinguish each of the first correction circuit 210<7:0> in particular, these transistors are simply referred to as the transistors Tr11 to Tr18.

The transistors Tr11, Tr12, Tr15, Tr16 are, for example, n-type transistors. The transistors Tr13, Tr14, Tr17, Tr18 are, for example, p-type transistors. Each of the transistors Tr12, Tr14, Tr16, Tr18 is a transistor that can change the ON resistance of the transistor based on the control signals DAC3 to DAC6 supplied to the gate. Specifically, for example, each of the transistors Tr12, Tr14, Tr16, Tr18 is composed of a plurality of transistors connected in parallel. For example, the control signals DAC3 to DAC6 are signals that switch transistor(s) in the plurality of transistor connected in parallel to an on-state or off-state. With the above-described configuration, the magnitude of each resistance of the transistors Tr12, Tr14, Tr16, Tr18 is switched stepwise within a predetermined range in accordance with the control signals DAC3 to DAC6.

A voltage VSS is supplied to first ends of the transistors Tr12 and Tr16. A voltage VCCQ is supplied to first ends of transistors Tr14 and Tr18. The transistors Tr11 and Tr13 are connected in series between transistors Tr12 and Tr14. The gates of the transistors Tr11 and Tr13 are connected to the node N11. The signal line 211<k> is connected to the node N11, and the data signal DQ<k>_in is supplied thereto. A terminal between the transistors Tr11 and Tr13 is connected to the node N12.

A configuration of the transistors Tr15 to Tr18 is the same as the configuration of the transistors Tr11 to Tr14, and therefore the explanation thereof is omitted. The corrected data signal DQ<k>_c is output to the node N13. The node N13 is connected to the signal line 212<k>. Details of the signals input and output to and from the nodes N11 to N13 are described later. By adjusting the ON resistance of the transistors (Tr12, Tr14, Tr16, Tr18) whose resistance is variable, the duty ratio of the data signal DQ<k>_in is corrected to output the data signal DQ<k>_c.

[Configuration of the Second Correction Circuit]

Figure 7:
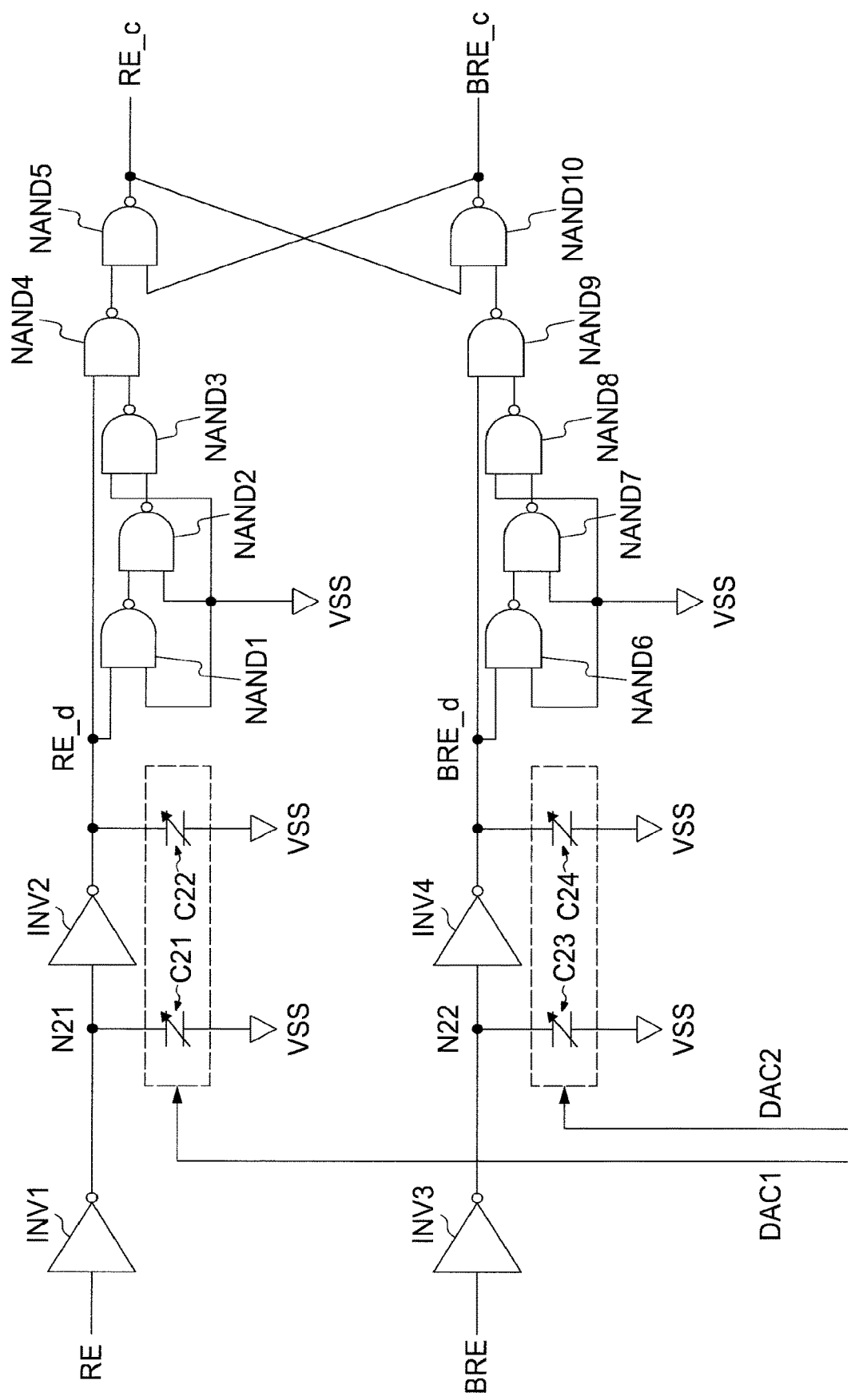
FIG. 7 is a block diagram for explaining a configuration of a second correction circuit of a semiconductor storage device according to an embodiment.

Among the input/output circuit 24 according to the first embodiment, details of a configuration of the second correction circuit 241 are described with reference to FIG. 7. FIG. 7 is a block diagram for explaining a configuration of a second correction circuit of the semiconductor storage device according to the embodiment. As illustrated in FIG. 7, the second correction circuit 241 includes inverters INV1 to INV4, variable capacitors C21 to C24, and logic circuits NAND1 to NAND10. The second correction circuit 241 is composed of a RE input system to which the signal RE is input and a BRE input system to which the signal BRE is input.

The RE input system includes the inverter INV1, INV2. The inverter INV1 includes an input terminal, to which the signal RE is input, and an output terminal connected to a node N21. The inverter INV2 includes an input terminal connected to the node N21 and an output terminal connected to a node RE_d.

The variable capacitor C21 includes a first terminal connected to the node N21 and a second terminal, to which the voltage VSS is supplied. The variable capacitor C22 includes a first terminal connected to the node RE_d and a second terminal, to which the voltage VSS is supplied. The variable capacitors C21 and C22 are configured in a manner such that the capacitances thereof may be changed based on the control signal DAC1 sent from the sequencer 27. More specifically, for example, each of the variable capacitors C21 and C22 may include a plurality of sets (not illustrated) of capacitors and switches connected in series, and may be configured in a manner such that the plurality of sets are connected in parallel. The control signal DAC1 is a signal that may set, for example, any number of switches in the variable capacitors C21 and C22 to an ON state or an OFF state. With the configuration as described above, the variable capacitors C21 and C22 may change their capacitances stepwise within a certain range in response to the control signal DAC1. That is, a signal, which is delayed by a certain amount, is supplied to the node RE_d according to the set capacitances of the variable capacitors C21 and C22.

Since the configuration of the BRE input system has the same configuration as that of the RE input system described above, the description thereof is omitted.

In addition, the control signals DAC1 and DAC2 may be set independently of each other. Therefore, the amount of delay from the signal RE in the node RE_d and the amount of delay from the signal BRE in the node BRE_d is controlled independently of each other. Therefore, signals, one of which is delayed by an arbitrary time with respect to the other one, may be supplied to the nodes RE_d and BRE_d in response to the control signals DAC1 and DAC2.

Logic circuits NAND1 to NAND10 outputs NAND operation results of two input signals. Logic circuits NAND1 to NAND5 constitute a logic circuit of the RE input system. Logic circuits NAND6 to NAND10 constitute a logic circuit of the BRE input system.

The logic circuit NAND1 includes a first input terminal connected to the node RE_d, a second input terminal, to which the voltage VSS is supplied, and an output terminal connected to a first input terminal of the logic circuit NAND2. The logic circuit NAND2 includes a second input terminal, to which the voltage VSS is supplied, and an output terminal connected to a first input terminal of the logic circuit NAND3. The logic circuit NAND3 includes a second input terminal, to which the voltage VSS is supplied, and an output terminal connected to a first input terminal of the logic circuit NAND4. The logic circuit NAND4 includes a second input terminal connected to the node RE_d and an output terminal connected to a first input terminal of the logic circuit NAND5. The logic circuit NAND5 includes a second input terminal connected to a node BRE_c and an output terminal connected to a node RE_c.

The configuration of the logic circuits NAND6 to NAND10 constituting the logic circuit of the BRE input system has the same configuration as that of the logic circuits NAND1 to NAND5 described above, and therefore the explanation thereof is omitted.

The logic circuits NAND5 and NAND10 constitute a reset/set (RS) flip-flop circuit. Thereby, the voltage level of the node RE_c changes from the "L" level to the "H" level or from the "H" level to the "L" level at the timing when the voltage levels of the nodes RE_d and BRE_d change from the "L" level to the "H" level. That is, the node RE_c outputs a signal, the voltage level of which changes according to the rising edge of a pulse in the nodes RE_d and BRE_d. In addition, an inverted signal of the node RE_d is output to the voltage level of the node BRE_c.

[Configuration of Output Circuit]

Figure 8:
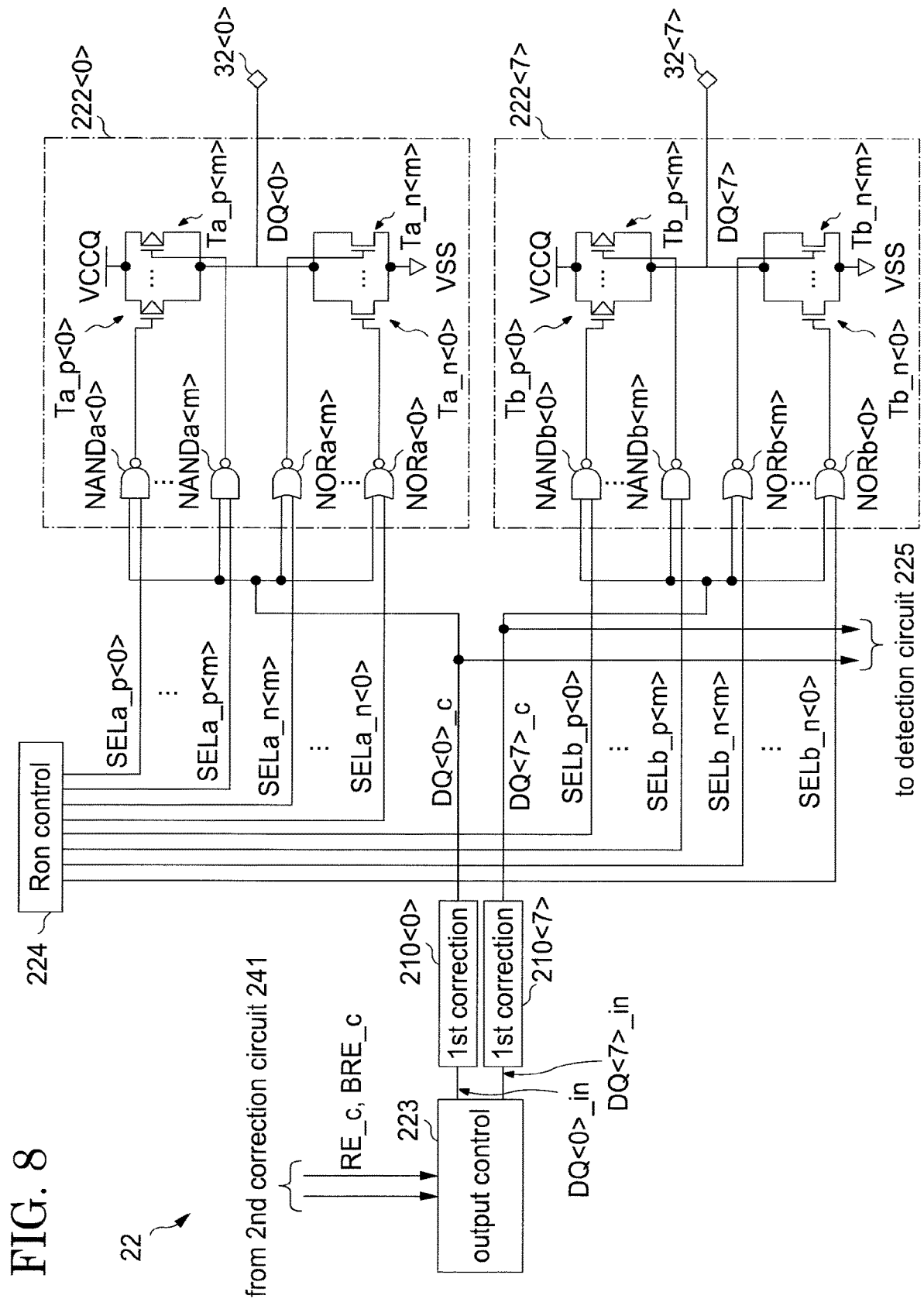
FIG. 8 is a block diagram for explaining a configuration of an output circuit of a semiconductor storage device according to an embodiment.

Next, details of a configuration of the output circuit 222<k> of the input/output circuit 22 according to the first embodiment are described with reference to FIG. 8. In FIG. 8, only the output circuits 222<0> and 222<7> are indicated and the output circuits 222<1> to 222<6> are omitted. FIG. 8 is a block diagram for explaining a configuration of an output circuit of the semiconductor storage device according to the embodiment. FIG. 8 illustrates a connection relationship between the first correction circuit 210<k>, the output circuit 222<k>, the output control circuit 223, the Ron control circuit 224, and the pad 32<k>.

As illustrated in FIG. 8, the output circuit 222<0> includes logic circuits NANDa<m:0> and NORa<m:0>, and the transistors Ta_p<m:0> and Ta_n<m:0>. In addition, the output circuit 222<7> includes logic circuits NANDb<m:0> and NORb<m:0>, and the transistors Tb_p<m:0> and Tb_n<m:0>. Here, "m" is a natural number.

The logic circuits NANDa<m:0> and NANDb<m:0> output the NAND operation results of two input signals. The logic circuits NORa<m:0> and NORb<m:0> output the NOR operation results of two input signals. The transistors Ta_p<m:0> and Tb_p<m: 0> are p-type transistors, and the transistors Ta_n<m:0> and Tb_n<m:0> are n-type transistors.

As described above, the output control circuit 223 sends the signals DQ<k>_in, which are generated based on the duty ratio of the RE_c/BRE_c sent from the second correction circuit 241, to the first correction circuit 210<k>. The first correction circuit 210<k> corrects the signal DQ<k>_in based on the signal FLG output by the detection circuit 225 and outputs the signal DQ<k>_c to logic circuits NANDa<m:0>, NANDb<m:0>, and the logic circuits NORa<m:0>, NORb<m:0>. In addition, the Ron control circuit 224 sends signals SELa_p<m:0> and SELa_n<m:0> and signals SELb_p<m:0> and SE Lb_n<m:0>.

First, a configuration of the output circuit 222<0> is described.

The logic circuits NANDa<m:0> include first input terminals, to which the signal DQ<0>_c is supplied in common, and second input terminals, to which the signals SELa_p<m:0> are supplied, respectively. In addition, outputs of the logic circuits NANDa<m:0> are connected to gates of the transistors Ta_p<m:0>, respectively.

The transistors Ta_p<m:0> include first terminals, to which the voltage VCCQ is supplied in common, and second terminals, which are connected to the pad 32<0>_in common.

The logic circuits NORa<m:0> include first input terminals, to which the signal DQ<0>_c is supplied in common, and second input terminals, to which the signals SELa_n<m: 0> are supplied, respectively. In addition, the logic circuits NORa<m:0> are connected to gates of the transistors Ta_n<m:0>, respectively.

The transistors Ta_n<m:0> include first terminals, to which the voltage VSS is supplied in common, and second terminals, which are connected to the pad 32<0>_in common.

With the configuration as described above, when the signal DQ<0>_c is at the "H" level, the output circuit 222<0> may set the combined resistance of the transistors, which are selected such that the ON resistance is obtained by the signals SELa_p<m:0>, among the transistors Ta_p<m: 0> to the output impedance on the pull-up side of the signal DQ<0>. In addition, when the signal DQ<0>_c is at the "L" level, the output circuit 222<0> sets the combined resistance of the transistors, which are selected such that the ON resistance is obtained by the signals SELa_n<m: 0>, among the transistors Ta_n<m:0> to the output impedance on the pull-down side of the signal DQ<0>.

Since the output circuits 222<1> to 222<7> have the same configuration as described above, detailed description thereof is omitted.

Since the configurations of the output circuits 222_dqs and 222_bdqs are similar to the configuration of the output circuit 222<k>, detailed description thereof is omitted. However, in the output circuits 222_dqs and 222_bdqs, the first correction circuit 210<k> is not provided between the output control circuit 223 and the output circuit 222_dqs, and between the output control circuits 223 and 222_bdqs.

[Calibration Operation by the Semiconductor Storage Device]

FIGS. 9A to 9D are conceptual diagrams for explaining a calibration operation of the semiconductor storage device according to the comparative example and the calibration operation of the semiconductor storage device according to an embodiment. In the FIGS. 9A to 9D, the timing at which the strobe signal (DQS/BDQS) is changed and the timing at which the respective data signals DQ<k> are changed are compared. As shown in FIGS. 9A to 9D, the strobe signal (DQS/BDQS) includes a first strobe signal (DQS) and a second strobe signal (BDQS). The first strobe signal and the second strobe signal have opposite phases to each other.

Figure 9A:
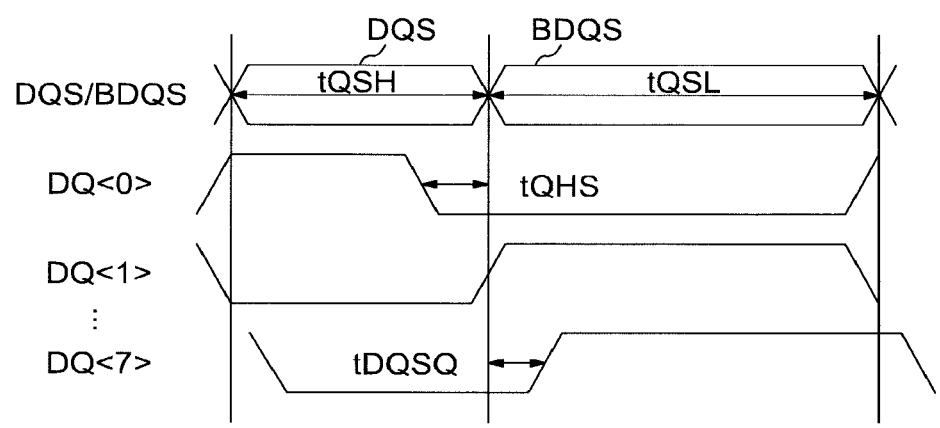
FIG. 9A is a conceptual diagram for explaining a calibration operation of a semiconductor storage device according to a comparative embodiment and a calibration operation of a semiconductor storage device according to an embodiment.

In FIG. 9A, the duty ratio of the DQS/BDQS is less than 50%. Therefore, a period tQSH that the signal DQS is "H" level and the signal BDQS is "L" level is shorter than a period tQSL that the signal DQS is "L" level and the signal BDQS is "H" level. The data signal DQ<k> is controlled so that the data signal DQ<k> is changed at the time when the strobe signal (DQS/BDQS) is changed. The timing at which the DQ<k> is changed may vary depending on the position of the signal line to which DQ<k> is supplied. For example, even if the timing at which the DQ<1> is changed is synchronized with the timing at which the DQS/BDQS is changed, the other data signals (e.g., DQ<0> and DQ<7>) may not be synchronized with the timing at which the DQS/BDQS is changed. In other words, variation occurs in the duty ratio of the DQ<k>. In FIG. 9A, the DQ<0> is changed at a timing earlier than the timing at which the DQS/BDQS is changed by tQHS, and the DQ<7> is changed at a timing later than the timing at which the DQS/BDQS is changed by tDQSQ.

Figure 9B:
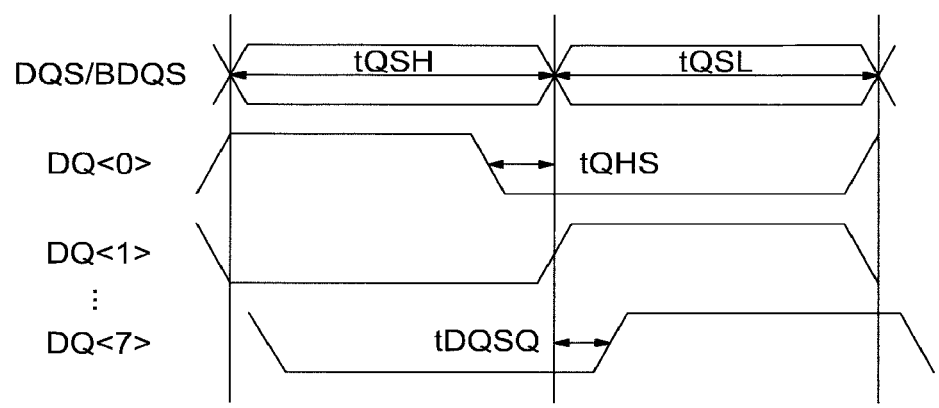
FIG. 9B is a conceptual diagram for explaining a calibration operation of a semiconductor storage device according to a comparative embodiment and a calibration operation of a semiconductor storage device according to an embodiment.

FIG. 9B shows a condition in which the duty ratio of the DQS/BDQS has been corrected. In this correction, the duty ratio of the DQS/BDQS is corrected by the same function as the detection circuit 225 and the second correction circuit 241 described above, and the duty ratio of tQSH/tQSL approaches 50%. Correcting the duty ratio of the DQS/BDQS also improves the duty ratio of the DQ<k>. However, only correcting the duty ratio of the DQS/BDQS does not improve the variation of the duty ratio of the DQ<k>. That is, even if the duty ratio of the DQ<1> is 50%, the duty ratios of DQ<0> and DQ<7> are not 50% due to the tQHS and the tDQSQ, respectively.

Figure 9C:
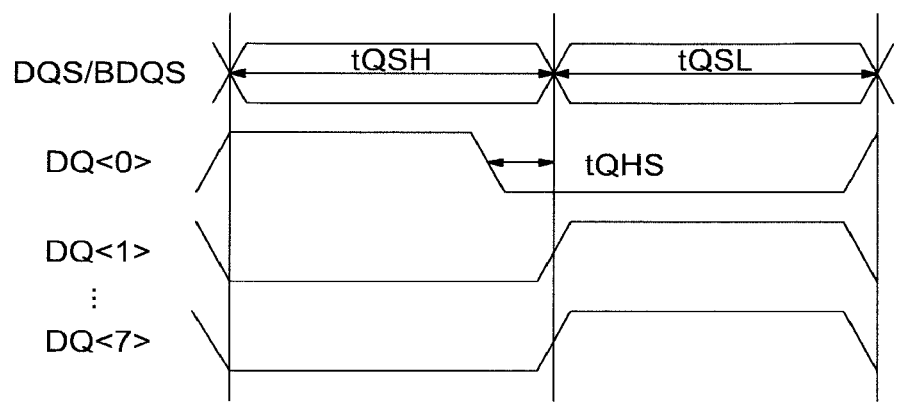
FIG. 9C is a conceptual diagram for explaining a calibration operation of a semiconductor storage device according to a comparative embodiment and a calibration operation of a semiconductor storage device according to an embodiment.
Figure 9D:
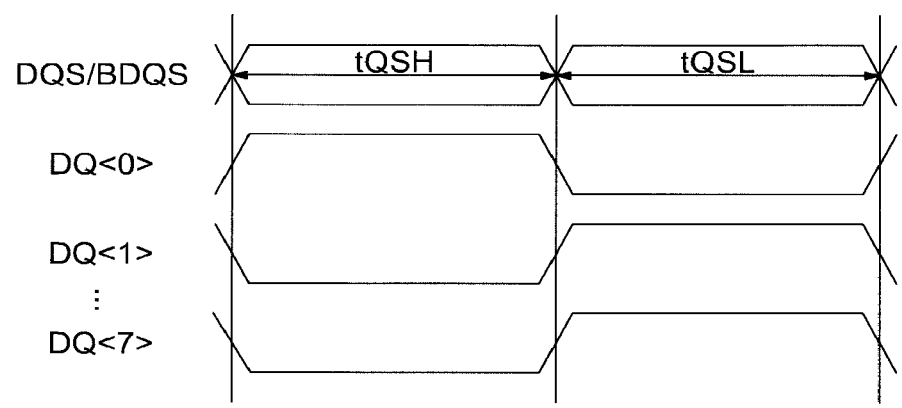
FIG. 9D is a conceptual diagram for explaining a calibration operation of a semiconductor storage device according to a comparative embodiment and a calibration operation of a semiconductor storage device according to an embodiment.

FIG. 9C shows a condition in which read training performed in accordance with issuance of commands in the read training mode has been performed. In the read training, adjustment of the read timing of the data signal (DQ) is performed. Specifically, in FIG. 9B, the shift of the tDQSQ occurs in the cycle of the DQ<7> with respect to the cycles of DQ<0> and DQ<1>, but the shift of the tDQSQ is corrected by the above-described read training. As a result, the timing at which the DQ<7> is changed and the timing at which the DQ<1> is changed are synchronized. However, since the duty ratio of the DQ<0> does not match the duty ratio of the DQS/BDQS, the timing of the change of the DQ<0> cannot be synchronized with the timing of the change of the DQS/BDQS (the deviation tQHS occurs between the DQ<0> and the DQ<1>) even if the duty ratio of the DQS/BDQS is corrected (FIG. 9B) and the read training (FIG. 9C) are performed as described above.

In the semiconductor storage device according to the comparative examples, the correcting process as shown in FIGS. 9A to 9C is performed. As a result, the variation in the duty ratio of the DQ<k> may not be improved. According to the semiconductor storage device of the present embodiment, it is possible to individually improve the variation of the duty ratio of the DQ<k>. Therefore, the timing of the change of the respective DQ<k> can be synchronized with the timing of the change of the DQS/BDQS (the state of FIG. 9D).

[Explanation of Calibration Operation]

Figure 10A:
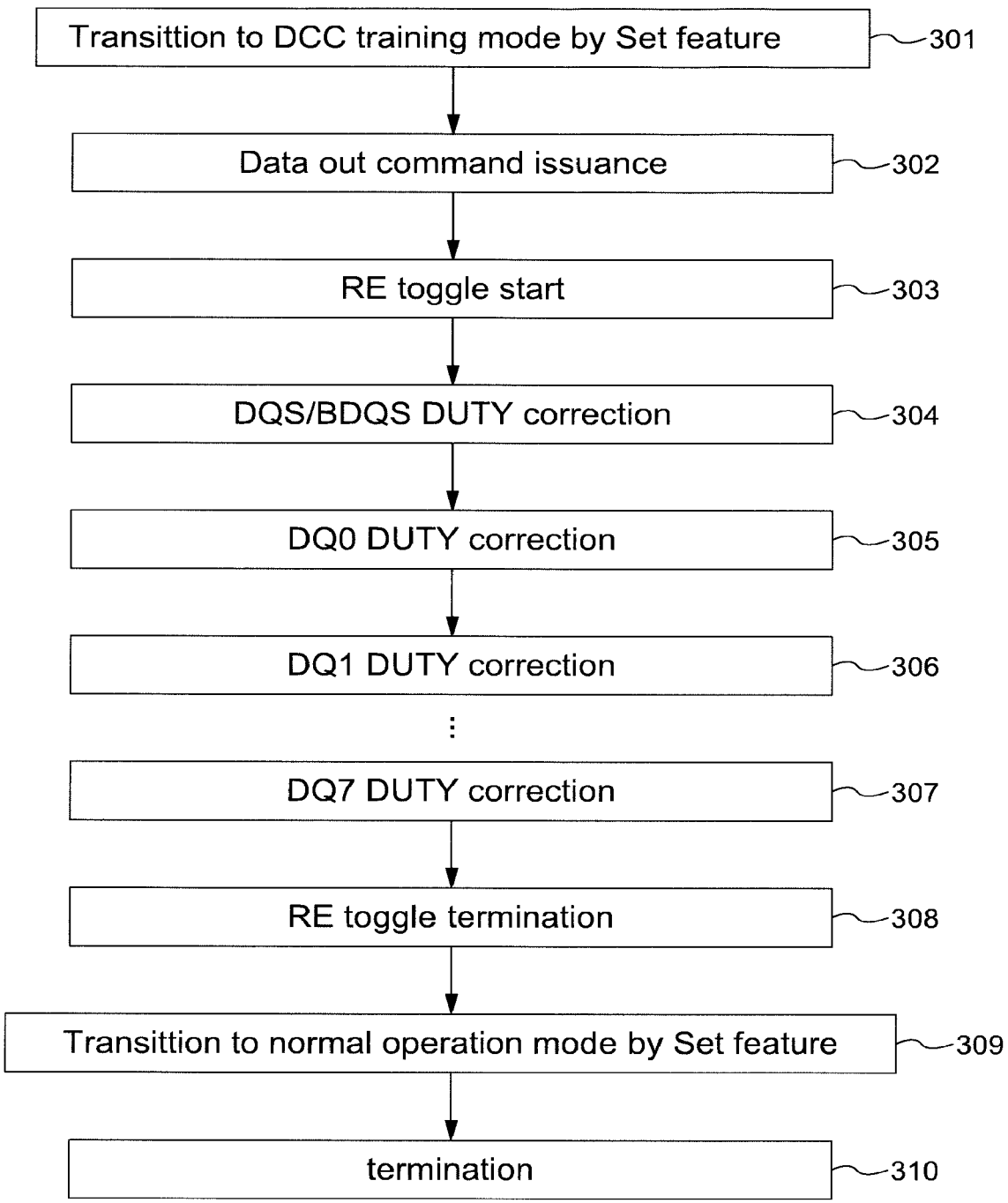
FIG. 10A is a flow chart for explaining a calibration operation of a semiconductor storage device according to an embodiment.
Figure 11:
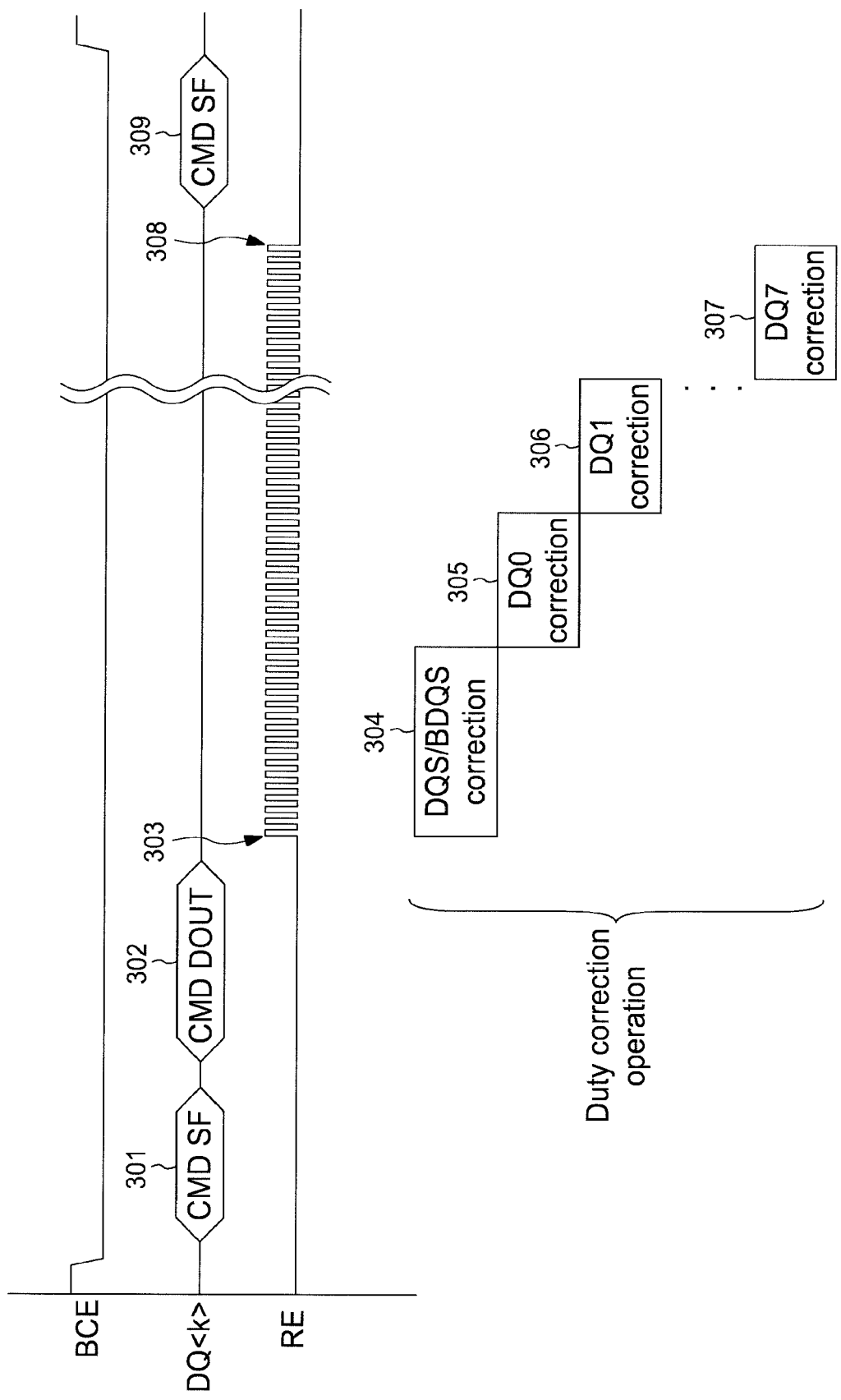
FIG. 11 is a timing chart for explaining a calibration operation of a semiconductor storage device according to an embodiment.

With reference to FIG. 10A and FIG. 11, the calibration operation of the first correction circuit 210 is described. FIG. 10A is a flowchart for explaining a calibration operation of the semiconductor storage device according to an embodiment. FIG. 11 is a timing chart for explaining a calibration operation of the semiconductor storage device according to the embodiment.

As shown in FIG. 10A, the semiconductor storage device 5, upon receiving a "Set feature" command (CMD SF) from the memory controller 2, shifts to the duty correction circuit (DCC) training mode (step 301). As illustrated in FIG. 11, the "Set feature" command is issued to the semiconductor storage device 5 which the BCE indicates the "L" level. Subsequently, a data out command (CMD DOUT) is issued from the memory controller 2 to the semiconductor storage device 5, whereby a duty correcting operation in the semiconductor storage device 5 is executed (step 302). In the case where the semiconductor storage device 5 operates the duty correction circuit training mode, the data-out command functions as a command for causing the semiconductor storage device 5 to initiate the generation of the toggles of the strobe signal (DQS/BDQS) (step 303). The toggle is generated based on the RE (output instruction signal) output from the memory controller 2. In the case where the semiconductor storage device 5 operates the duty correction circuit training mode, even if the data out command is issued from the memory controller 2 to the semiconductor storage device 5 and the RE (output instruction signal) output from the memory controller 2 starts toggling, data out from the semiconductor storage device 5 is not performed. Alternatively, the memory controller 2 determines that the data signals DQ<7:0> output from the semiconductor storage device 5 is a dummy data and ignores the data signals DQ<7:0>. That is, the above data out command is a dummy data out command. The following correction of the duty ratio is performed in a period corresponding to the data out for one page, for example, 16 k bits.

When the generation of the toggle of the strobe signal (DQS/BDQS) starts, the data signal DQ<k> is output from the pad 32<k>(first pad) to the memory controller 2, and the strobe signal (DQS/BDQS) is output from the pad 32_bdqs (second pad) to the memory controller 2, based on the timing of the toggle.

Next, the duty ratio of the DQS/BDQS is detected by the detection circuit 225 (FIG. 4), the correction of the duty ratio of the DQS/BDQS (second calibration operation) by the second correction circuit 241 (FIG. 4) is performed (step 304). When the correction of the duty ratio of the DQS/BDQS is terminated, corrections of the duty ratios of the data signals DQ<0> to DQ<7> (first calibration operation) is sequentially performed (steps 305 to 307). That is, the first calibration operation is performed for the data signal DQ<k> supplied to each of the plurality of first signal lines. Specifically, the duty ratios of each of the DQ<0> to DQ<7> are sequentially detected by the detection circuit 225, and the duty ratios of the DQ<0> to DQ<7> are sequentially corrected by the first correction circuits 210<0> to 210<7> (FIG. 4). When the correction of the duty ratio is terminated for all the DQ, the signal of RE stops and the toggle signal is terminated (step 308). By issuing the "Set feature" command (CMD SF), the DCC training mode is shifted to the normal operation mode (step 309), and the correction of the duty ratio is terminated (step 310).

In FIG. 10A, the corrections of the duty ratios of the data signals DQ<0> to DQ<7> is performed after the correction of the duty ratio of the DQS/BDQS, but the correction of the duty ratio of the DQS/BDQS may be performed after the corrections of the duty ratios of the data signals DQ<0> to DQ<7>.

Figure 10B:
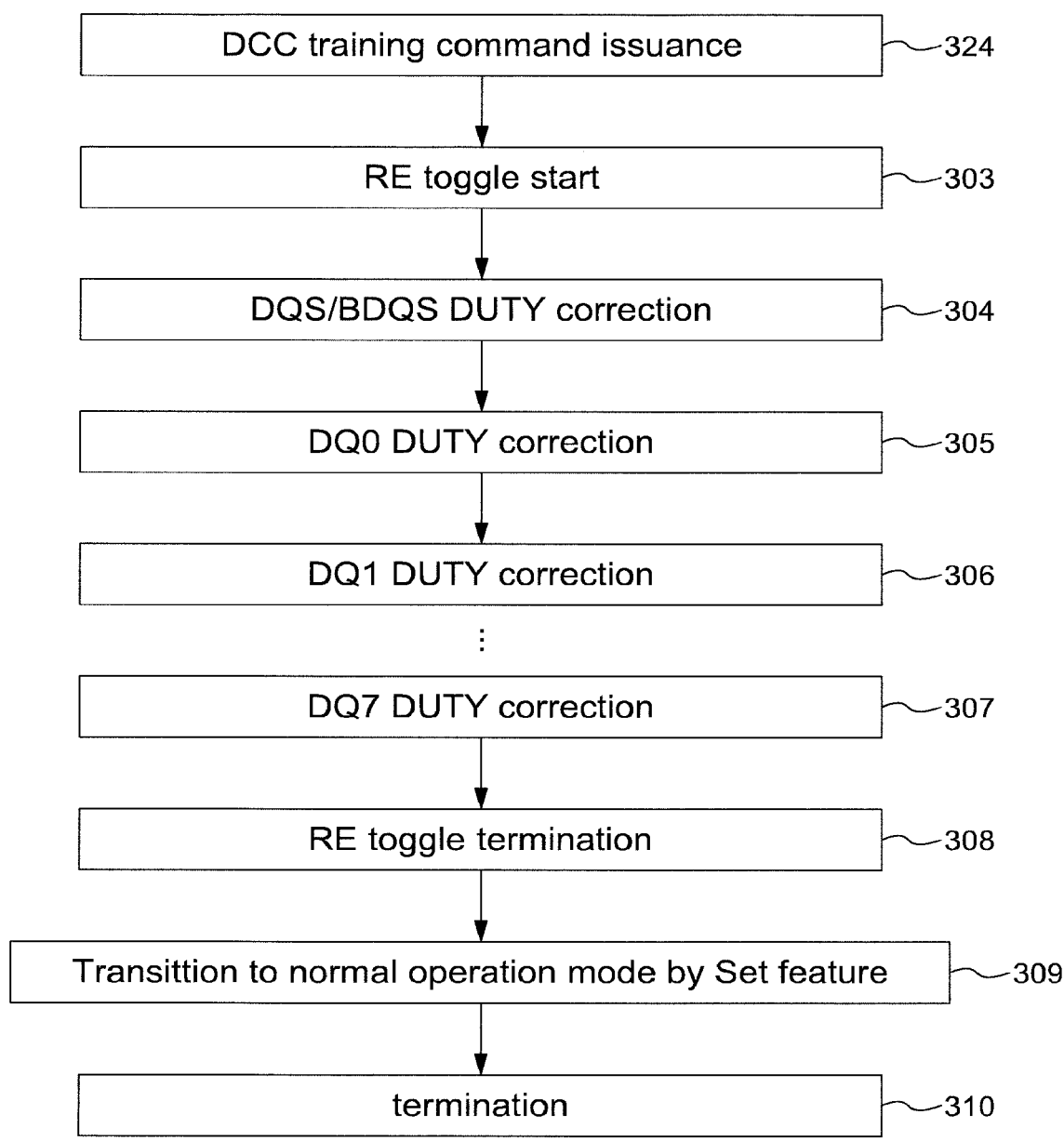
FIG. 10B is a flow chart for explaining a calibration operation of a semiconductor storage device according to an embodiment.

In FIG. 10A, the configuration in which the data out command is issued after shifting to the DCC training mode by the "Set feature" command is illustrated, but the present invention is not limited to this configuration. For example, as shown in FIG. 10B, the duty ratio may be corrected based on the issuance of a dedicated command for DCC training (step 324).

[Change in Signal Waveform Due to the Correction Operation of the First Correction Circuit 210]

Figure 12:
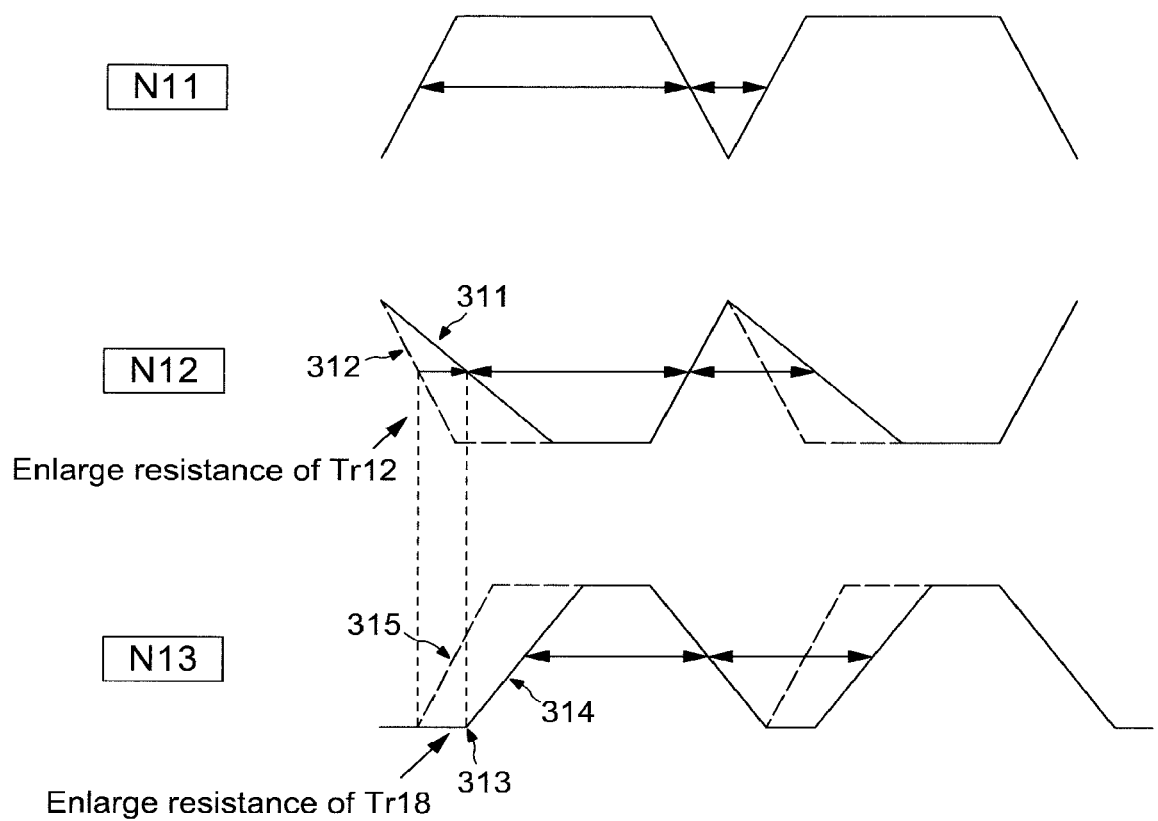
FIG. 12 is a diagram for explaining changes in signal waveforms caused by an operation of a first correction circuit of a semiconductor storage device according to an embodiment.

FIG. 12 is a diagram for explaining a change in a signal waveform caused by the operation of the first correction circuit of the semiconductor storage device according to an embodiment. The signal waveform of the nodes N11, N12, N13 in the first correction circuit 210<k> shown in FIG. 6, is shown in FIG. 12. In FIG. 12, an example in which a signal having a duty ratio greater than 50% is input is shown. In FIG. 12, the signal waveform when the resistance of the n-type transistor (Tr12) of the first stage and the resistance of the p-type transistor (Tr18) of the second stage is increased compared to an initial state is shown by a solid line. In FIG. 12, the signal waveforms with the lowest resistance (the initial state) of each transistor are shown as dotted lines.

When the resistance of the transistors Tr12, Tr14, Tr16, Tr18 in which the resistance is variable becomes larger than the initial state, the signals transmitted to the output-destination nodes through these transistors are delayed. Therefore, a slope of rise or fall of the signal waveform becomes gentler than the initial state (i.e., the angle for the horizontal direction is reduced). If the resistance value of the transistor Tr12 is greater than the initial state, a slope 311 of fall of the signal waveform output to the node N12 is gentle compared to a slope 312 of fall of the signal waveform of the node N12 in the initial state. As the slope 312 becomes gentle, a timing 313 at which the second-stage p-type transistor Tr17 is switched from the OFF state to the ON state is delayed from the initial state. Further, since the resistance value of the transistor Tr18 is larger than the initial value, a slope 314 of rising edge of the signal waveform output to the node N13 is gentler than a slope 315 of the rising edge of the signal waveform of the node N13 in the initial state. As a result of the change in the signal waveform as described above, the duty ratio of the signal waveform output to the node N13 is close to 50% compared to the nodes N11 and N12.

In the present embodiment, an example in which the sequencer 27 controls the operation of all the first correction circuit 210<k>, the sequencer 27 may control the operation of the first correction circuit of a part of the first correction circuit 210<k>.

Modification of the First Embodiment

Figure 33:
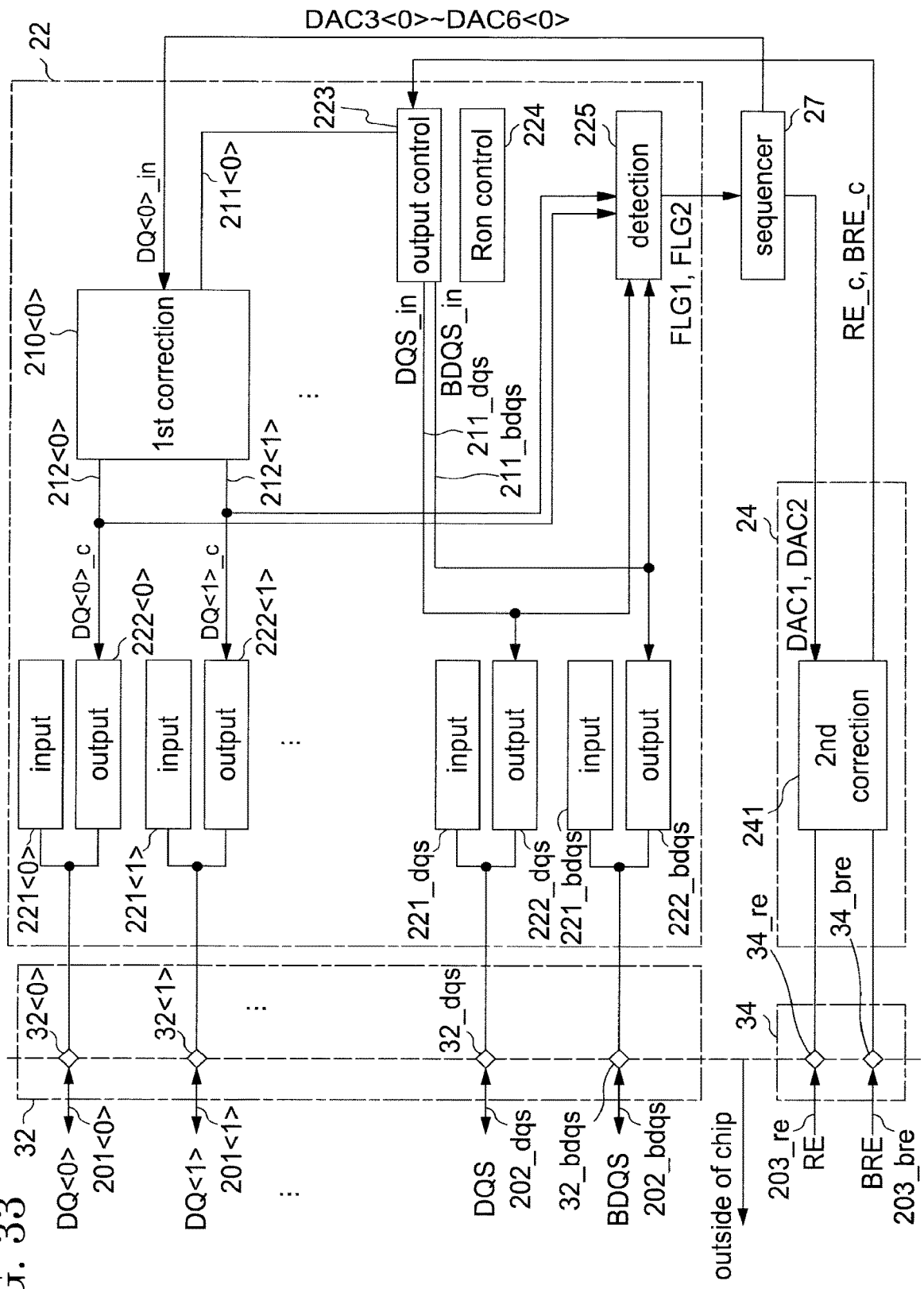
FIG. 33 is a block diagram for explaining a configuration of an input/output circuit and a logic control circuit of a semiconductor storage device according to an embodiment.
Figure 34:
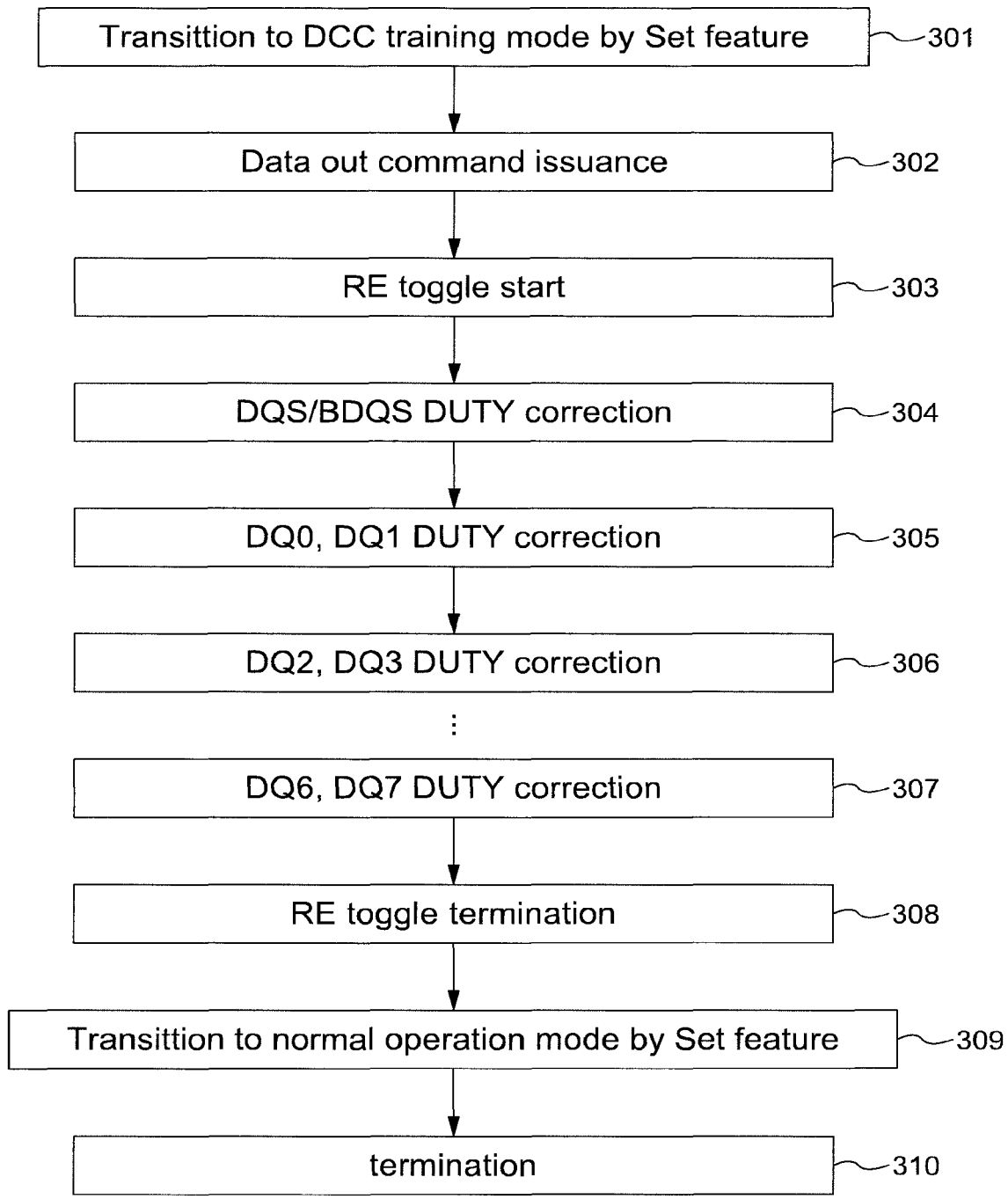
FIG. 34 is a flowchart for explaining a calibration operation of a semiconductor storage device according to an embodiment.
Figure 35:
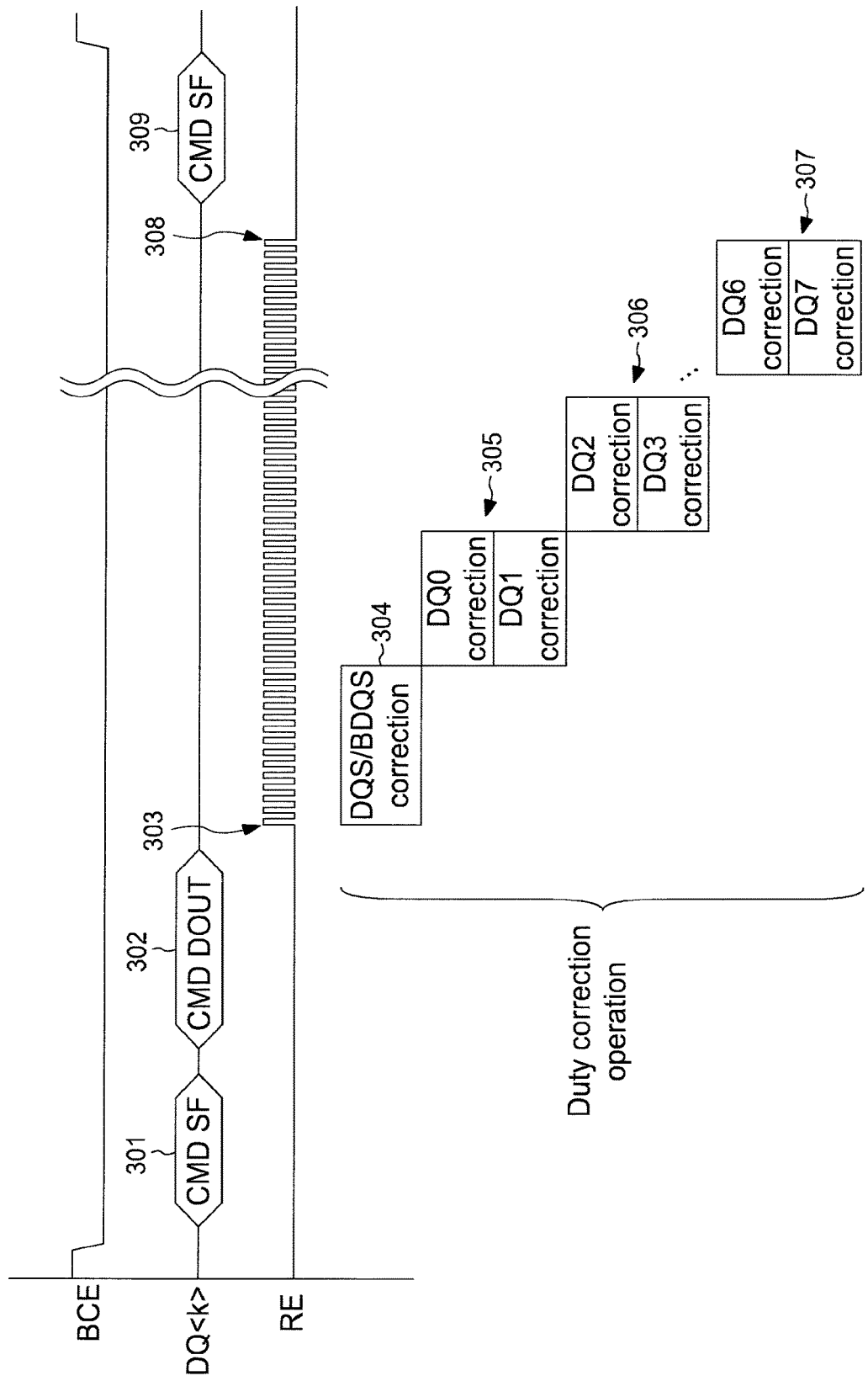
FIG. 35 is a timing chart for explaining a calibration operation of a semiconductor storage device according to an embodiment.

A modification of the first embodiment is described with reference to FIGS. 33 to 35. In the modification of the first embodiment, a first correction circuit 210<k'> is provided commonly for a part of the signal line(s) of the plurality of first signal lines (signal line 212<k'>, 212<k'+1>) (0≤k'≤6) in which the output control circuit 223 is connecting to the output circuit 222<k'>, 222<k'+1>. FIG. 33 is a block diagram for explaining a configuration of an input/output circuit and a logic control circuit of the semiconductor storage device according to the embodiment. FIG. 34 is a flowchart for explaining a calibration operation of a semiconductor storage device according to the embodiment. FIG. 35 is a timing chart for explaining the calibration operation of the semiconductor storage device according to an embodiment.

As shown in FIG. 33, the first correction circuit 210<k'> is provided commonly for the two first signal lines. Specifically, the first correction circuit 210<0> is provided commonly for the signal lines 211<0>, 211<1>. A first correction circuit 210<2> is connected commonly to signal lines 211<2> and 211<3>, a first correction circuit 210<4> is connected commonly to signal lines 211<4> and 211<5>, and a first correction circuit 210<6> is connected commonly to signal lines 211<6> and 211<7> (not illustrated).

As shown in FIG. 34 and FIG. 35, the corrections of the duty ratios of the data signals DQ<0> to DQ<7> (the first calibration operation) is performed for each of the two data signals. That is, the first calibration operation of the two data signals DQ<0>, DQ<1> is performed at the same timing (step S305). The first calibration operation of the data signals DQ<2> and DQ<3>, the first calibration operation of the data signals DQ<4> and DQ<5>, and the first calibration operation of the data signals DQ<6> and DQ<7> are also performed at the same timing as described above (step S306, S307).

Second Embodiment

Figure 13:
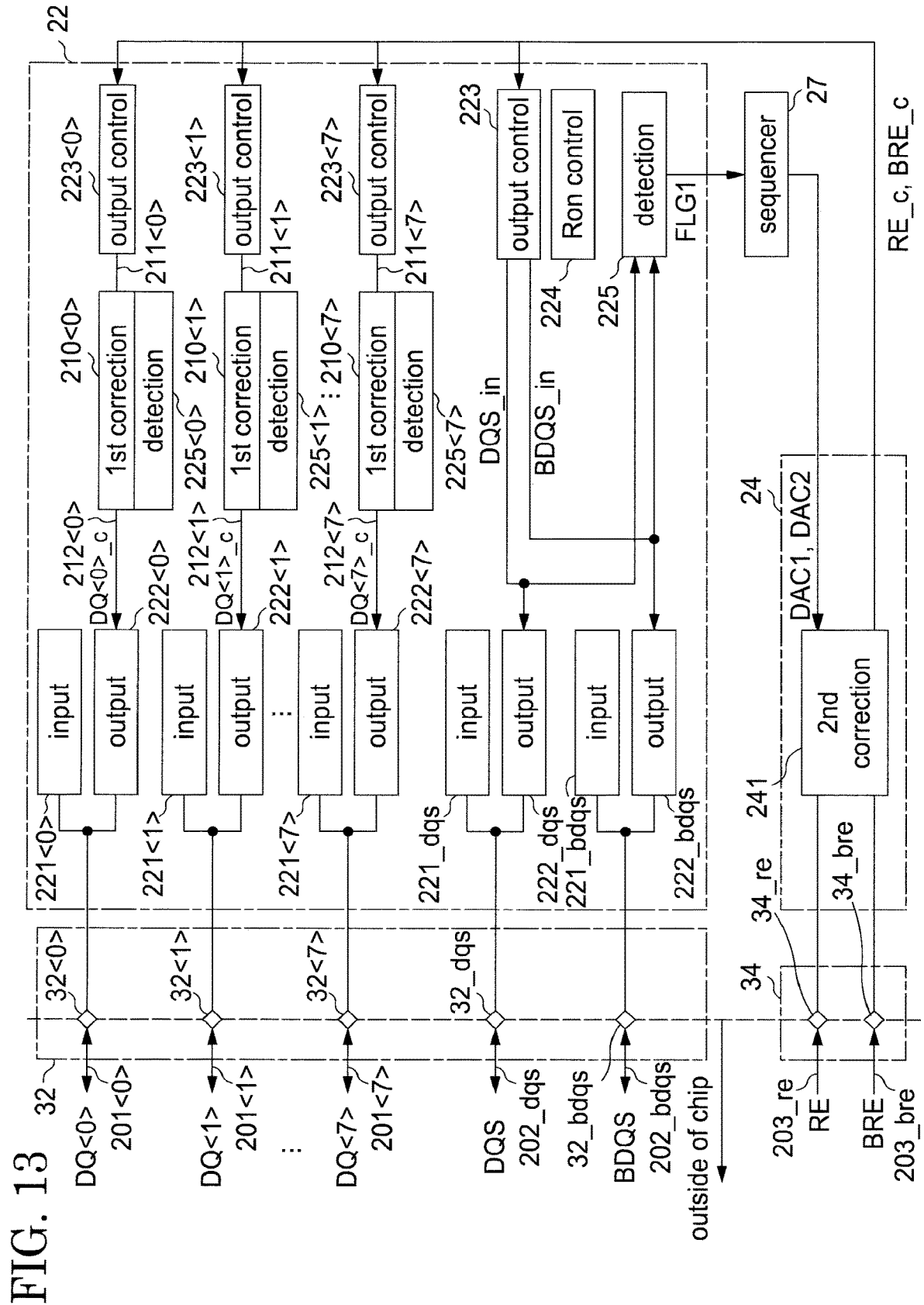
FIG. 13 is a block diagram for explaining a configuration of an input/output circuit and a logic control circuit of a semiconductor storage device according to an embodiment.

In the second embodiment, an input/output circuit 22 having a configuration similar to that of the input/output circuit 22 in the first embodiment is described. FIG. 13 is a block diagram for explaining a configuration of an input/output circuit and a logic control circuit of a semiconductor storage device according to an embodiment. In FIG. 13, in that an output control circuit 223<k> and a detection circuit 225<k> are individually provided for an output circuit 222<k> that output each data signal DQ<k> is different from the configuration of FIG. 4 according to the first embodiment. In the following description, descriptions of the same features as those of the configuration of FIG. 4 are omitted, and mainly differences from the configuration of FIG. 4 are described.

As shown in FIG. 13, similarly to a first correction circuit 210<k>, a plurality of the output control circuit 223<k> and a plurality of the detection circuit 225<k> are provided and are provided individually for each of first signal lines (signal lines 211<k> and 212<k>). The output control circuit 223<k> generates a data signal DQ<k>_in and sends the data signal DQ<k>_in to the first correction circuit 210<k>. The detection circuit 225<k> is connected to the corresponding (the value of k is the same) first correction circuit 210<k>. The detection circuit 225<k> monitors an output (a data signal DQ<k>_c) from the first correction circuit 210<k> to detect a duty ratio of the DQ<k>_c. The first correction circuit 210<k> corrects the duty ratio of the DQ<k>_c detected by the detection circuit 225<k> to an appropriate duty ratio.

In the present embodiment, since the output control circuit 223<k> and the detection circuit 225<k> are individually provided for each of the first signal lines, for example, the output control circuits 223<0> to 223<7>, the detection circuits 225<0> to 225<7>, and the first correction circuits 210<0> to 210<7> can operate at the same timing, respectively. An operation of these circuits is controlled by a sequencer 27. In FIG. 13, although the configuration in which the output control circuit 223<k> is provided for each of the first correction circuits 210<k> has been exemplified, similarly to FIG. 4, one output control circuit 223 may send the data signal DQ<k>_in to each of the first correction circuits 210<k>.

[Explanation of Calibration Operation]

Figure 14:
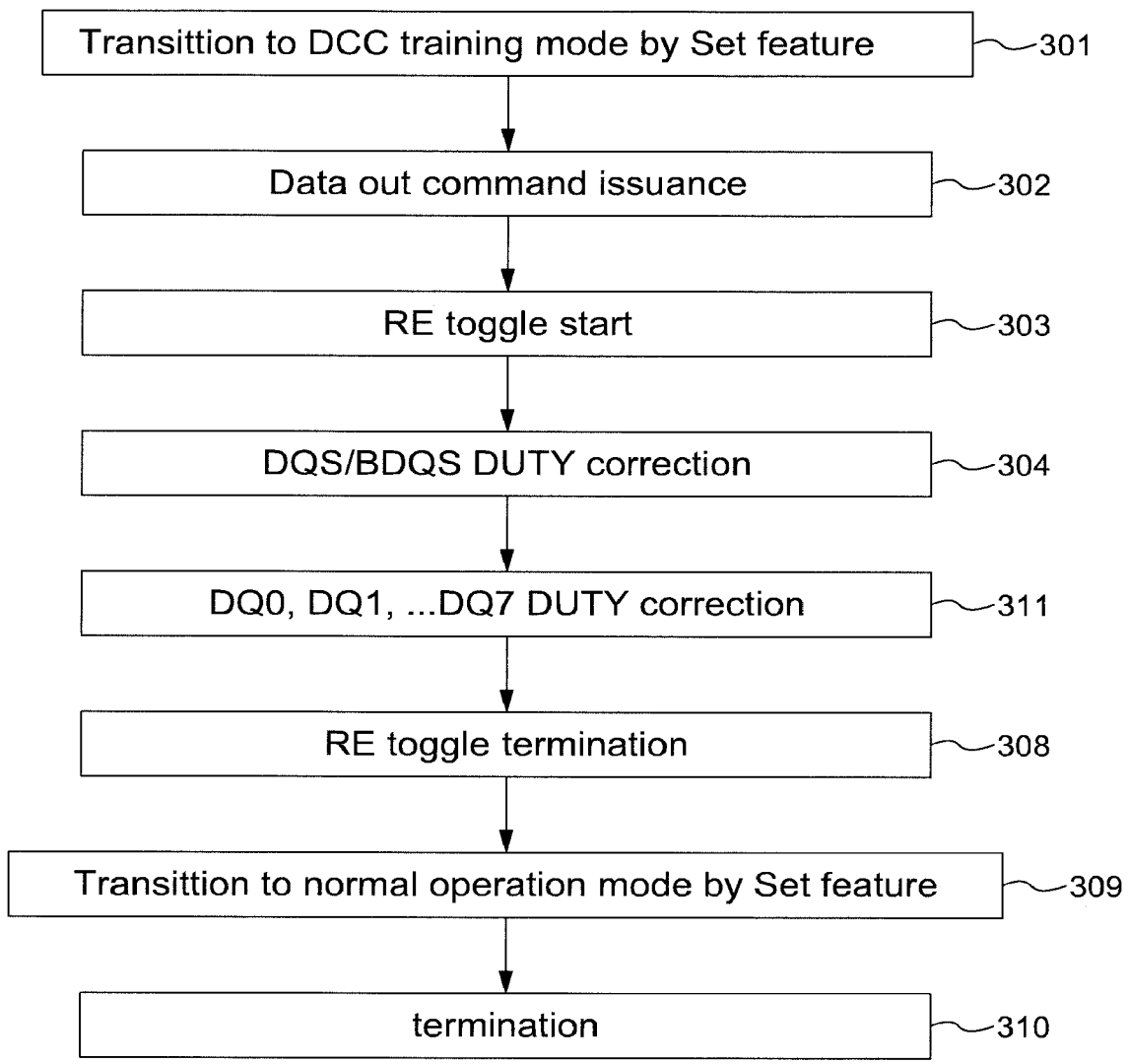
FIG. 14 is a flow chart for explaining a calibration operation of a semiconductor storage device according to an embodiment.

FIG. 14 is a flowchart for explaining a calibration operation of the semiconductor storage device according to the embodiment. The flowchart shown in FIG. 14 is similar to the flowchart shown in FIG. 10A, but differs from the flowchart shown in FIG. 10A in that corrections (first calibration operations) of the duty ratios of the data signals DQ<0> to DQ<7> are performed at the same timing (step 311). Here, the first calibration operations for the data signals DQ<0> to DQ<7> may be performed all the calibration operations at the same time, and may be at least a part of the calibration operations may be performed at the same time. In other words, the sequencer 27 controls the first calibration operations for the plurality of first signal lines (211<k> and 212<k>), so that at least some of the operations are executed at the same time.

Although FIG. 14 exemplifies a configuration in which a data out command is issued after shifting to the DCC training mode by the "Set feature" command, a duty ratio may be corrected based on the issuance of a dedicated command for the DCC training (step 324), as shown in FIG. 10B.

Third Embodiment

Figure 15:
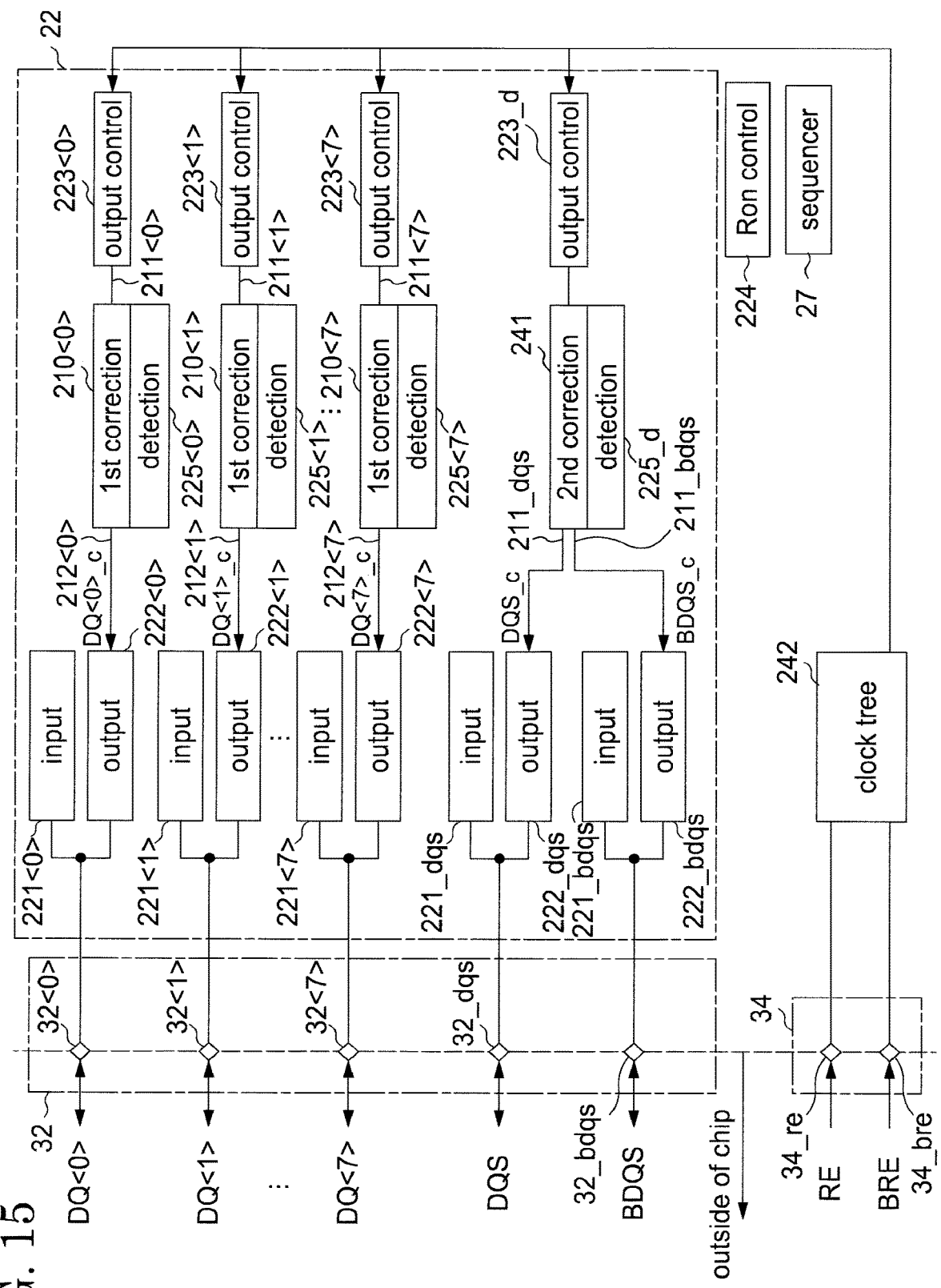
FIG. 15 is a block diagram for explaining a configuration of an input/output circuit and a logic control circuit of a semiconductor storage device according to an embodiment.

In the third embodiment, an input/output circuit 22 having a configuration similar to that of the input/output circuit 22 in the second embodiment is described. FIG. 15 is a block diagram for explaining a configuration of an input/output circuit and a logic control circuit of the semiconductor storage device according to the embodiment. The configuration of FIG. 15 differs from the configuration of FIG. 13 in the following points. In the configuration of FIG. 15, an output control circuit 223_d, a second correction circuit 241, and a detection circuit 225_d are provided for output circuits 222_dqs and 222_bdqs. The output circuits 222_dqs and 222_bdqs output the strobe signal (DQS/BDQS) independently of the output circuit 222<k>. In the following description, descriptions of the same features as those of the configuration of FIG. 13 are omitted, and points mainly different from those of the configuration of FIG. 13 are described.

As shown in FIG. 15, an output control circuit 223<k>, a first correction circuit 210<k>, and a detection circuit 225<k> (a first detection circuit) are provided for a first signal line (signal lines 211<k> and 212<k>). An outputs control circuit 223_d, a second correction circuit 241, and a detection circuit 225_d (a second detecting circuit) are provided for the second signal lines (signal lines 211_dqs and 211_bdqs), and are not connected to the first signal lines. The output control circuits 223_d and 223<k> are connected to a clock tree 242. Third pads (pads 34_re and 34_bre) are connected to the clock tree 242. The clock tree 242 supplies a clock signal based on the output instruction signals (RE and BRE) input to the third pads to the output control circuits 223_d and 223<k>.

The output control circuit 223_d generates a strobe signal (DQS_in/BDQS_in) and sends the strobe signal to the second correction circuit 241. The detection circuit 225_d detects the duty ratio of the DQS/BDQS by monitoring the output from the second correction circuit 241. The second correction circuit 241 corrects the duty ratio of the DQS/BDQS detected by the detection circuit 225_d to an appropriate duty ratio. The second correction circuit 241 sends signals DQS_c and BDQS_c in which the duty ratio has corrected to output circuits 222_dqs and 222_bdqs, respectively.

In the present embodiment, the output control circuit 223_d, the second correction circuit 241, and the detection circuit 225_d are provided independently of the output control circuit 223<k>, the first correction circuit 210<k>, and the detection circuit 225<k>. For example, the output control circuits 223_d, and 223<0> to 223<7>, the detection circuits 225_d and 225<0> to 225<7>, the first correction circuits 210<0> to 210<7>, and the second correction circuit 241 can operate at the same timing. These operations are controlled by the sequencer 27.

Figure 16:
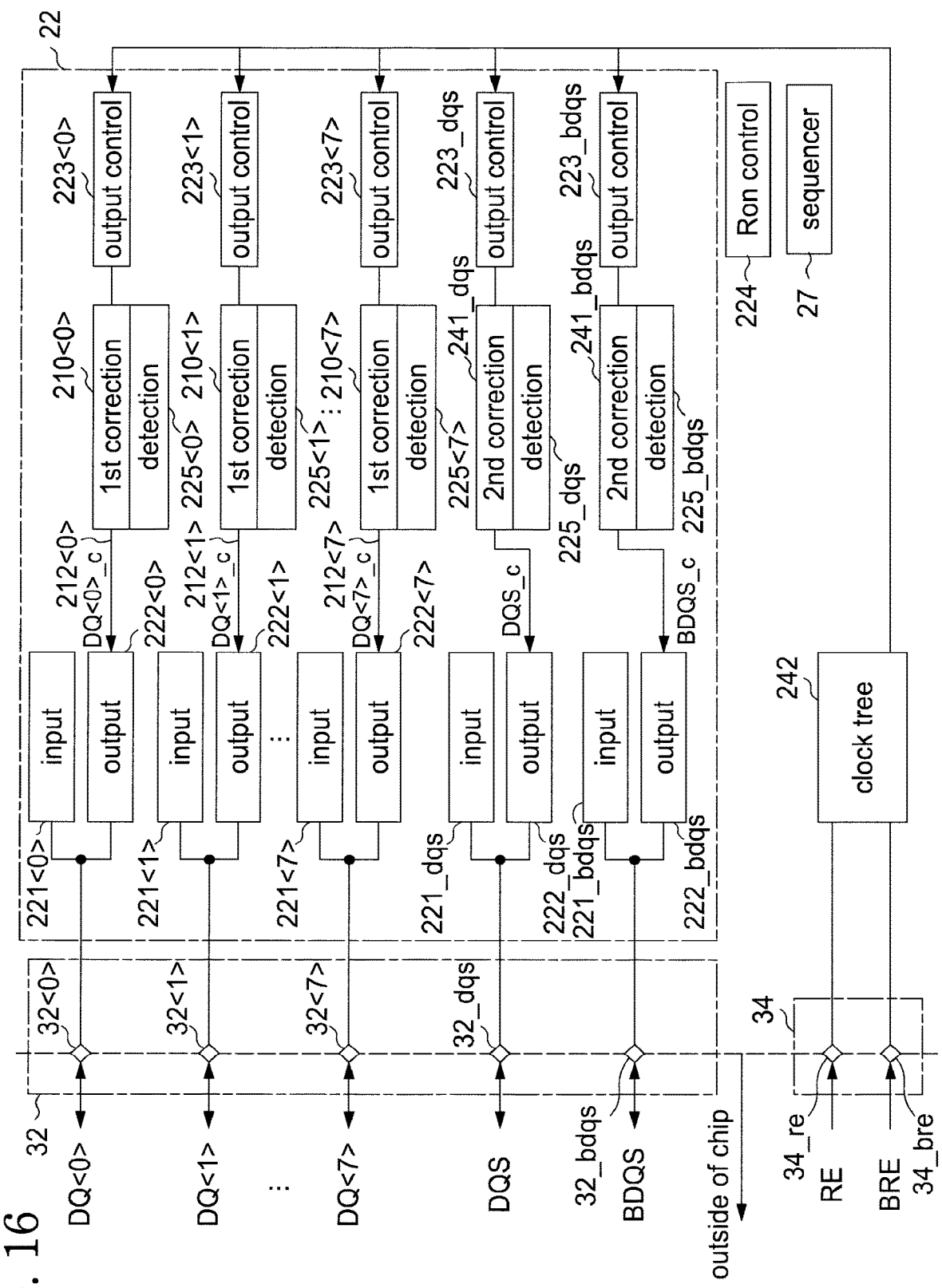
FIG. 16 is a block diagram for explaining a configuration of an input/output circuit and a logic control circuit of a semiconductor storage device according to an embodiment.

In FIG. 15, the outputs control circuit 223_d, the second correction circuit 241, and the detection circuit 225_d are commonly provided for the signals DQS and BDQS. However, as shown in FIG. 16, output control circuits 223_dqs, 223_bdqs, second correction circuits 241_dqs, 241_bdqs, and detecting circuits 225_dqs, 225_bdqs may be provided for the signals DQS and BDQS, respectively.

[Explanation of Calibration Operation]

Figure 17:
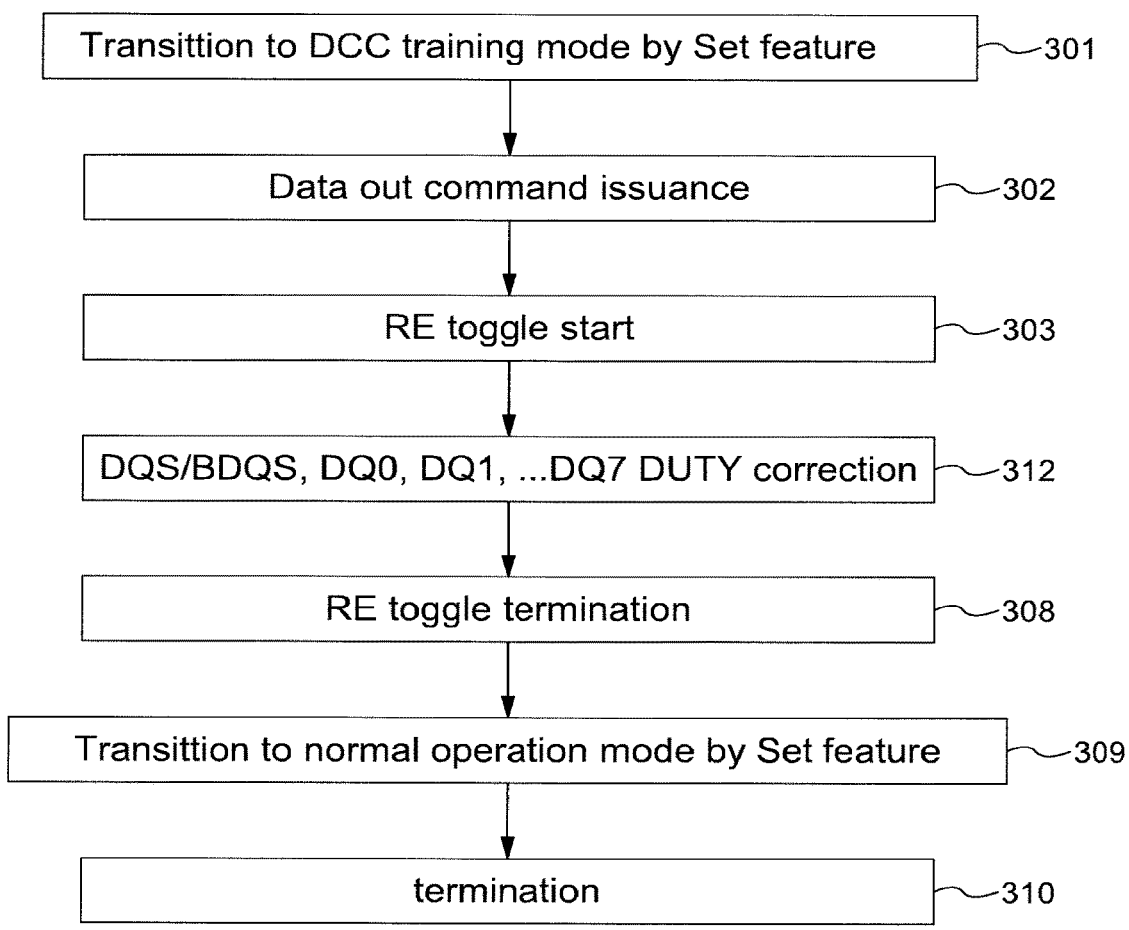
FIG. 17 is a flow chart for explaining a calibration operation of a semiconductor storage device according to an embodiment.

FIG. 17 is a flowchart for explaining a calibration operation of the semiconductor storage device according to the embodiment. In the flowchart shown in FIG. 17, correction (second calibration operation) of the duty ratio of the DQS/BDQS and corrections (first calibration operation) of the duty ratios of the data signals DQ<0> to DQ<7> are performed at the same timing (step 312). In the first calibration operation and the second calibration operation for the strobe signal (DQS/BDQS) and the data signals DQ<0> to DQ<7>, all the calibration operations may be performed simultaneously, at least a part of calibration operations may be performed simultaneously.

Although FIG. 17 exemplifies a configuration in which a data out command is issued after shifting to the DCC training mode by the "Set feature" command, a duty ratio may be corrected based on the issuance of a dedicated command for the DCC training (step 324), as shown in FIG. 10B.

Fourth Embodiment

Figure 18:
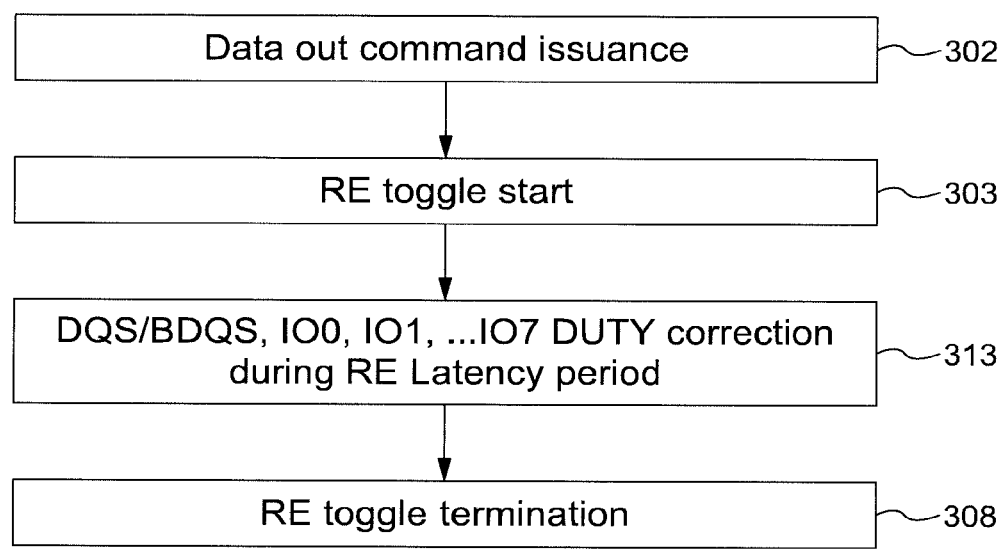
FIG. 18 is a flow chart for explaining a calibration operation of a semiconductor storage device according to an embodiment.
Figure 19:
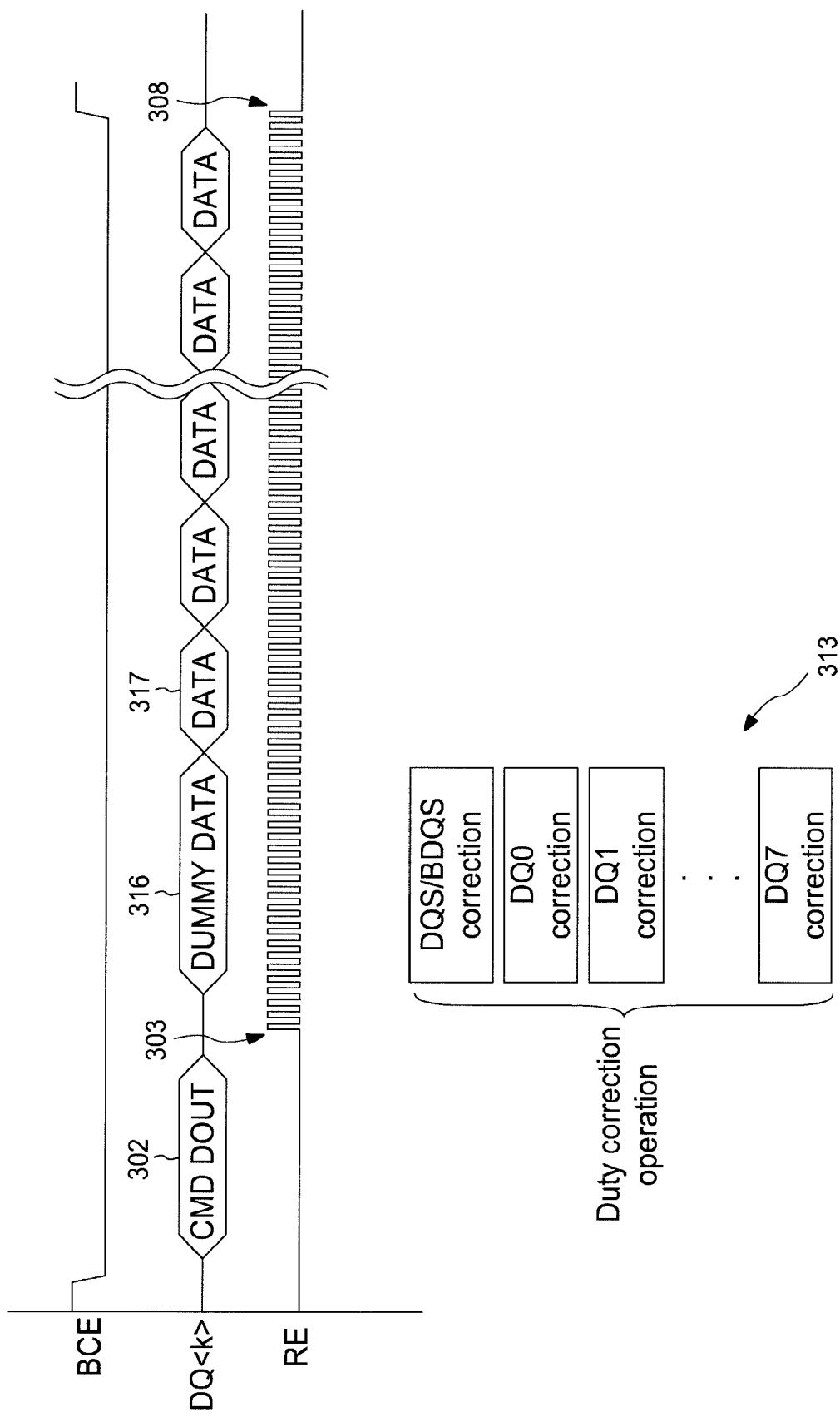
FIG. 19 is a timing chart for explaining a calibration operation of a semiconductor storage device according to an embodiment.

In the fourth embodiment, a calibration operation similar to that of the third embodiment is described. FIG. 18 is a flowchart for explaining a calibration operation of the semiconductor storage device according to the embodiment. FIG. 19 is a timing chart for explaining a calibration operation of the semiconductor storage device according to the embodiment. The flowchart shown in FIG. 18 is similar to the flowchart shown in FIG. 17, but differs from the flowchart of FIG. 17 according to the third embodiment in that a period of correction of a duty ratio of a DQS/BDQS (a second calibration operation) and a period of corrections of a duty ratios of a DQ<0> to DQ<7> (a first calibration operation) are provided in a period after issuance of a command of data out and before data output, without issuing a command for shifting to the DCC training mode.

As shown in FIG. 18, when the memory controller 2 issues a data out command (CMD DOUT) to the semiconductor storage device 5, the duty correcting operation in the semiconductor storage device 5 is executed (step 302). The calibration operation in this embodiment does not require a command to transition to the DCC training mode in step 301 of FIG. 17 before issuing the data out command. That is, the calibration operation is performed based on the data out command for starting the operation for outputting data by the semiconductor storage devices 5 to 8.

A generation of a toggle of a strobe signal (DQS/BDQS) is started by the data out command (step 303). When the generation of toggle is started, the semiconductor storage device 5 outputs a dummy data output 316 prior to outputting a data output 317. The period of the dummy data output 316 is referred to as a RE Latency period. During the latency period, a correction of the duty ratio of the DQS/BDQS (second calibration operation) and corrections of the duty ratios of the data signals DQ<0> to DQ<7> (first calibration operation) are performed. In other words, for example, the second correction circuit 241 and the first correction circuit 210<k> shown in FIG. 16 perform the first calibration operation and the second calibration operation between issuing the data out command and outputting the data signal corresponding to the command. In the first calibration operation for the strobe signal (DQS/BDQS) and the second calibration operation for the data signals DQ<0> to DQ<7>, all the calibration operations may be performed simultaneously, at least a part of the calibration operations may be performed simultaneously.

Fifth Embodiment

Figure 20:
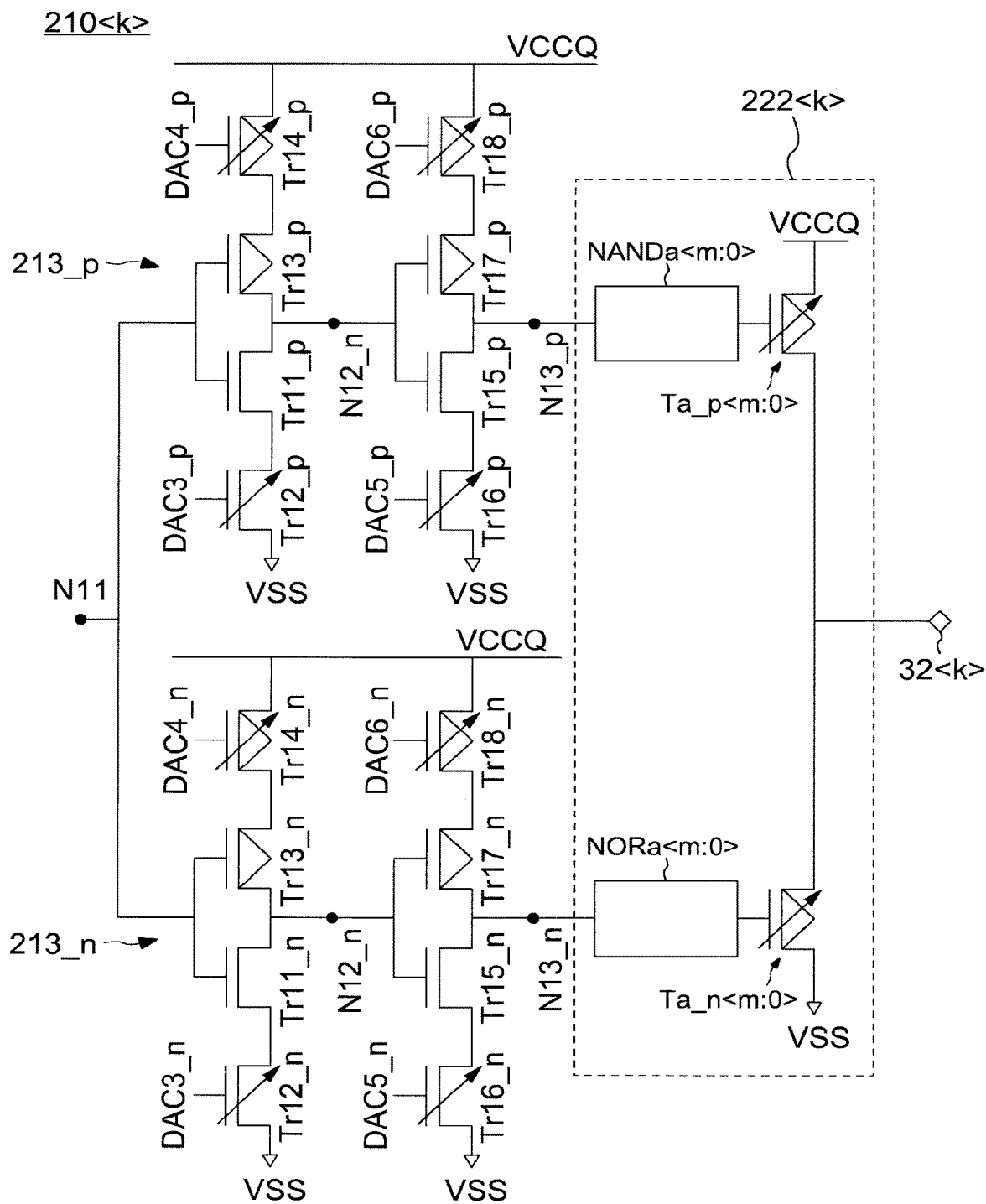
FIG. 20 is a block diagram for explaining a configuration of a data signal correction circuit of a semiconductor storage device according to an embodiment.

In the fifth embodiment, a first correction circuit similar to the first embodiment is described. FIG. 20 is a block diagram for explaining a configuration of a data signal correction circuit of the semiconductor storage device according to the embodiment. The first correction circuit 210<k> of FIG. 20 is similar to the first correction circuit 210<k> of FIG. 6 according to the first embodiment, but both are different in the following points. In FIG. 6, the transistors Tr11 to Tr18 are provided commonly to the transistors Ta_p<m:0> and Ta_n<m:0> of the output circuit 222<k>. On the other hand, in FIG. 20, transistors Tr11_p to Tr18_p or transistors Tr11_n to Tr18_n are individually provided for each of the transistors Ta_p<m:0> and Ta_n<m:0>.

As shown in FIG. 20, the first correction circuit 210<k> includes a delay adjustment circuit 213_n (a first delay adjustment circuit) and a delay adjustment circuit 213_p (a second delay adjustment circuit). The delay adjustment circuit 213_n is connected to the transistor Ta_n<m:0>. The delay adjustment circuit 213_p is connected to the transistor Ta_p<m:0>. An input of the delay adjustment circuit 213_p is connected to a node N11, and an output of the delay adjustment circuit 213_p is connected to a logic circuit NANDa<m:0>. An input of the delay adjustment circuit 213_n is connected to the node N11, and an output of the delay adjustment circuit 213_n is connected to a logic circuit NORa<m:0>. The logic circuit NANDa<m:0>, the logic circuit NORa<m:0>, the transistor Ta_p<m:0>, and the transistor Ta_n<m:0> shown in FIG. 20 are the same circuit configurations as the output circuit 222<k> shown in FIG. 8. The transistor Ta_p<m:0> and the transistor Ta_n<m:0> is a p-type transistor and a n-type transistor adjustable the output impedance to be output to the pad 32<k>.

The delay adjustment circuit 213_p has the transistors Tr11_p to Tr18_p. Configurations of the transistors Tr11_p to Tr18_p are the same as those of the transistors Tr11 to Tr18 shown in FIG. 6, and therefore detailed descriptions thereof are omitted. Resistance magnitudes of transistors Tr12_p, Tr14_p, Tr16_p, and Tr18_p are controlled by control signals DAC3_p to DAC6_p sent from the sequencer 27 (see FIG. 4). The delay adjusting circuit 213_n has the transistors Tr11_n to Tr18_n. Since configurations of the transistors Tr11_n to Tr18_n are the same as the configurations of the transistors Tr11 to Tr18 shown in FIG. 6, detailed descriptions thereof are omitted. Resistance magnitudes of the transistors Tr12_n, Tr14_n, Tr16_n, and Tr18_n are controlled by control signals DAC3_n to DAC6_n sent from the sequencer 27 (see FIG. 4). As described above, the delay adjustment circuit 213_n (first delay adjustment circuit) and the delay adjustment circuit 213_p (second delay adjustment circuit) can individually adjust the delay.

The delay adjustment circuit 213_p delays the signal input to the node N11 by the same operation as the first correction circuit 210<k> shown in FIG. 6, and outputs the delayed signal to a node N13_p. The delay of the signal output to the node N13_p can be adjusted by the control signals DAC3_p to DAC6_p. The delay adjustment circuit 213_n delays the signal input to the node N11 and outputs the delayed signal to a node N13_n. The delay of the signal output to the node N13_n can be adjusted by the control signals DAC3_n to DAC6_n.

A timing of controlling the transistor Ta_p<m:0> and the transistor Ta_n<m:0> is adjusted by the delay adjustment circuit 213_p and the delay adjustment circuit 213_n. As a result, rising and falling timings of the signal DQ<k> can be individually adjusted, so that the duty ratio of the DQ<k> output to the pad 32 can be corrected.

Sixth Embodiment

Figure 21:
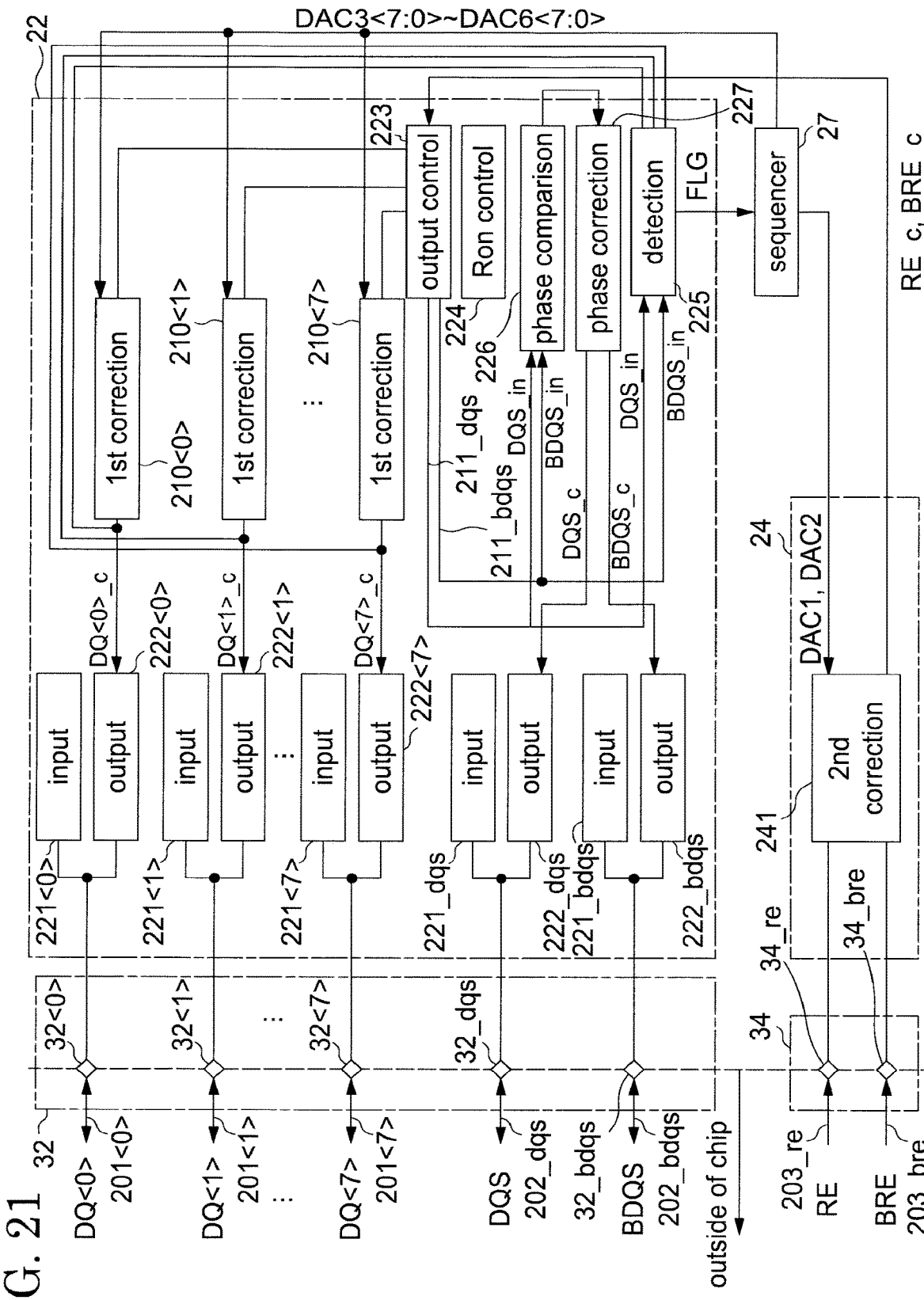
FIG. 21 is a block diagram for explaining a configuration of an input/output circuit and a logic control circuit of a semiconductor storage device according to an embodiment.

In the sixth embodiment, an input/output circuit 22 having a configuration similar to that of the input/output circuit 22 in the first embodiment is described. FIG. 21 is a block diagram for explaining a configuration of an input/output circuit and a logic control circuit of the semiconductor storage device according to the embodiment. A configuration shown in FIG. 21 is different from the configuration shown in FIG. 4 according to the first embodiment in that an input/output circuit 22 includes a phase comparison circuit 226 and a phase correction circuit 227. The phase comparison circuit 226 is a circuit for comparing phases of a signal DQS_in and a signal BDQS_in constituting a strobe signal (DQS_in/BDQS_in). The phase correction circuit 227 is a circuit for correcting the deviation of the phases. In the following description, descriptions of the same features as those of the configuration of FIG. 4 are omitted, and mainly differences from the configuration of FIG. 4 are described.

As shown in FIG. 21, the phase comparison circuit 226 is connected to an output control circuit 223. The phase comparison circuit 226 receives each of the signal DQS_in and the signal BDQS_in sent from the output control circuit 223 and compares the phases between the signal DQS_in and the signal BDQS_in to determine the deviation between them. The phase correction circuit 227 is connected to the phase comparison circuit 226 and output circuits 222_dqs and 222_bdqs. The phase correction circuit 227 can correct the signal DQS_in and the signal BDQS_in based on the result determined by the phase comparison circuit 226. Signals DQS_c and BDQS_c corrected by the phase correction circuit 227 are sent to the output circuits 222_dqs and 222_bdqs, respectively. The operations of the phase comparison circuit 226 and the phase correction circuit 227 are controlled by the sequencer 27.

Figure 22A:
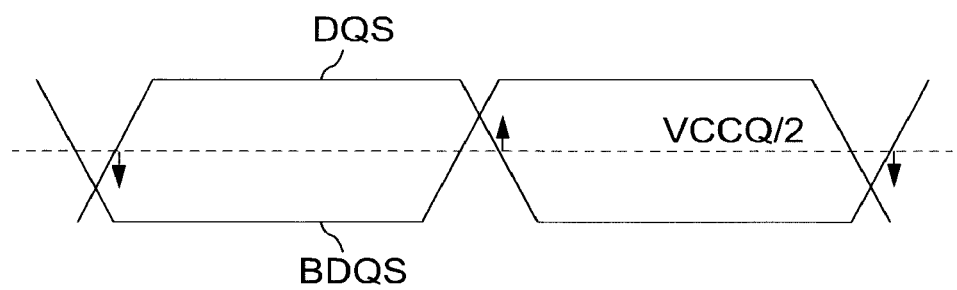
FIG. 22A is a conceptual diagram for explaining a phase correction of a semiconductor storage device according to an embodiment.
Figure 22B:
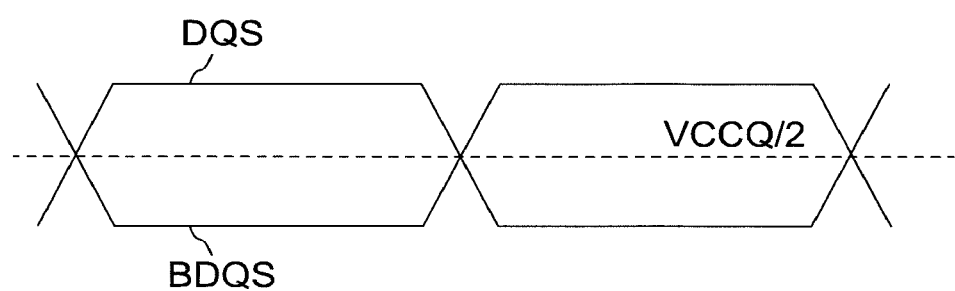
FIG. 22B is a conceptual diagram for explaining a phase correction of a semiconductor storage device according to an embodiment.

FIGS. 22A and 22B are conceptual diagrams for explaining a phase correction of the semiconductor storage device according to the embodiment. As shown in FIG. 22A, when the phase of the signal DQS and the phase of the signal BDQS is shifted, variations occur in the voltage (Vox) where the signal DQS and the signal BDQS intersect. Ideally, the cross-voltage Vox is a half value (VCCQ/2) of each voltage value of the "L" level and the "H" level of the signal DQS and the signal BDQS. If there is a variation in the cross-voltage Vox, not only the deterioration of the duty ratio of the DQS/BDQS, it adversely affects the calibration operation of the duty ratio. In the present embodiment, when the Vox is deviated from the VCCQ/2 as shown in FIG. 22A, the cross-voltage Vox can be adjusted to be the VCCQ/2 as shown in FIG. 22B by delaying the signal DQS or the signal BDQS.

[Explanation of Calibration Operation]

Figure 23:
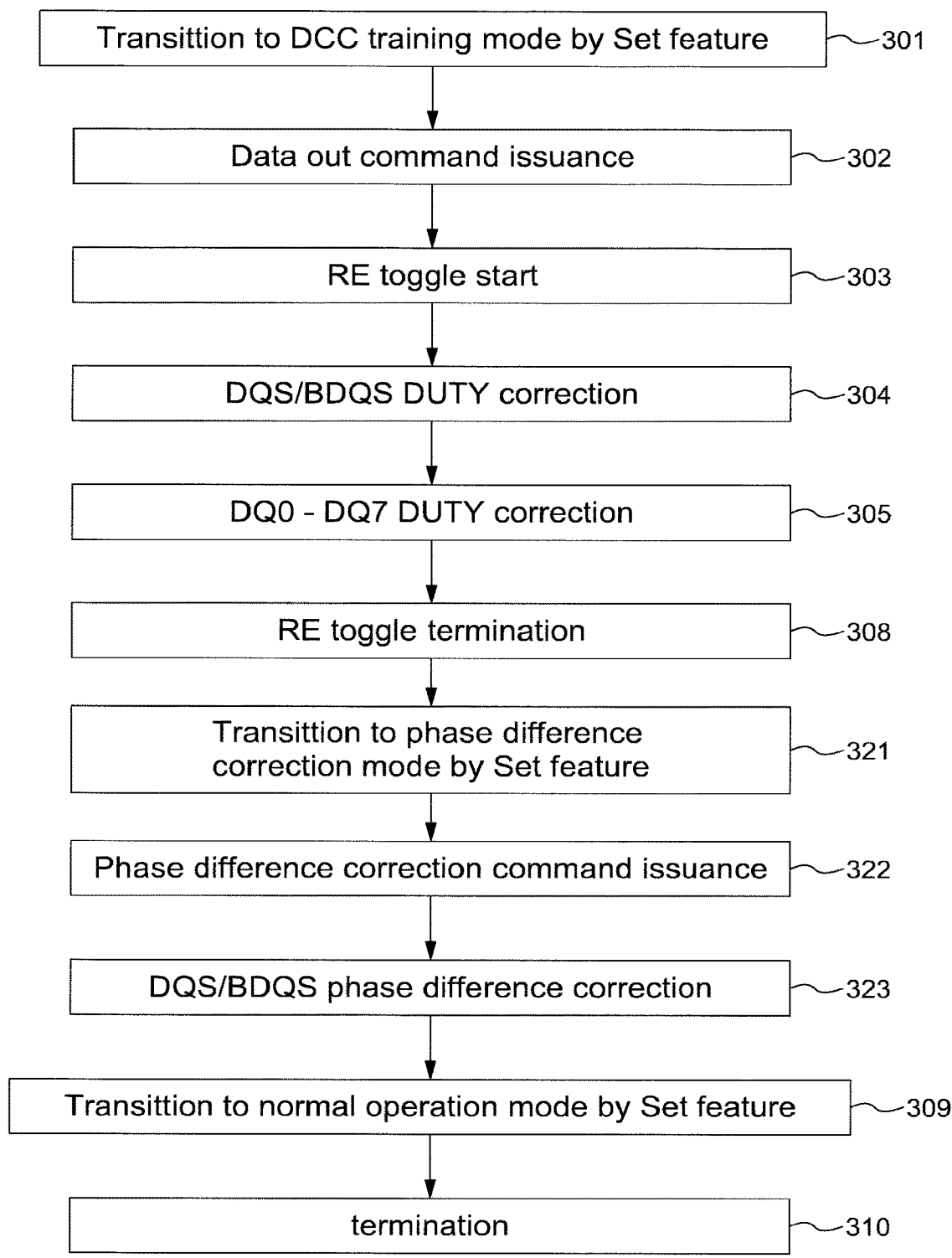
FIG. 23 is a flowchart for explaining a calibration operation and a phase correction operation of a semiconductor storage device according to an embodiment.

FIG. 23 is a flowchart for explaining a calibration operation and a phase correction operation of the semiconductor storage device according to the embodiment. The flowchart of FIG. 23 is similar to the flowchart of FIG. 10A according to the first embodiment, but differs in that the phase difference comparison and the phase correction of the DQS and the BDQS are performed between the termination of the toggle signal (step 308) and the transition to the normal operation mode (step 309).

In the flow chart of FIG. 23, after the toggle signal is terminated in step 308, the semiconductor storage device 5 receives the "Set feature" command from the memory controller 2 and the operation mode is shifted to a phase difference correction mode (step 321). The memory controller 2 issues the phase difference correction command to the semiconductor storage device 5 (step 322). Using the phase difference correction command as a trigger, the phase comparison circuit 226 compares the phase of the signal DQS_in and the signal BDQS_in, and the phase correction circuit 227 corrects the deviation of the phase based on the comparison result of the phase comparison circuit 226 (step 323). When the correction of the phase shift between the signal DQS_in and the signal BDQS_in is completed, the operation mode is shifted to the normal operation mode (step 309).

[Configuration of the Phase Comparison Circuit and the Phase Correction Circuit]

Figure 24:
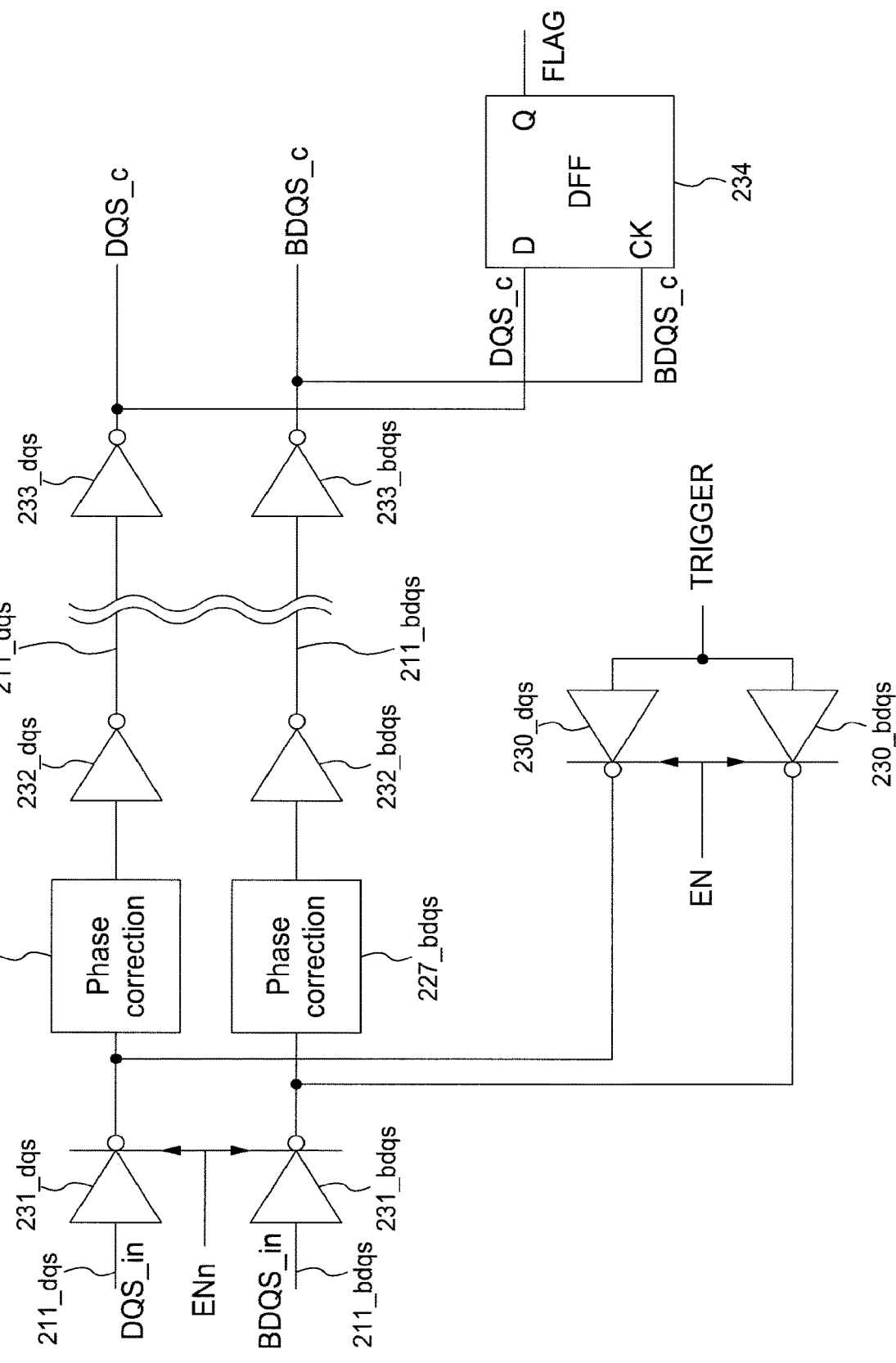
FIG. 24 is a block diagram for explaining a configuration of a phase comparison circuit of a semiconductor storage device according to an embodiment.

FIG. 24 is a block diagram for explaining a configuration of a phase comparison circuit of the semiconductor storage device according to the embodiment. As shown in FIG. 24, the phase comparison circuit 226 includes a first clocked inverter 230 (230_dqs, 230_bdqs), a second clocked inverter 231 (231_dqs, 231_bdqs), an inverter 232 (232_dqs, 232_bdqs), an inverter 233 (233_dqs, 233_bdqs), and a D flip-flop (DFF) 234. The phase correction circuits 227 (227_dqs, 227_bdqs) are incorporated in the phase comparison circuit 226 and are connected to output terminals of the first clocked inverter 230 and the second clocked inverter 231, respectively.

A trigger signal (TRIGGER) is input to the first clocked inverter 230. The trigger signal is generated based on the phase difference correction command. The second signal line (signal line 211_dqs, 211_bdqs) is connected to the second clock invertor 231, and the signals DQS_in and BDQS_in are entered. In other words, it can be said that the phase comparison circuit 226 and the phase correction circuits 227 are connected to the second signal line. The first clocked inverter 230 and the second clocked inverter 231 are controlled by control signals EN/ENn inverted to each other. That is, when the first clocked inverter 230 operates, the second clocked inverter 231 does not operate, and when the first clocked inverter 230 does not operate, the second clocked inverter 231 operates.

When the trigger signal is input to the first clocked inverter 230 in an effective state by the control of the control signal EN, the signal output by the first clocked inverter 230_dqs is output from the inverter 233_dqs instead of the signal DQS_c, and the signal output by the first clocked inverter 230_bdqs is output from the inverter 233_bdqs instead of the signal BDQS_c. The outputs from the inverters 233_dqs and 233_bdqs are input to inputs D and CK of the DFF 234, respectively. The DFF 234 outputs the value of the input D when the input CK is displaced from the "L" level to the "H" level to an output Q as a FLAG signal.

In other words, the phase comparison circuit 226 inputs a signal (an output signal of the first clocked inverter 230) based on one trigger signal (TRIGGER) to the DFF 234 via the two second signal lines (signal lines 211_dqs, 211_bdqs). Then, the phase correction circuit 227 corrects the phase of at least one of the signals DQS_in and BDQS_in based on the flag (FLAG signal) output by the DFF 234.

Figure 25:
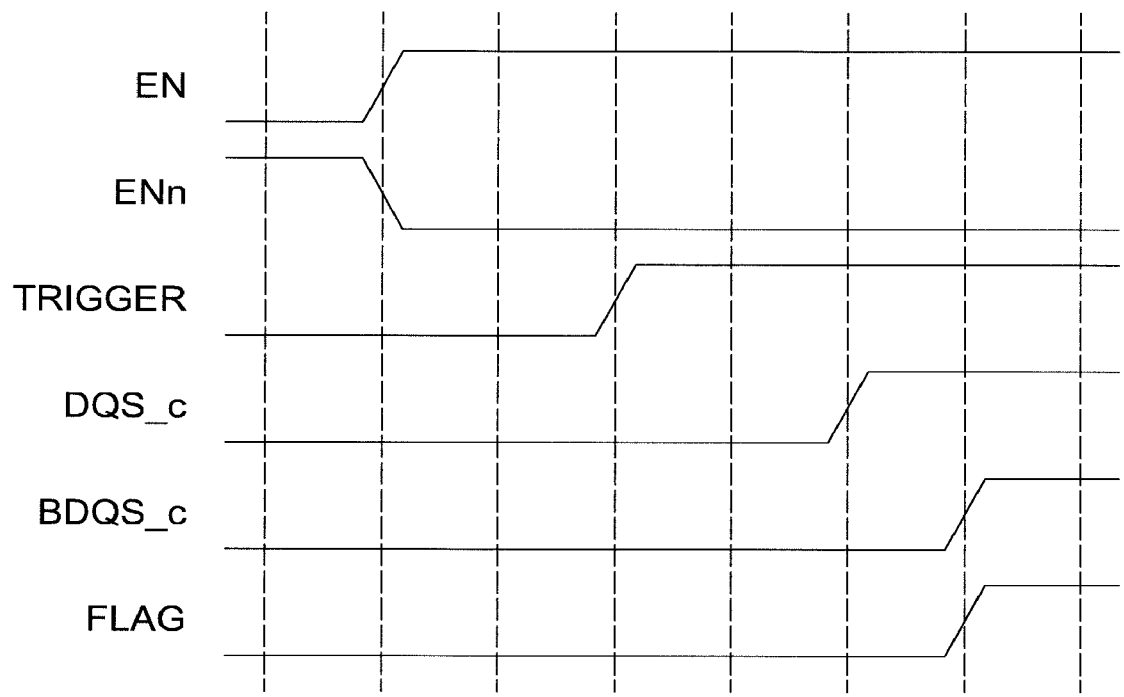
FIG. 25 is a timing chart for explaining an operation of a phase comparison circuit of a semiconductor storage device according to an embodiment.
Figure 26:
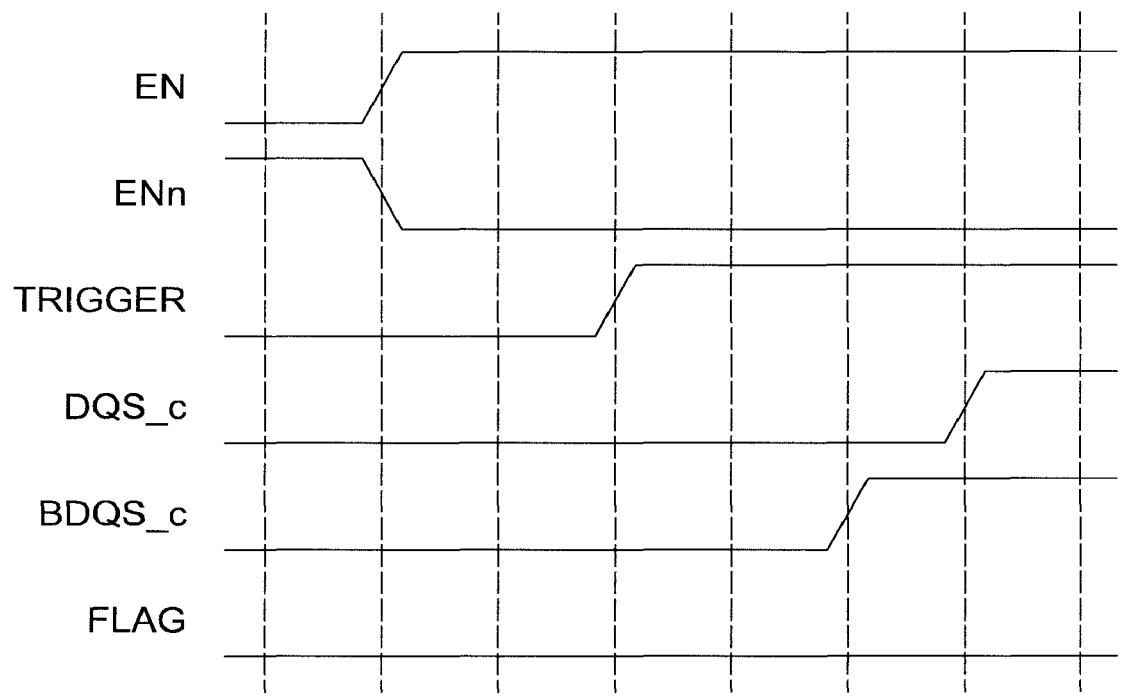
FIG. 26 is a timing chart for explaining an operation of a phase comparison circuit of a semiconductor storage device according to an embodiment.

FIG. 25 and FIG. 26 are timing charts for explaining an operation of a phase comparison circuit of the semiconductor storage device according to the embodiment. FIG. 25 is a timing chart in the case where the signal BDQS_c is delayed with respect to the signal DQS_c. FIG. 26 is a timing chart in the case where the signal DQS_c is delayed with respect to the signal BDQS_c. With reference to FIGS. 25 and 26, the operation of the phase comparison circuit 226 of FIG. 24 is described.

When the phase difference correction command is issued, the control signal EN is changed from the "L" level to the "H" level, and the control signal ENn is changed from the "H" level to the "L" level. That is, the first clocked inverter 230 is in the valid state, and the second clocked inverter 231 is in the invalid state. Next, the trigger signal is changed from the "L" level to the "H" level. The trigger signal is input to the DFF 234 via the first clocked inverter 230, the phase correction circuit 227, and the inverters 232, 233.

As shown in FIG. 25, when the signal BDQS_c is delayed with respect to the signal DQS_c, and the signal BDQS_c input to the input CK is changed from the "L" level to the "H" level, the signal DQS_c input to the input D is the "H" level, so that FLAG signal is changed from the "L" level to the "H" level.

As shown in FIG. 26, when the signal DQS_c is delayed with respect to the signal BDQS_c, and the signal BDQS_c input to the input CK is changed from the "L" level to the "H" level, the signal DQS_c input to the input D is the "L" level, so that FLAG signal remains the "L" level without being displaced.

In other words, if the FLAG signal output from the output Q of the DFF 234 of the phase comparator circuit 226 is the "H" level, it is determined that the signal BDQS_c is delayed with respect to the signal DQS_c. Conversely, when the FLAG signal is the "L" level, it is determined that the signal DQS_c is delayed with respect to the signal BDQS_c. According to the determination result of the phase comparison circuit 226, the phase correction circuit 227 delays the signal DQS_in or the signal BDQS_in to correct the phase shift between them.

Figure 27:
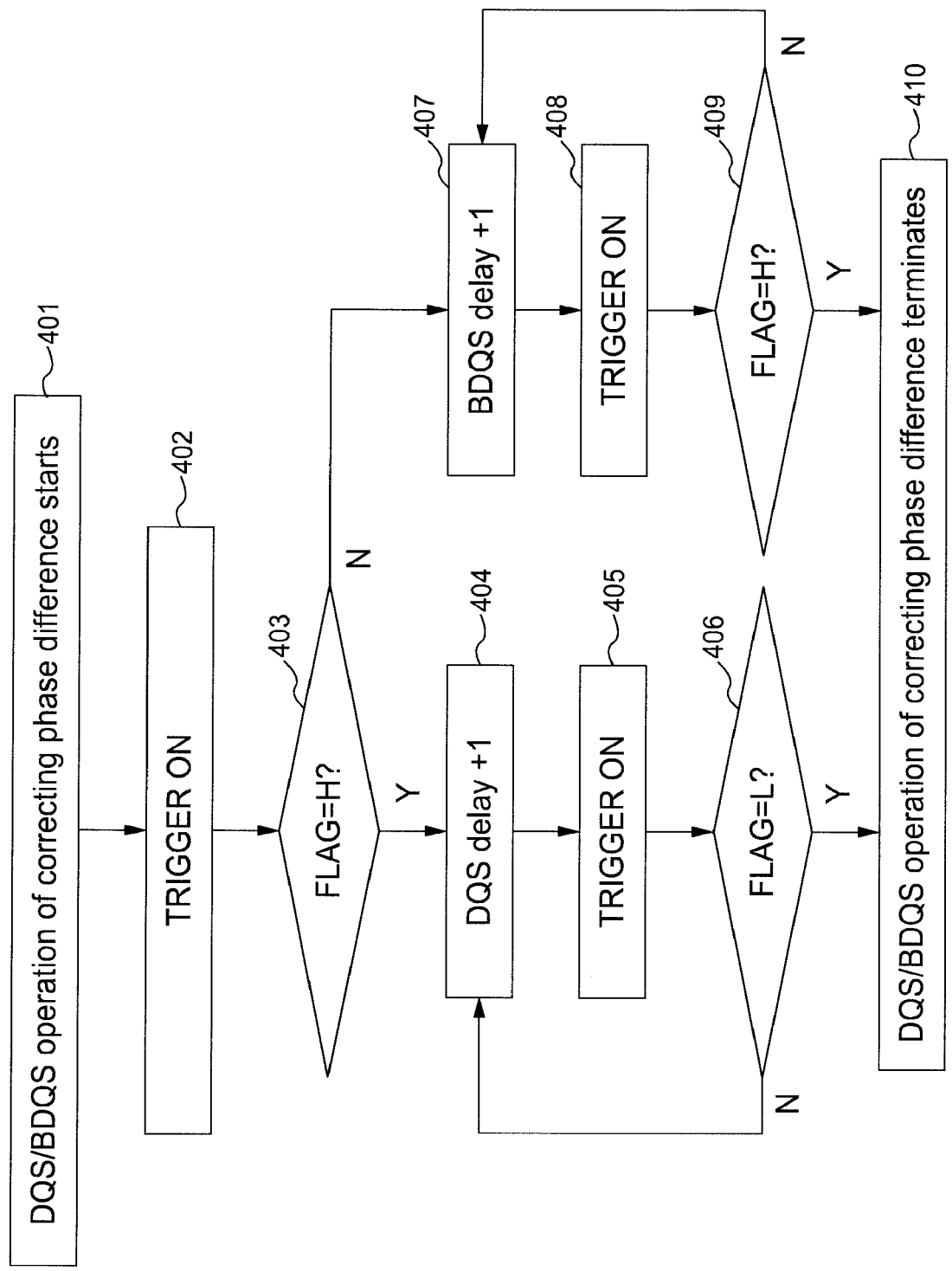
FIG. 27 is a flowchart for explaining an operation of a phase comparison circuit of a semiconductor storage device according to an embodiment.

FIG. 27 is a flowchart for explaining an operation of a phase comparison circuit of the semiconductor storage device according to the embodiment. First, based on the issuance of the phase difference correction command, the operation of correcting the phase difference between the signal DQS and the signal BDQS starts (step 401). Subsequently, the trigger signal is turned on (the "L" level→"H" level) (step 402). Next, the FLAG signal based on the trigger signal is determined (step 403). As a result of this determination, if the FLAG signal is the "H" level ("Y" in step 403), the phase correcting circuit 227_dqs is operated to delay the signal DQS_c (DQS delay+1) (step 404). Next, when the trigger signal is turned on again (step 405), determination of the FLAG signal based on the trigger signal is performed again (step 406). In this determination, if the FLAG signal is "L" level ("Y" in step 406), the operation of the phase difference correction is terminated (step 410). On the other hand, if the FLAG signal is the "H" level ("N" in step 406), the process returns to the step 404 and delays the DQS_c signal.

In the determination of the step 403 above, if the FLAG signal is the "L" level ("N" in step 403), a phase correction circuit 227_bdqs is operated and the BDQS_c is delayed (BDQS delay+1) (step 407). Next, when the trigger signal is turned on again (step 408), determination of the FLAG signal based on the trigger signal is performed again (step 409). In this determination, if the FLAG signal is "H" level ("Y" in step 409), the operation of the phase difference correction is terminated (step 410). On the other hand, if the FLAG signal is the "L" level ("N" in step 409), the process returns to the step 407 and delays the BDQS_c.

By the above operation, it is possible to correct the phase shift between the signal DQS_in and the signal BDQS_in.

Figure 28:
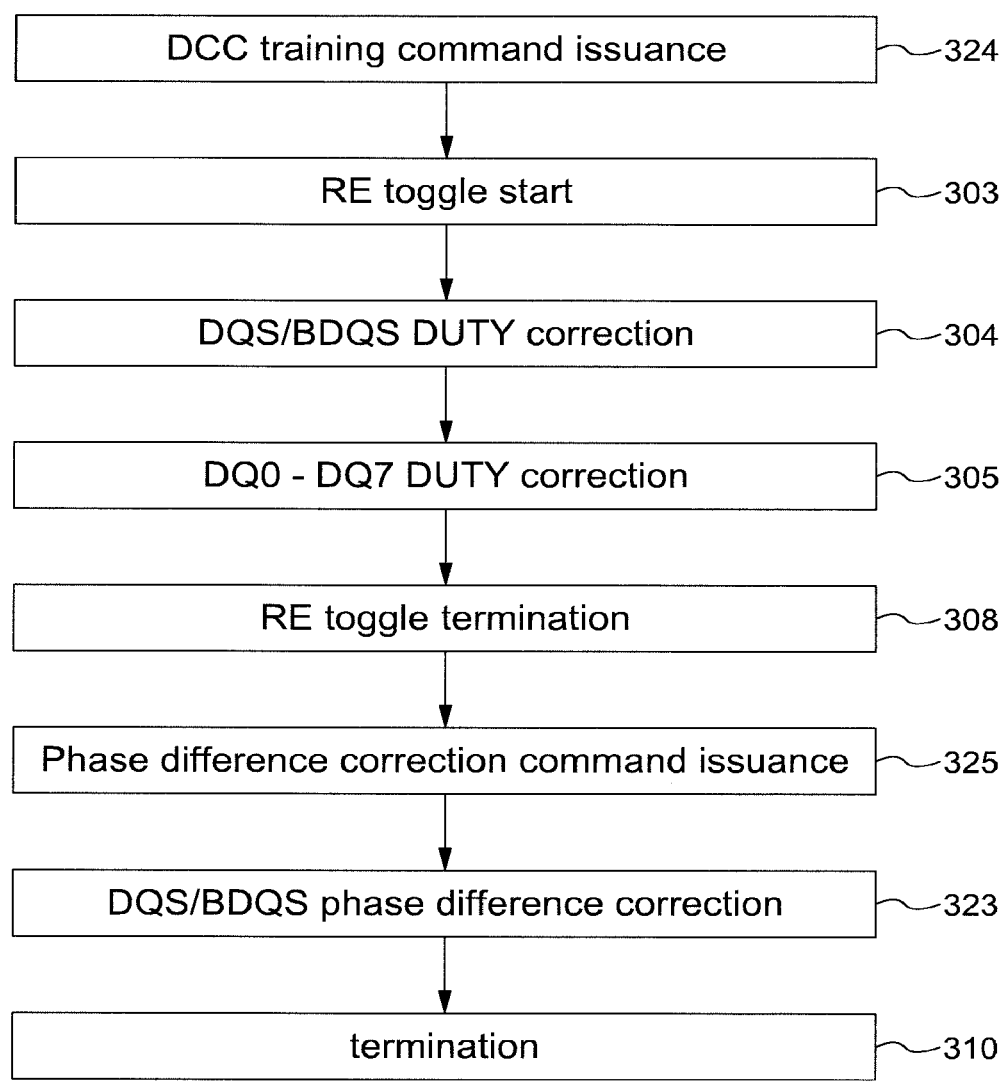
FIG. 28 is a flowchart for explaining a calibration operation and a phase correction operation of a semiconductor storage device according to an embodiment.

FIG. 23 exemplifies the configuration in which the operation mode is shifted to the DCC training mode and the phase difference correction mode by the "Set feature" command, and then the data-out command and the phase difference correction command are issued (steps 321 to 323 in FIG. 23), respectively, but the present invention is not limited to this configuration. For example, as shown in FIG. 28, the semiconductor storage device 5 may performs the correction of the duty ratio based on the issuance (step 324) of the dedicated command of DCC training from the memory controller 2, and the phase difference correction based on the issuance (step 325) of the dedicated command of the phase difference correction.

Seventh Embodiment

Figure 29:
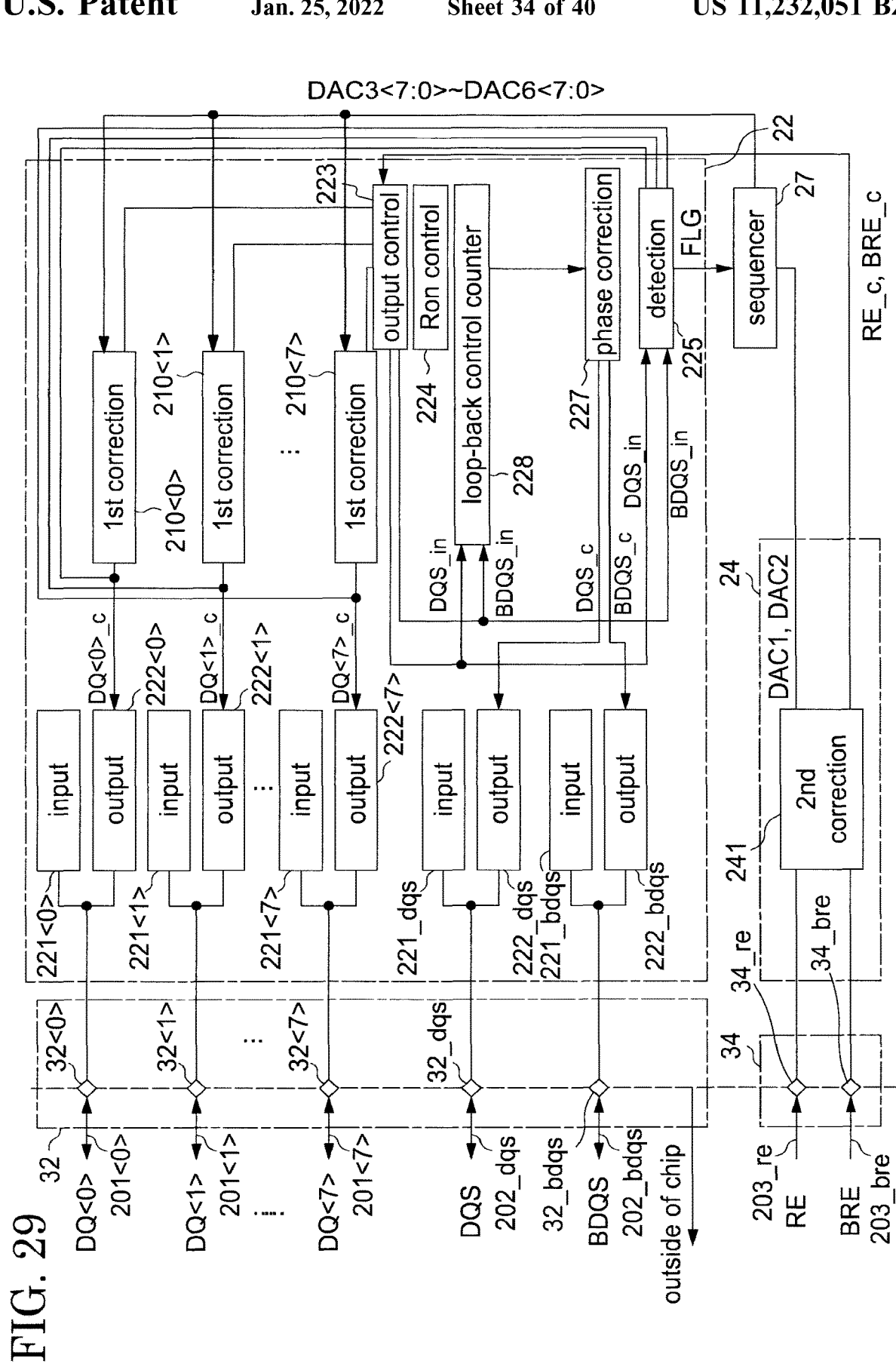
FIG. 29 is a block diagram for explaining a configuration of an input/output circuit and a logic control circuit of a semiconductor storage device according to an embodiment.

In the seventh embodiment, an input/output circuit 22 having a configuration similar to that of the input/output circuit 22 in the first embodiment is described. FIG. 29 is a block diagram for explaining a configuration of an input/output circuit and a logic control circuit of the semiconductor storage device according to the embodiment. In FIG. 29, in that the input/output circuit 22 includes a loop-back control counter circuit 228 and a phase correction circuit 227, it is different from the configuration of FIG. 4 according to the first embodiment. The loop-back control counter circuit 228 compares phases of a signal DQS_in and a signal BDQS_in constituting a strobe signal (DQS_in/BDQS_in). The phase correction circuit 227 corrects the phase shift. In the following description, descriptions of the same features as those of the configuration of FIG. 4 are omitted, and mainly differences from the configuration of FIG. 4 are described.

As shown in FIG. 29, the loop-back control counter circuit 228 is connected to an output control circuit 223. The loop-back control counter circuit 228 receives each of the signal DQS_in and the signal BDQS_in sent from the output control circuit 223 and loops back (oscillates) each of the signal DQS_in and the signal BDQS_in. The loop-back control counter circuit 228 determines the phase shift between both by comparing the count of the number of oscillations. The phase correction circuit 227 is connected to the loop-back control counter circuit 228 and output circuits 222_dqs and 222_bdqs. The phase correction circuit 227 corrects at least one of the signals DQS_in and BDQS_in based on the determination result by the loop-back control counter circuit 228. The signals DQS_c and BDQS_c corrected by the phase correction circuit 227 are sent to the output circuits 222_dqs and 222_bdqs, respectively. The operation of the loop-back control counter circuit 228 and the phase correction circuit 227 is controlled by the sequencer 27.

[Configuration of the Phase Comparison Circuit and the Phase Correction Circuit]

Figure 30:
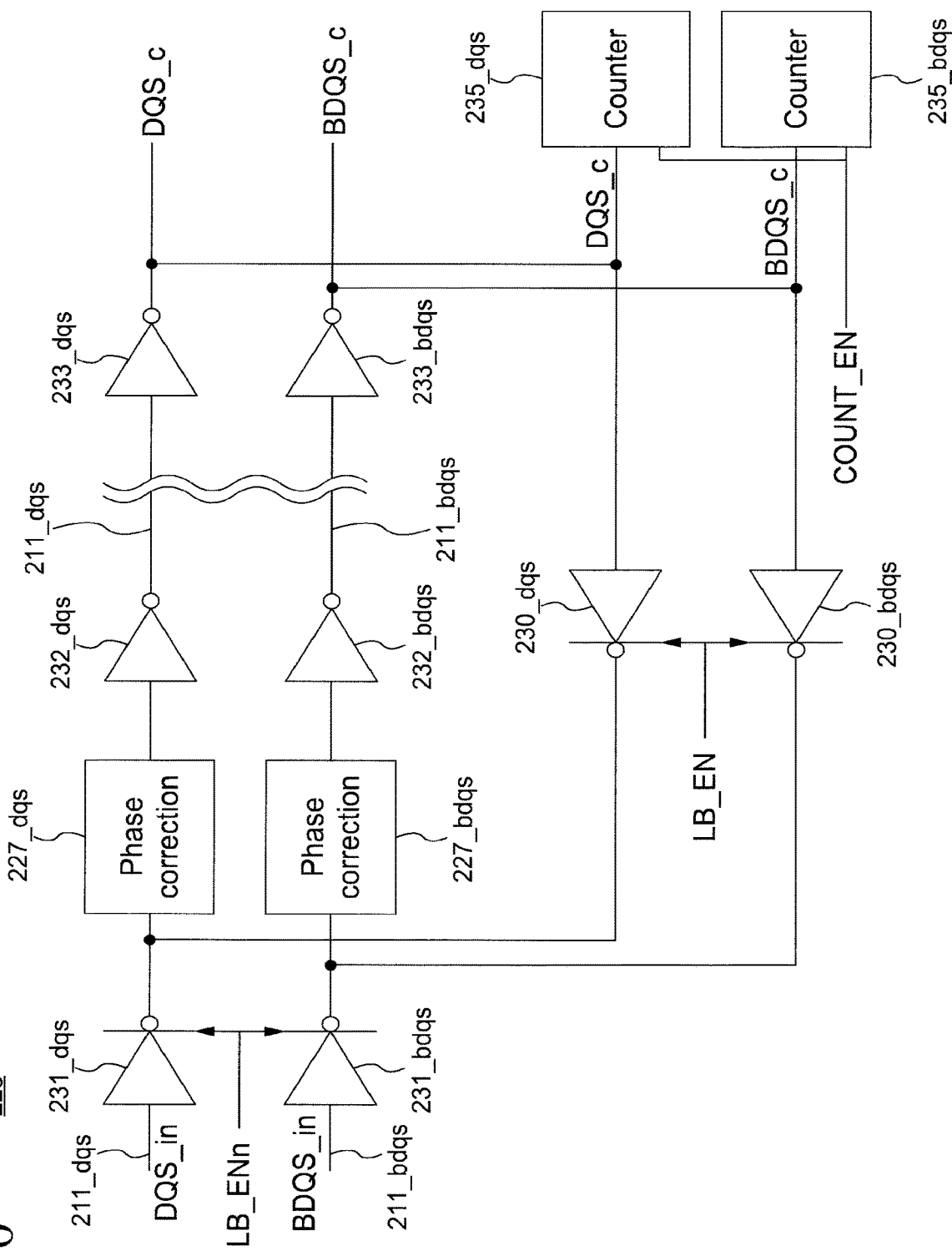
FIG. 30 is a block diagram for explaining a configuration of a loop-back control counter circuit of a semiconductor storage device according to an embodiment.

FIG. 30 is a block diagram for explaining a configuration of a phase comparison circuit of the semiconductor storage device according to the embodiment. As shown in FIG. 30, the loop-back control counter circuit 228 includes a first clocked inverter 230 (230_dqs, 230_bdqs), a second clocked inverter 231 (231_dqs, 231_bdqs), an inverter 232 (232_dqs, 232_bdqs), an inverter 233 (233_dqs, 233_bdqs), and a counter circuit 235 (235_dqs, 235_bdqs). The phase correction circuit 227 (227_dqs, 227_bdqs) is incorporated in the loop-back control counter circuit 228 and is connected to output terminals of the first clocked inverter 230 and the second clocked inverter 231.

The first clocked inverter 230 and the second clocked inverter 231 are controlled by mutually inverted control signals LB_EN/LB_ENn. That is, when the first clocked inverter 230 operates, the second clocked inverter 231 does not operate, and when the first clocked inverter 230 does not operate, the second clocked inverter 231 operates. The control signals LB_EN/LB_ENn are switched based on the phase difference correction command.

In a normal operation mode, the control signal LB_ENn is valid and the control signal LB_EN is invalid. When the phase difference correction command is issued and the operation mode is to be the phase difference correction mode, the control signal LB_ENn becomes invalid and the control signal LB_EN becomes valid. As described, in the phase difference correction mode, two oscillation circuits each having odd inverters (e.g., inverter 232, 233, and the first clocked inverter 230) connected in series with respect to each of the signal DQS_c and the signal BDQS_c. When the two oscillation circuits are formed as described above, self-oscillations are occurred at each oscillation circuits.

Counter circuits 235_dqs and 235_bdqs count the number of oscillations of the signal DQS_c and the signal BDQS_c, respectively. Each counter circuit 235 is connected to the oscillation path of the above oscillation circuit and is controlled to be enabled/disabled by a count signal COUNT_EN.

Figure 31:
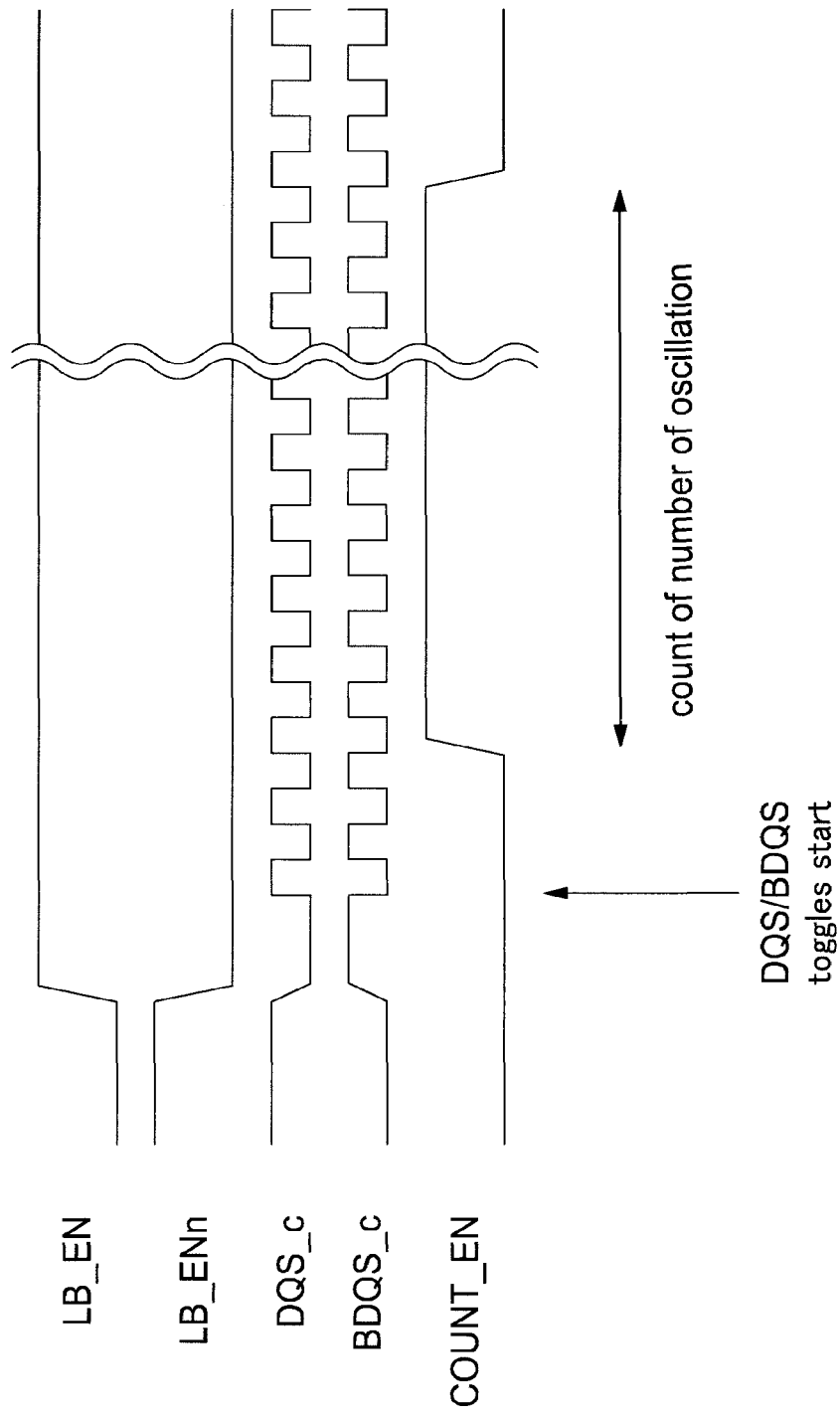
FIG. 31 is a timing chart for explaining an operation of a loop-back control counter circuit of a semiconductor storage device according to an embodiment.

FIG. 31 is a timing chart for explaining an operation of a loop-back control counter circuit of the semiconductor storage device according to the embodiment. When the phase difference correction command is issued, the control signal LB_EN is changed from the "L" level to the "H" level, and the control signal LB_ENn is changed from the "H" level to the "L" level. That is, two oscillation circuits are respectively formed for the two paths of the signal DQS and the signal BDQS by enabling the first clocked inverter 230 and disabling the second clocked inverter 231. When self-oscillations start in these oscillation circuits, the toggles of the signal DQS_c and the signal BDQS_c are started. Next, the count signal COUNT_EN is changed from the "L" level to the "H" level, and the count of the number of oscillations of the oscillation circuit is performed by the counter circuit 235.

Figure 32:
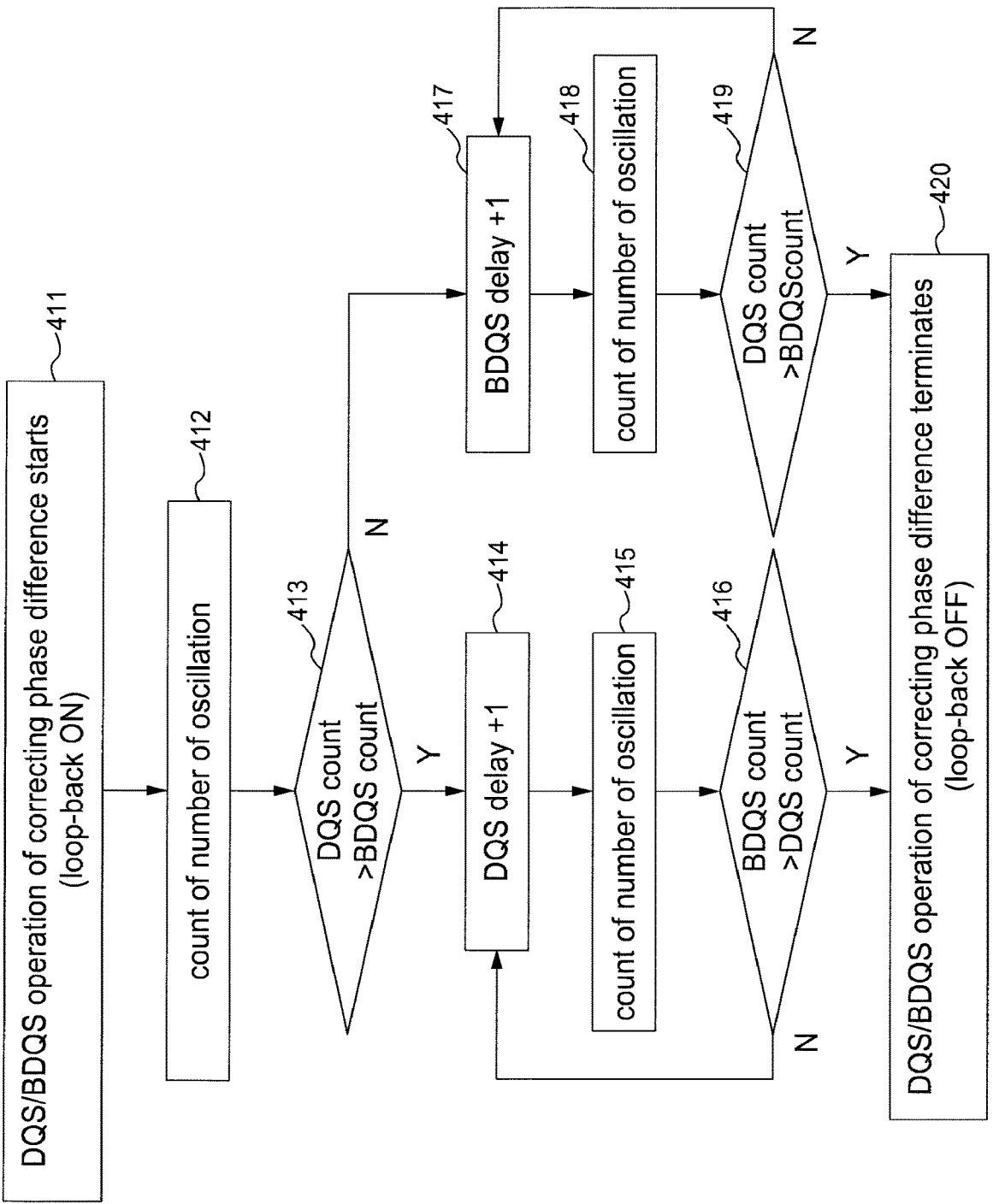
FIG. 32 is a flow chart for explaining an operation of a loop-back control counter circuit of a semiconductor storage device according to an embodiment.

FIG. 32 is a flowchart for explaining an operation of a loop-back control counter circuit of the semiconductor storage device according to the embodiment. First, based on the issuance of the phase difference correction command, the operation of correcting the phase difference between the signal DQS_c and the signal BDQS_c starts, and the oscillation circuits (loop-back) are formed (step 411). Next, the number of oscillations is counted in a predetermined period by the counter circuits 235_dqs and 235_bdqs (step 412). When the number of count (DQS count) of the oscillations of the signal DQS_c by the counter circuit 235_dqs is larger than the number of count (BDQS count) of the oscillations of the signal BDQS_c by the counter circuit 235_bdqs ("Y" in step 413), the phase correcting circuit 227_dqs is operated to delay the DQS_c (DQS delay+1) (step 414). Subsequently, the number of oscillations is counted (step 415), and the number of oscillations is counted again by the counter circuits 235_dqs and 235_bdqs (step 416). In the case where the count indicates that the number of counts of the BDQS is greater than the number of counts of the DQS ("Y" of step 416), the phase difference correction operation is terminated (step 420). On the other hand, in the case where the number of counts of the BDQS is less than the number of counts of the DQS ("N" in step 416), the process returns to the step 414 and delays the DQS_c.

By the determination of the above step 413, the phase correction circuit 227_bdqs is operated to delay the BDQS_c (BDQS delay+1) (step 417) when the number of counts of the DQS are less than the number of counts of the BDQS ("N" in step 413). Subsequently, the number of oscillations is counted (step 418), and the number of oscillations is counted again by the counter circuits 235_dqs and 235_bdqs (step 419). By this count, in the case where the number of counts of the DQS is more than the number of counts of the BDQS ("Y" in step 419), the operation of the phase difference correction is terminated (step 420). On the other hand, if the DQS count is less than BDQS count ("N" in step 419), the process returns to the step 417 and delays the BDQS_c.

As described above, the phase correction circuit 227 can correct the phase shift of at least one of the signals DQS_in and the signal BDQS_in based on the count number of the counter circuit 235.

The phase correction circuit 227 described in the sixth embodiment and the seventh embodiment may be provided in the memory controller 2. In other words, the phase comparison of the signal DQS and the signal BDQS is performed by the phase comparison circuit 226 or the loop-back control counter circuit 228 provided in the input/output circuit 22, and the phase shift of both may be corrected by the memory controller 2 according to the comparison result. The phase-corrected signals DQS and BDQS may be input to the input/output circuitry 22.

What is claimed is:

1. A non-volatile semiconductor memory device comprising:
   one or more first pads, each transmitting/receiving a data signal transmitted via each of one or more first signal lines to/from a memory controller;
   one or more second pads, each transmitting/receiving a strobe signal transmitted via each of one or more second signal lines to/from the memory controller, the strobe signal specifying a timing of transmitting/receiving the data signal;
   a third pad receiving an output instruction signal via a third signal line from the memory controller, the output instruction signal instructing a transmission of the data signal;
   an output control circuit generating the strobe signal based on the output instruction signal;
   a detection circuit detecting a first difference between a first timing and a reference, the detection circuit being connected to each of the one or more first signal lines, the data signal changing at the first timing; and
   one or more first correction circuits, each performing a first calibration operation based on the first difference, each of the one or more first correction circuit being connected to each of the one or more first signal lines,
   wherein the non-volatile semiconductor memory device
      outputs the data signal from each of the one or more first pads to the memory, controller,
      outputs the strobe signal from each of the one or more second pads to the memory controller,
      performs the first calibration operation calibrating the data signal, and
      performs a second calibration operation calibrating the strobe signal, based on a toggle timing of the strobe signal associated with the output instruction signal output from the memory controller upon receiving a command from the memory controller.

2. The non-volatile semiconductor memory device according to claim 1, comprising a plurality of the first signal lines and a plurality of the first pads,
wherein the first calibration operation is performed to the data signal provided to each of the plurality of the first signal lines.

3. The non-volatile semiconductor memory device according to claim 1, further comprising a second correction circuit performing the second calibration operation,
wherein
the detection circuit is connected to each of the one or more second signal lines and detects a second difference between a second timing and the reference, the strobe signal changing at the second timing, and
the second correction circuit performs the second calibration operation based on the second difference.

4. The non-volatile semiconductor memory device according to claim 1, comprising a plurality of the first signal lines,
wherein the detection circuit and each of the one or more first correction circuits are connected to two or more of the plurality of the first signal lines.

5. The non-volatile semiconductor memory device according to claim 1, comprising a plurality of the first signal lines,
wherein
the detection circuit includes one or more first detection circuit detecting the first difference,
each of the one or more first detection circuits and each of the one or more first correction circuits are connected to each of the plurality of the first signal lines.

6. The non-volatile semiconductor memory device according to claim 3,
further comprising a sequencer controlling the output control circuit, the detection circuit and the one or more first correction circuits,
comprising a plurality of the first signal lines,
wherein
the detection circuit and each of the one or more first correction circuits are connected to each of the plurality of the first signal lines, and
the sequencer controls so that detection of the second difference and detection of the plurality of the first difference are performed at different timing.

7. The non-volatile semiconductor memory device according to claim 3,
further comprising a sequencer controlling the output control circuit, the detection circuit and the one or more first correction circuits,
comprising a plurality of the first signal lines,
wherein
the detection circuit and each of the one or more first correction circuits are connected to each of the plurality of the first signal lines,
the sequencer is selectable one of the plurality of the first signal lines, and
detection by the detection circuit and the first calibration are performed via the one of the plurality of the first signal lines.

8. The non-volatile semiconductor memory device according to claim 1, comprising a plurality of the first signal lines and a plurality of the first correction circuits,
wherein
the detection circuit includes a plurality of first detection circuits, each detecting the first difference,
each of the plurality of first detection circuits and each of the plurality of the first correction circuits are connected to each of the plurality of the first signal lines.

9. The non-volatile semiconductor memory device according to claim 8,
further comprising a sequencer controlling the output control circuit, the plurality of the first detection circuits and the plurality of the first correction circuits,
wherein the sequencer controls so that at least parts of the first calibration operations with respect to the plurality of the first signal lines are performed at the same timing.

10. The non-volatile semiconductor memory device according to claim 8,
further comprising:
a second correction circuit; and
a sequencer controlling the output control circuit, the detection circuit, the plurality of the first correction circuits and the second correction circuit,
wherein
the detection circuit includes a first detection circuit and a second detection circuit,
the first detection circuit detects the first difference,
the second detection circuit is connected to each of the one or more second signal lines and detects a second difference between a second timing and the reference, the strobe signal changing at the second timing,
the second correction circuit performs the second calibration operation based on the second difference, and
the sequencer controls so that at least parts of the first calibration operations with respect to the plurality of the first signal lines and the second calibration calibrating with respect to each of the one or more second signal lines.

11. The non-volatile semiconductor memory device according to claim 1, wherein the first correction circuit performs the first calibration operation between receiving the command and outputting the data signal.

12. The non-volatile semiconductor memory device according to claim 1, wherein
the output control circuit includes an output circuit outputting the strobe signal to the memory controller,
the output circuit includes n-type and p-type transistors, an output impedance of each of the n-type and p-type transistors being adjustable,
the first correction circuit includes a first delay adjustment circuit and a second delay adjustment circuit,
the first delay adjustment circuit is connected to the n-type transistor,
the second delay adjustment circuit is connected to the p-type transistor,
delays of the first delay adjustment circuit and the second delay adjustment circuit are adjustable individually.

13. The non-volatile semiconductor memory device according to claim 1,
further comprising:
a phase comparison circuit connected to two of the second signal lines outputting the strobe signals to the memory controller, the phase comparison circuit comparing each of the strobe signals; and
a phase correction circuit connected to the two of the second signal lines, the phase correction circuit correctable each phase of the strobe signals.

14. The non-volatile semiconductor memory device according to claim 13, wherein
the phase comparison circuit inputs a signal based on one trigger signal to a D flip-flop via the two of the second signal lines, and
the phase correction circuit corrects at least one of the strobe signals based on a flag output by the D flip-flop.

15. The semiconductor memory device according to claim 13, wherein
the phase comparison circuit includes an oscillator circuit connected to each of the second signal lines and a counter circuit counting number of oscillating times of the oscillator circuit, and
the phase correction circuit corrects at least one of the strobe signals based on the number of oscillating times of the oscillator circuit.

* * * * *